US012675396B2

(12) United States Patent
Tang et al.

(10) Patent No.: US 12,675,396 B2
(45) Date of Patent: Jul. 7, 2026

(54) MEMORY DEVICE, MEMORY SYSTEM, MEMORY CONTROLLER AND OPERATING METHOD THEREOF

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 30 days.

(21) Appl. No.: 18/792,181

(22) Filed: Aug. 1, 2024

(65) Prior Publication Data

US 2025/0265187 A1    Aug. 21, 2025

Related U.S. Application Data

(63) Continuation of application No. PCT/CN2024/077816, filed on Feb. 20, 2024.

(51) Int. Cl.
*G06F 12/02* (2006.01)
*G11C 16/04* (2006.01)
*G11C 16/26* (2006.01)

(52) U.S. Cl.
CPC ...... *G06F 12/0246* (2013.01); *G11C 16/0483* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 2014/0119124 A1* | 5/2014 | Kim | .................. | G11C 16/0483 |
| | | | | 365/185.18 |
| 2014/0198569 A1* | 7/2014 | Kim | ...................... | G11C 16/28 |
| | | | | 365/185.2 |
| 2015/0085571 A1 | 3/2015 | Hu et al. | | |
| 2018/0076829 A1* | 3/2018 | Ueki | ..................... | G06F 11/073 |

(Continued)

FOREIGN PATENT DOCUMENTS

| | | |
|---|---|---|
| CN | 110797068 A | 2/2020 |
| CN | 116301629 A | 6/2023 |
| WO | 03054888 A2 | 7/2003 |

*Primary Examiner* — Yaima Rigol
(74) *Attorney, Agent, or Firm* — BAYES PLLC

(57) ABSTRACT

Examples of the present application provide a memory device, memory system, memory controller and operating method thereof, wherein the memory device includes: an array of memory cells, including multiple memory cells, and a preset number of memory cells forming one code word; peripheral circuit coupled to the array of memory cells and configured to: generate a first boundary voltage and a second boundary voltage in accordance with the first result corresponding to at least one code word at a target read voltage; make at least one adjustment to the target read voltage, and obtain the corresponding first result at the adjusted target read voltage after each adjustment; in a process of the adjustment, change a current direction of adjustment to the voltage in accordance with the target read voltage after one adjustment exceeding a range defined by the first boundary voltage and the second boundary voltage.

20 Claims, 41 Drawing Sheets

(56) References Cited

U.S. PATENT DOCUMENTS

| | | | |
|---|---|---|---|
| 2022/0044737 A1* | 2/2022 | Khayat | G11C 11/5642 |
| 2022/0076738 A1* | 3/2022 | Bazarsky | G11C 29/028 |
| 2022/0076762 A1* | 3/2022 | Lee | G11C 16/08 |
| 2022/0270687 A1* | 8/2022 | Tokutomi | G11C 16/0483 |
| 2022/0357885 A1* | 11/2022 | Tanaka | G11C 11/5642 |
| 2023/0062445 A1* | 3/2023 | Lee | G11C 29/028 |
| 2023/0153198 A1* | 5/2023 | Huang | G06F 3/0679 |
| | | | 714/723 |

* cited by examiner

100

301

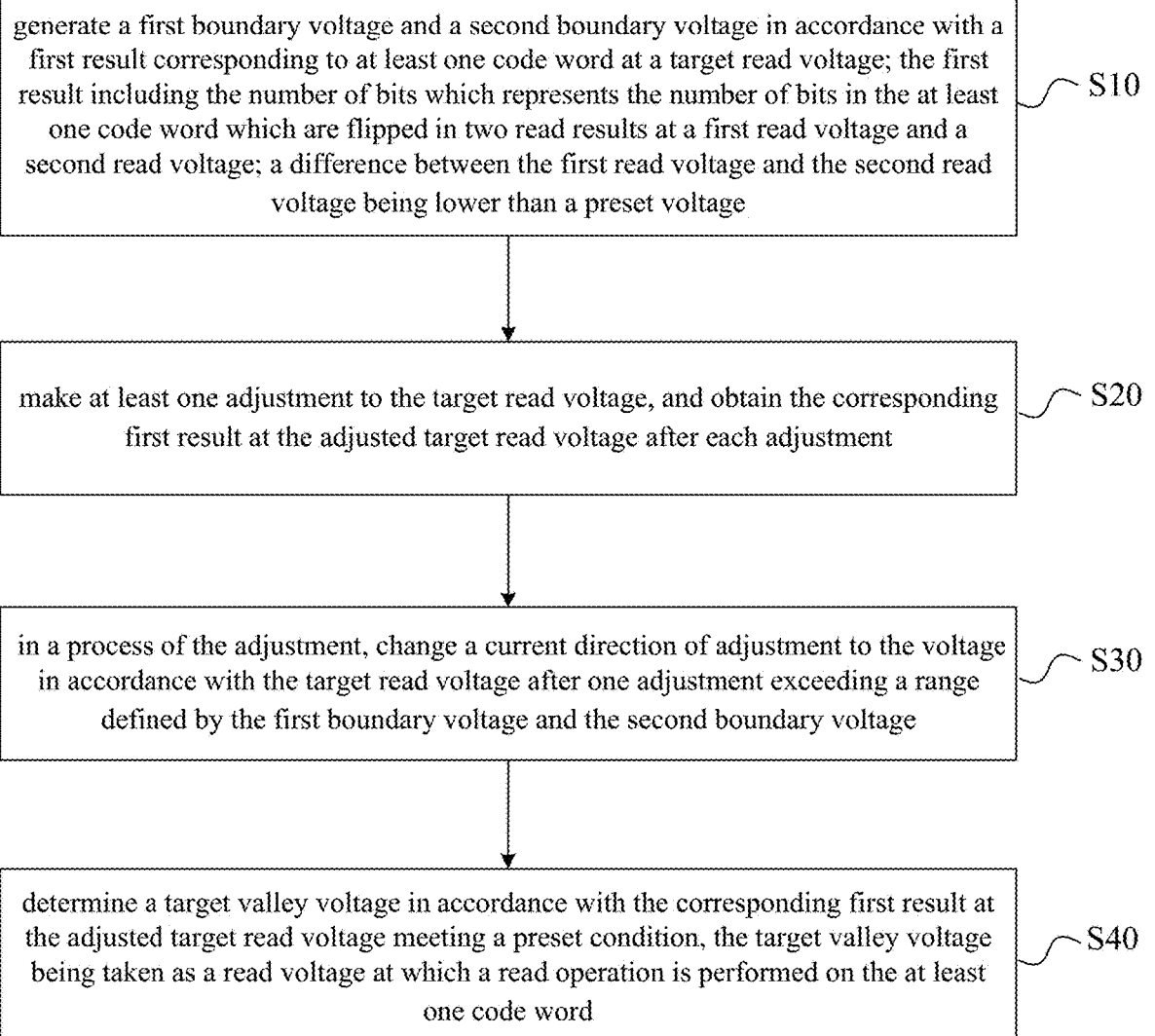

generate a first boundary voltage and a second boundary voltage in accordance with a first result corresponding to at least one code word at a target read voltage; the first result including the number of bits which represents the number of bits in the at least one code word which are flipped in two read results at a first read voltage and a second read voltage; a difference between the first read voltage and the second read voltage being lower than a preset voltage  S10 make at least one adjustment to the target read voltage, and obtain the corresponding first result at the adjusted target read voltage after each adjustment  S20 in a process of the adjustment, change a current direction of adjustment to the voltage in accordance with the target read voltage after one adjustment exceeding a range defined by the first boundary voltage and the second boundary voltage  S30 determine a target valley voltage in accordance with the corresponding first result at the adjusted target read voltage meeting a preset condition, the target valley voltage being taken as a read voltage at which a read operation is performed on the at least one code word  S40

Fig. 7

MEMORY DEVICE, MEMORY SYSTEM, MEMORY CONTROLLER AND OPERATING METHOD THEREOF

CROSS-REFERENCE TO RELATED APPLICATIONS

The present application is a continuation of International Application No. PCT/CN2024/077816, filed on Feb. 20, 2024, which is hereby incorporated by reference in its entirety.

FIELD OF TECHNOLOGY

The present application relates, but is not limited to, a memory device, memory system, memory controller and operating method thereof.

BACKGROUND

With the development of science and technology, the market size of the integrated circuit industry is getting larger and larger, and the process and technology of non-volatile memory devices in the entire integrated circuit industry have experienced rapid development in recent years, where NAND memory is particularly widely used. NAND memory implements data storage through capturing and storing charges in the gate dielectric layer of the memory cells it contains. However, with normal use time, the charge stored in the memory cell may change with the increase in use time, repeated read operations, cross temperature, etc., therefore affecting the accuracy of reading the data stored in the memory cell.

SUMMARY

According to one aspect of the present disclosure, a memory device is provided. The memory device may include an array of memory cells including multiple memory cells. A preset number of the multiple memory cells may form one code word. The memory device may include a peripheral circuit coupled to the array of memory cells. The peripheral device may be configured to generate a first boundary voltage and a second boundary voltage in accordance with a first result corresponding to at least one code word at a target read voltage. The first result may include the number of bits which represents flipping in the at least one code word in two read results at a first read voltage and a second read voltage. A difference between the first read voltage and the second read voltage may be lower than a preset voltage. The peripheral circuit may be configured to make at least one adjustment to the target read voltage, and obtain a corresponding first result at the adjusted target read voltage after each adjustment. The peripheral circuit may be configured to, in a process of the adjustment, change a current direction of adjustment to the voltage in accordance with a target read voltage after one adjustment exceeding a range defined by the first boundary voltage and the second boundary voltage. The peripheral circuit may be configured to determine a target valley voltage in accordance with the corresponding first result at the adjusted target read voltage meeting a preset condition. The target valley voltage may be taken as a read voltage at which a read operation is performed on the at least one code word.

In some implementations, the memory cell may include multiple storage bits, and the multiple storage bits correspond to read voltages in multiple stages. In some implementations, the peripheral circuit may be configured to obtain an initial first boundary voltage and an initial second boundary voltage corresponding to a target stage in the multiple stages. In some implementations, the peripheral circuit may be configured to adjust the initial first boundary voltage and the initial second boundary voltage corresponding to the target stage to obtain the first boundary voltage and the second boundary corresponding to the target stage, in accordance with a first result corresponding to the at least one code word at a target read voltage in the target stage. In some implementations, the peripheral circuit may be configured to determine a target valley voltage corresponding to the target stage, in accordance with a corresponding first result at an adjusted target read voltage in the target stage meeting the preset condition.

In some implementations, the range defined by the initial first boundary voltage and the initial second boundary voltage may be smaller than a first preset range. In some implementations, the peripheral circuit may be configured to expand the range defined by the initial first boundary voltage and the initial second boundary voltage corresponding to the target stage to obtain the first boundary voltage and the second boundary corresponding to the target stage, in accordance with the first result corresponding to the at least one code word at the target read voltage in the target stage being greater than a first preset value.

In some implementations, usage scenarios for the memory device may include a first scenario and a second scenario. In some implementations, the peripheral circuit may be configured to expand the range defined by the initial first boundary voltage and the initial second boundary voltage corresponding to the target stage by way of offsetting both of the initial first boundary voltage and the initial second boundary voltage corresponding to the target stage in a decreasing direction based on the usage scenario for the memory device being the first scenario. In some implementations, the peripheral circuit may be configured to expand the range defined by the initial first boundary voltage and the initial second boundary voltage corresponding to the target stage by way of offsetting both of the initial first boundary voltage and the initial second boundary voltage corresponding to the target stage in an increasing direction based on the usage scenario for the memory device being the second scenario.

In some implementations, the range defined by the initial first boundary voltage and the initial second boundary voltage may be larger than a second preset range. In some implementations, the peripheral circuit may be configured to narrow the range defined by the initial first boundary voltage and the initial second boundary voltage corresponding to the target stage to obtain the first boundary voltage and the second boundary corresponding to the target stage, in accordance with the first result corresponding to the at least one code word at the target read voltage in the target stage being less than a second preset value.

In some implementations, the peripheral circuit may be configured to make M first adjustments with a first step size to the target read voltage to be adjusted, and obtain M corresponding first results at target read voltages after each of the M first adjustments respectively. In some implementations, the peripheral circuit may be configured to take the minimum first result among the M first results as a knee-point value, and a read voltage corresponding to the knee-point value being a knee-point voltage. In some implementations, the peripheral circuit may be configured to make N second adjustments to the knee-point voltage with a second step size, and obtain N corresponding first results at target read voltages after each of the N second adjustments respectively; the second step size being less than the first step size; the M and N being both positive integers greater than 1. In some implementations, the peripheral circuit may be configured to determine the target valley voltage in accordance with the corresponding first result at an obtained target read voltage after the N second adjustments meeting a preset condition.

In some implementations, the peripheral circuit may be configured to before making M first adjustments to the target read voltage to be adjusted, generate a first threshold in accordance with the first result corresponding to the at least one code word at the target read voltage. In some implementations, the first threshold may be to present the maximum among the corresponding first results at the read voltages near the target valley voltage. In some implementations, the peripheral circuit may be configured to, in accordance with the corresponding first result at the adjusted target read voltage being greater than or equal to the first threshold, generate a target read voltage after a next adjustment based on a corresponding first result at a target read voltage after a previous adjustment, until the corresponding first result at the adjusted target read voltage is less than the first threshold. In some implementations, the peripheral circuit may be configured to after the corresponding first result at the adjusted target read voltage is less than the first threshold, make the M first adjustments with the first step size to the target read voltage to be adjusted.

In some implementations, the first boundary voltage may be less than the second boundary voltage. In some implementations, the peripheral circuit may be configured to, starting from the first boundary voltage, adjust the target read voltage in an increasing direction, in accordance with the target read voltage generated after the next adjustment being less than or equal to the first boundary voltage. In some implementations, the peripheral circuit may be configured to, starting from the second boundary voltage, adjust the target read voltage in a decreasing direction, in accordance with the target read voltage generated after the next adjustment being greater than or equal to the second boundary voltage.

In some implementations, the peripheral circuit may be configured to take, as a near-valley voltage, the adjusted target read voltage corresponding to the first result that is less than the first threshold for a first time among multiple corresponding first results at target read voltages after multiple adjustments. In some implementations, the peripheral circuit may be configured to, in a process of making multiple first adjustments to the near-valley voltage with a first step size, starting from the near-valley voltage, make adjustments in a first direction with the first step size until the corresponding first result at the adjusted target read voltage in the first direction is greater than the first threshold; and starting from the near-valley voltage, make adjustments in a second direction opposite to the first direction with the first step size until the corresponding first result at the adjusted target read voltage in the second direction is greater than the first threshold.

In some implementations, the peripheral circuit may be configured to generate the first threshold in accordance with the corresponding first result at the target read voltage and a first mapping function; wherein the first mapping function is to present a relationship between the first threshold and the corresponding first result at the target read voltage. In some implementations, the peripheral circuit may be configured to generate a predicted value of the target read voltage after the next adjustment in accordance with the corresponding first result at the target read voltage after the previous adjustment and a second mapping function, and a stage number at which the target stage is. In some implementations, the second mapping function may be to present a relationship between the corresponding first result at the target read voltage after the previous adjustment, the stage number at which the target stage is and the predicted value of the target valley voltage in the target stage.

In some implementations, the peripheral circuit may be configured to, in a process of making N second adjustments to the knee-point voltage with the second step size, starting from the knee-point voltage, make adjustments in two opposite directions with the second step size, in the process of making adjustments in each direction, count one for upward trend when the corresponding first result at the target read voltage after the next adjustment is greater than the corresponding first result at the target read voltage after a previous adjustment, and determine a third boundary voltage and a fourth boundary voltage in accordance with a total counted number being greater than or equal to a preset number. In some implementations, the peripheral circuit may be configured to, in the process of making adjustments in each direction, if a corresponding first result at a target read voltage after one adjustment is lower than a second threshold, or taking the minimum first result among multiple corresponding first results at the target read voltages after multiple adjustments as a reference value, when the number of first results among remaining first results which differ from the reference value with a difference being less than a third threshold is greater than a preset number, stop the adjustments and take, as the target valley voltage, the read voltage corresponding to the minimum first result among the multiple first results.

In some implementations, the peripheral circuit may be configured to, in the process of making adjustments in each direction, take the corresponding adjusted target read voltages as the third voltage boundary and the fourth voltage boundary respectively in accordance with the total counted number being equal to the preset number. In some implementations, the peripheral circuit may be configured to, in the process of making adjustments in each direction, if the third boundary voltage and the fourth boundary voltage have been determined, obtain the corresponding first result at the target read voltage after the last adjustment, the target read voltage after the last adjustment being an average of the third boundary voltage and the fourth boundary voltage. In some implementations, the peripheral circuit may be configured to take, as the target valley voltage, the read voltage corresponding to the minimum first result among the multiple corresponding first results at all the adjusted target read voltages.

In some implementations, the array of memory cells may include memory cells with multiple storage bits, and the multiple storage bits correspond to multiple pages respectively. In some implementations, at least part of the pages may correspond to multiple stages. In some implementations, the multiple stages may include a first stage and a second stage. In some implementations, the read voltage in the second stage may be less than the read voltage in the first stage. In some implementations, the peripheral circuit may be configured to generate a target valley voltage in the second stage of the multiple stages or a target valley voltage in other first stage corresponding to a lower read voltage with the determined target valley voltage in accordance with a target valley voltage in the first stage to which a stage number corresponding to the determined target valley voltage belonging.

In some implementations, the peripheral circuit may be configured to read storage data of the at least one code word at the first read voltage to obtain a second result. In some implementations, the peripheral circuit may be configured to read the storage data of the at least one code word at the second read voltage to obtain a third result. In some implementations, the peripheral circuit may be configured to perform a logical operation on the second result and the third result to obtain a fourth result. In some implementations, the peripheral circuit may be configured to count the number of bits in the fourth result which represent flip of bits in the third result relative to the second result to obtain the first result.

In some implementations, the peripheral circuit may include a first latch configured to store the second result. In some implementations, the peripheral circuit may include a second latch configured to store the third result. In some implementations, the peripheral circuit may include a third latch configured to store the fourth result.

According to another aspect of the present disclosure, a memory system is provided. The memory system may include one or more memory devices. The one or more memory devices may include an array of memory cells including multiple memory cells. A preset number of multiple memory cells may form one code word. The memory system may include peripheral circuit coupled to the array of memory cells. The peripheral circuit may be configured to generate a first boundary voltage and a second boundary voltage in accordance with a first result corresponding to at least one code word at a target read voltage. The first result may include the number of bits which represents the number of bits in the at least one code word which are flipped in two read results at a first read voltage and a second read voltage. A difference between the first read voltage and the second read voltage may be lower than a preset voltage. The peripheral circuit may be configured to make at least one adjustment to the target read voltage, and obtain a corresponding first result at the adjusted target read voltage after each adjustment; in a process of the adjustment, change a current direction of adjustment to the voltage in accordance with a target read voltage after one adjustment exceeding a range defined by the first boundary voltage and the second boundary voltage. The peripheral circuit may be configured to determine a target valley voltage in accordance with the corresponding first result at the adjusted target read voltage meeting a preset condition, the target valley voltage being taken as a read voltage at which a read operation is performed on the at least one code word. The memory system may include a memory controller coupled to the memory device and controlling the memory device.

In some implementations, the memory controller may be configured to send a first instruction before performing a read operation on data stored in a memory device. In some implementations, the first instruction may indicate to obtain information representing a target valley voltage. In some implementations, the memory device may be configured to receive the first instruction, obtain the information representing the target valley voltage, and send the obtained information representing the target valley voltage to the memory controller. In some implementations, the memory controller may be further configured to control the memory device to perform a read operation with the target valley voltage in the information representing the target valley voltage, and perform an error correction decode operation on a read result of the read operation.

According to a further aspect of the present disclosure, a memory controller is provided. The memory controller may include a control component. The control component may be configured to generate a first boundary voltage and a second boundary voltage in accordance with a first result corresponding to at least one code word at a target read voltage. The at least one code word may be formed by a preset number of memory cells of an array of memory cells in at least one memory device coupled to the memory controller. The first result may represent the number of bits in the at least one code word which are flipped in two read results at a first read voltage and a second read voltage. A difference between the first read voltage and the second read voltage may be lower than a preset voltage. The control component may be configured to make at least one adjustment to the target read voltage, and obtain the corresponding first result at the adjusted target read voltage after each adjustment. The control component may be configured to, in a process of the adjustment, change a current direction of adjustment to the voltage in accordance with the target read voltage after one adjustment exceeding a range defined by the first boundary voltage and the second boundary voltage. The control component may be configured to determine a target valley voltage in accordance with the corresponding first result at the adjusted target read voltage meeting a preset condition. The target valley voltage may be taken as a read voltage at which a read operation is performed on the at least one code word.

In some implementations, the memory cell may include multiple storage bits. In some implementations, the multiple storage bits may correspond to read voltages in multiple stages. In some implementations, the control component may be configured to obtain an initial first boundary voltage and an initial second boundary voltage corresponding to a target stage in the multiple stages. In some implementations, the control component may be configured to adjust the initial first boundary voltage and the initial second boundary voltage corresponding to the target stage to obtain the first boundary voltage and the second boundary corresponding to the target stage, in accordance with the first result corresponding to the at least one code word at a target read voltage in the target stage. In some implementations, the control component may be configured to determine the target valley voltage corresponding to the target stage in accordance with the corresponding first result at the adjusted target read voltage in the target stage meeting the preset condition.

In some implementations, the range defined by the initial first boundary voltage and the initial second boundary voltage is smaller than a first preset range. In some implementations, the control component may be configured to expand the range defined by the initial first boundary voltage and the initial second boundary voltage corresponding to the target stage to obtain the first boundary voltage and the second boundary corresponding to the target stage, in accordance with the first result corresponding to the at least one code word at the target read voltage in the target stage being greater than a first preset value.

In some implementations, usage scenarios for the memory device may include a first scenario and a second scenario. In some implementations, the control component is configured to expand the range defined by the initial first boundary voltage and the initial second boundary voltage corresponding to the target stage by way of offsetting both of the initial first boundary voltage and the initial second boundary voltage corresponding to the target stage in a decreasing direction based on the usage scenario for the memory device being the first scenario. In some implementations, the control component is configured to expand the range defined by the initial first boundary voltage and the initial second boundary voltage corresponding to the target stage by way of offsetting both of the initial first boundary voltage and the initial second boundary voltage corresponding to the target stage in an increasing direction based on the usage scenario for the memory device being the second scenario.

In some implementations, the range defined by the initial first boundary voltage and the initial second boundary voltage may be larger than a second preset range. In some implementations, the memory controller may be configured to narrow the range defined by the initial first boundary voltage and the initial second boundary voltage corresponding to the target stage to obtain the first boundary voltage and the second boundary corresponding to the target stage, in accordance with the first result corresponding to the at least one code word at the target read voltage in the target stage being less than a second preset value.

In some implementations, the control component may be configured to make M first adjustments with a first step size to the target read voltage to be adjusted, and obtain M corresponding first results at the target read voltages after the M first adjustments respectively. In some implementations, the control component may be configured to take the minimum first result among the M first results as a knee-point value, and a read voltage corresponding to the knee-point value being taken as a knee-point voltage. In some implementations, the control component may be configured to make N second adjustments to the knee-point voltage with a second step size, and obtain N corresponding first results at the target read voltages after the N second adjustments respectively. In some implementations, the second step size may be less than the first step size; the M and N being both positive integers greater than 1. In some implementations, the control component may be configured to determine the target valley voltage in accordance with the corresponding first result at an obtained target read voltage after the N second adjustments meeting the preset condition.

In some implementations, the control component may be configured to, before making M first adjustments to the target read voltage to be adjusted, generate a first threshold in accordance with the first result corresponding to the at least one code word at the target read voltage. In some implementations, the first threshold may be to present the maximum among the corresponding first results at the read voltages near the target valley voltage. In some implementations, the control component may be configured to, in accordance with the corresponding first result at the adjusted target read voltage being greater than or equal to the first threshold, generate a target read voltage after a next adjustment based on a corresponding first result at a target read voltage after a previous adjustment, until the corresponding first result at the adjusted target read voltage is less than the first threshold. In some implementations, the control component may be configured to, after the corresponding first result at the adjusted target read voltage is less than the first threshold, make the M first adjustments with the first step size to the target read voltage to be adjusted.

In some implementations, the first boundary voltage may be less than the second boundary voltage. In some implementations, the control component may be configured to, starting from the first boundary voltage, adjust the read voltage in an increasing direction in accordance with the target read voltage generated after the next adjustment being less than or equal to the first boundary voltage. In some implementations, the control component may be configured to, starting from the second boundary voltage, adjust the read voltage in a decreasing direction in accordance with the target read voltage generated after the next adjustment being greater than or equal to the second boundary voltage.

In some implementations, the control component may be configured to take, as a near-valley voltage, the adjusted target read voltage corresponding to the first result that is less than the first threshold for a first time among multiple corresponding first results at target read voltages after multiple adjustments. In some implementations, the control component may be configured to, in the process of making multiple first adjustments to the near-valley voltage with a first step size, starting from the near-valley voltage, make adjustments in a first direction with the first step size until the corresponding first result at the adjusted target read voltage in the first direction is greater than the first threshold. In some implementations, the control component may be configured to, starting from the near-valley voltage, make adjustments in a second direction opposite to the first direction with the first step size until the corresponding first result at the adjusted target read voltage in the second direction is greater than the first threshold.

In some implementations, the control component may be configured to generate the first threshold in accordance with the corresponding first result at the target read voltage and a first mapping function. In some implementations, the first mapping function may be to present a relationship between the first threshold and the corresponding first result at the target read voltage. In some implementations, the control component may be configured to generate a predicted value of the target read voltage after the next adjustment in accordance with the corresponding first result at the target read voltage after the previous adjustment and a second mapping function, and a stage number at which the target stage is. In some implementations, the second mapping function may be to present a relationship between the corresponding first result at the target read voltage after the previous adjustment, the stage number at which the target stage is and the predicted value of the target valley voltage in the target stage.

In some implementations, the control component may be configured to, in a process of making N second adjustments to the knee-point voltage with the second step size, starting from the knee-point voltage, make adjustments in two opposite directions with the second step size, in the process of making adjustments in each direction, count one for upward trend when the corresponding first result at the target read voltage after the next adjustment is greater than the corresponding first result at the read voltage after a previous adjustment, and determine a third boundary voltage and a fourth boundary voltage in accordance with a total counted number being greater than or equal to a preset number. In some implementations, the control component may be configured to, in the process of making adjustments in each direction, if the corresponding first result at the target read voltage after one adjustment is lower than a second threshold, or taking the minimum first result among multiple corresponding first results at the target read voltages after multiple adjustments as a reference value, when the number of first results among remaining first results which differ from the reference value with a difference being less than a third threshold is greater than a preset number, stop the adjustments and take, as the target valley voltage, the read voltage corresponding to the minimum first result among the multiple first results.

In some implementations, the control component may be configured to, in the process of making adjustments in each direction, take the corresponding adjusted target read voltages as a third voltage boundary and the fourth voltage boundary respectively in accordance with the total counted number being equal to the preset number. In some implementations, the control component may be configured to, in the process of making adjustments in each direction, if the third boundary voltage and the fourth boundary voltage have been determined, obtain the corresponding first result at the target read voltage after the last adjustment. In some implementations, the target read voltage after the last adjustment may be an average of the third boundary voltage and the fourth boundary voltage. In some implementations, the control component may be configured to take, as the target valley voltage, the read voltage corresponding to the minimum first result among the multiple corresponding first results at all the adjusted target read voltages.

In some implementations, the array of memory cells may include memory cells with multiple storage bits, and the multiple storage bits correspond to multiple pages respectively. In some implementations, at least part of the pages may correspond to multiple stages, the multiple stages including a first stage and a second stage, and the read voltage in the second stage being less than the read voltage in the first stage. In some implementations, the control component may be configured to generate a target valley voltage in the second stage of the multiple stages or a target valley voltage in other first stage corresponding to a lower read voltage with the determined target valley voltage in accordance with a target valley voltage in the first stage to which a stage number corresponding to the determined target valley voltage belonging.

According to still another aspect of the present disclosure, a method for operating a memory device is provided. The method may include generating a first boundary voltage and a second boundary voltage in accordance with a first result corresponding to at least one code word at a target read voltage. The at least one code word may be formed by a preset number of memory cells in a memory device. The first result may include the number of bits which represents the number of bits in the at least one code word which are flipped in two read results at a first read voltage and a second read voltage. A difference between the first read voltage and the second read voltage may be lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method may include determining a target valley voltage in accordance with the corresponding first result at the adjusted target read voltage meeting a preset condition. The target valley voltage may be taken as a read voltage at which a read operation is performed on the at least one code word.

According to a further aspect of the present disclosure, a method for operating a memory system is provided. The method may include sending, by a memory controller in the memory system, a first instruction, wherein the first instruction indicates to obtain information representing a target valley voltage. The method may include receiving, by a memory device in the memory system, the first instruction, and obtaining information representing the target valley voltage, and sending the obtained information representing the target valley voltage to the memory controller. The method may include controlling, by the memory controller, the memory device to perform a read operation with a predicted target valley voltage in the information representing the target valley voltage, and performing an error correction decode operation on the read result of the read operation. The obtaining information may represent the target valley voltage may include generating a first boundary voltage and a second boundary voltage in accordance with a first result corresponding to at least one code word at a target read voltage. The at least one code word may be formed by a preset number of memory cells in a memory device. The first result including the number of bits which represents the number of bits in the at least one code word which are flipped in two read results at a first read voltage and a second read voltage. A difference between the first read voltage and the second read voltage being lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method may include determining a target valley voltage in accordance with the corresponding first result at the adjusted target read voltage meeting a preset condition. The target valley voltage may be taken as a read voltage at which a read operation is performed on the at least one code word.

According to yet another aspect of the present disclosure, a method for operating a memory controller that includes a control component is provided. The method may include generating a first boundary voltage and a second boundary voltage in accordance with a first result corresponding to at least one code word at a target read voltage. The at least one code word may be formed by a preset number of memory cells in at least one memory device coupled to the memory controller. The first result may include the number of bits which represents the number of bits in the at least one code word which are flipped in two read results at a first read voltage and a second read voltage. A difference between the first read voltage and the second read voltage may be lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method may include determining a target valley voltage in accordance with the corresponding first result at the adjusted target read voltage meeting a preset condition. The target valley voltage may be taken as a read voltage at which a read operation is performed on the at least one code word.

According to still another aspect of the present disclosure, a non-transitory computer-readable medium for a memory device is provided. The non-transitory computer-readable medium may have executable instructions stored thereon, which, when executed, implement a method for operating a memory device. The method may include generating a first boundary voltage and a second boundary voltage in accordance with a first result corresponding to at least one code word at a target read voltage, wherein the at least one code word is formed by a preset number of memory cells in a memory device. The first result may include the number of bits which represents the number of bits in the at least one code word which are flipped in two read results at a first read voltage and a second read voltage. A difference between the first read voltage and the second read voltage being lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method may include determining a target valley voltage in accordance with the corresponding first result at the adjusted target read voltage meeting a preset condition. The target valley voltage may be taken as a read voltage at which a read operation is performed on the at least one code word.

According to still another aspect of the present disclosure, a non-transitory computer-readable medium for a memory system is provided. The non-transitory computer-readable medium may have executable instructions stored thereon, which, when executed, implement a method for operating the memory system. The method may include sending, by a memory controller in the memory system, a first instruction. The first instruction may indicate to obtain information representing a target valley voltage. The method may include receiving, by a memory device in the memory system, the first instruction, and obtaining information representing the target valley voltage, and sending the obtained information representing the target valley voltage to the memory controller. The method may include controlling, by the memory controller, the memory device to perform a read operation with a predicted target valley voltage in the information representing the target valley voltage, and performing an error correction decode operation on the read result of the read operation. The obtaining information representing the target valley voltage may include generating a first boundary voltage and a second boundary voltage in accordance with a first result corresponding to at least one code word at a target read voltage. The at least one code word may be formed by a preset number of memory cells in a memory device. The first result may include the number of bits which represents the number of bits in the at least one code word which are flipped in two read results at a first read voltage and a second read voltage. A difference between the first read voltage and the second read voltage may be lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method determining a target valley voltage in accordance with the corresponding first result at the adjusted target read voltage meeting a preset condition, the target valley voltage being taken as a read voltage at which a read operation is performed on the at least one code word.

According to yet another aspect of the present disclosure, a non-transitory computer-readable medium for a memory controller including a control component is provided. The method may include generating a first boundary voltage and a second boundary voltage in accordance with a first result corresponding to at least one code word at a target read voltage. The at least one code word may be formed by a preset number of memory cells in at least one memory device coupled to the memory controller. The first result may include the number of bits which represents the number of bits in the at least one code word which are flipped in two read results at a first read voltage and a second read voltage. A difference between the first read voltage and the second read voltage may be lower than a preset voltage. The method may include making at least one adjustment to the target read voltage, and obtaining the corresponding first result at the adjusted target read voltage after each adjustment. In a process of the adjustment, the method may include changing a current direction of adjustment to the voltage in accordance with the target read voltage after one adjustment exceeding a range defined by the first boundary voltage and the second boundary voltage. The method may include determining a target valley voltage in accordance with the corresponding first result at the adjusted target read voltage meeting a preset condition. The target valley voltage may be taken as a read voltage at which a read operation is performed on the at least one code word.

BRIEF DESCRIPTION OF THE DRAWINGS

In the accompanying drawings, unless otherwise specified, same reference numbers refer to same or similar parts or elements throughout multiple accompanying drawings. The accompanying drawings are not necessarily to scale. It should be understood that these accompanying drawings depict only some examples disclosed in accordance with the present application and should not be considered as limiting the scope of the present application.

FIG. 7 is a schematic diagram of the implementation process of operating a method that peripheral circuit of a memory device provided by an example of the present application is configured to perform;

DETAILED DESCRIPTION

Figure 1:
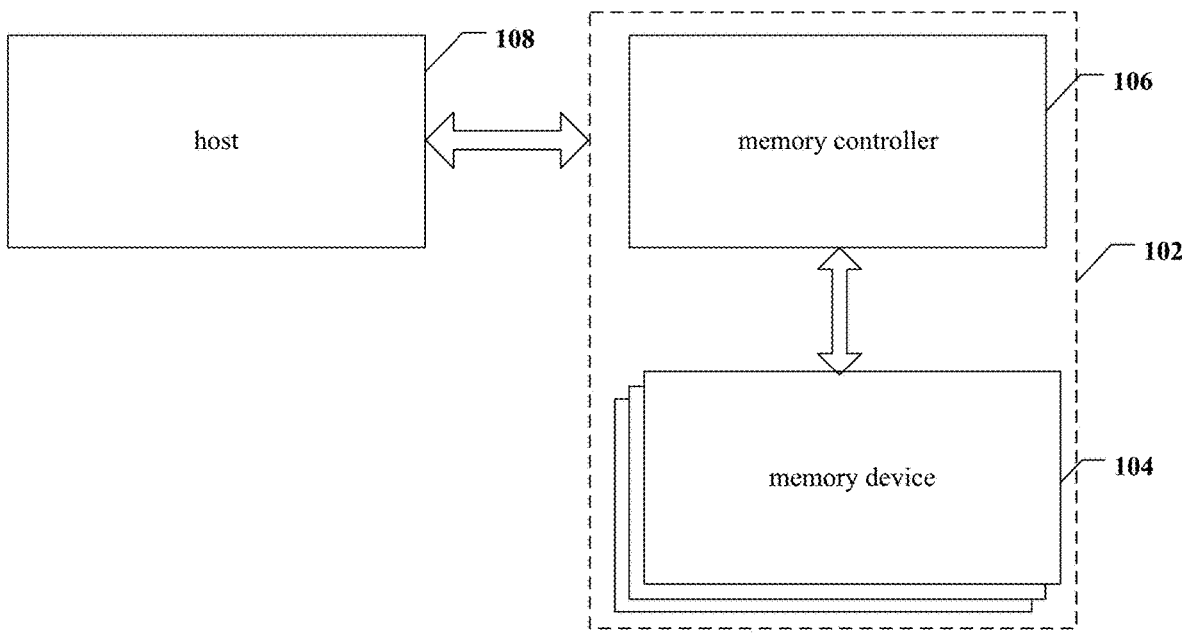
FIG. 1 is a schematic diagram of an example system with a memory system of an example in accordance with the present application.

Example implementations disclosed in the present application will be described in more detail below with reference to the accompanying drawings. Although example implementations of the present application are shown in the accompanying drawings, it should be understood that the present application may be implemented in various forms and should not be limited to the specific implementations set forth herein. Rather, these examples are provided so that the present application can be more thoroughly understood and the scope of the present application can be fully conveyed to those skilled in the art.

In the following description, numerous specific details are given in order to provide a more thorough understanding of the present application. However, it will be apparent to one skilled in the art that the present application may be practiced without one or more of these details. In other examples, in order to avoid confusion with the present application, some technical features known in the art are not described; that is, not all features of the actual example are described here, and well-known functions and structures are not described in detail.

Furthermore, accompanying drawings are merely schematic illustrations of the present application and are not necessarily drawn to scale. Same reference numerals in the accompanying drawings represent same or similar parts, and thus repeated description thereof will be omitted. Some of the block diagrams shown in the accompanying drawings are functional entities and do not necessarily correspond to physically or logically separate entities. These functional entities may be implemented in software form, or implemented in one or more hardware modules or integrated circuits, or implemented in different networks and/or processor devices and/or microcontroller devices.

The flowcharts shown in the accompanying drawings are illustrative only and do not necessarily include all operations. For example, some operations may be decomposed, and some operations may be merged or partially merged, thus the actual sequence of execution may change in accordance with the actual situation.

A term used herein is for the purpose of describing a particular example only and is not to be considered as limitation of the present application. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, operations, operations, elements and/or parts, but do not exclude the presence of one or more other features, integers, operations, operations, elements, parts and/or groups. As used herein, the term "and/or" includes any and all combinations of the associated listed items.

Memory devices in examples of the present application include but are not limited to a three-dimensional NAND memory, and for ease of understanding, a three-dimensional NAND memory is taken as an example for illustration.

FIG. 1 illustrates a block diagram of an example system 100 with memory devices in accordance with some aspects of the present application. The system 100 may be a mobile phone, a desktop computer, a laptop computer, a tablet, a vehicle computer, a gaming console, a printer, a positioning device, a wearable electronic device, a smart sensor, a Virtual Reality (VR) device, an Augment Reality (AR) device, or any other suitable electronic devices having memory device therein. As shown in in FIG. 1, system 100 may include a host 108 and a memory system 102, and the memory system 102 includes one or more memory devices 104 and a memory controller 106. The host 108 may be a processor of an electronic device (e.g., a Central Processing Unit (CPU)) or a System of Chip (SoC) (e.g., an Application Processor (AP)). Host 108 may be configured to send data to or receive data from memory device 104.

In accordance with some implementations, memory controller 106 is coupled to memory device 104 and host 108 and is configured to control memory device 104. Memory controller 106 may manage data stored in memory device 104 and communicate with host 108. In some implementations, the memory controller 106 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc.

In some implementations, the memory controller 106 is designed to operate in high duty cycle environment Solid State Drive (SSD) or Embedded Multi Media Card (eMMC), where SSD or eMMC is taken as data storage for mobile devices such as smartphone, tablet computer, laptop computer, and enterprise storage array.

Memory controller 106 may be configured to control operations of memory device 104, e.g., read, erase and program operations. Memory controller 106 may also be configured to manage various functions related to data stored or to be stored in memory device 104, including but not limited to bad block management, garbage collection, logical-to-physical address translation, wear leveling, etc. In some implementations, memory controller 106 is also configured to process error correction code related to data read from or written to memory device 104.

The memory controller 106 may also perform any other suitable functions, e.g., formatting the memory device 104. Memory controller 106 may communicate with external devices (e.g., host 108) in accordance with a particular communication protocol. For example, the memory controller 106 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

The memory controller 106 and one or more memory device 104 may be integrated into various types of storage devices, e.g., included in the same package (e.g., Universal Flash Storage (UFS) package or eMMC package). That is, memory system 102 may be implemented and packaged into different types of end electronic products.

Figure 2A:
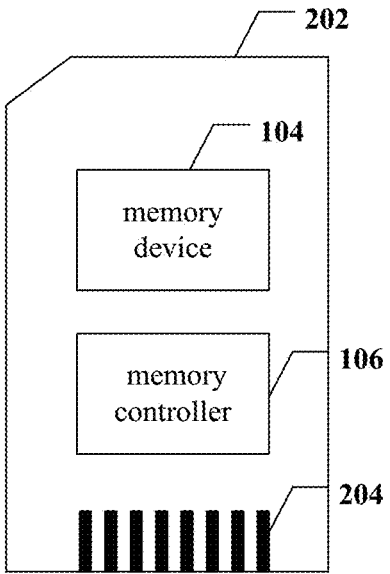
FIG. 2A is a schematic diagram of an example memory card with a memory system in accordance with an example of the present application.

In one example as shown in FIG. 2A, memory controller 106 and a single memory device 104 may be integrated into a memory card 202. Memory card 202 may include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 202 may further include a memory card connector 24 coupling memory card 202 with a host (e.g., host 108 in FIG. 1).

Figure 2B:
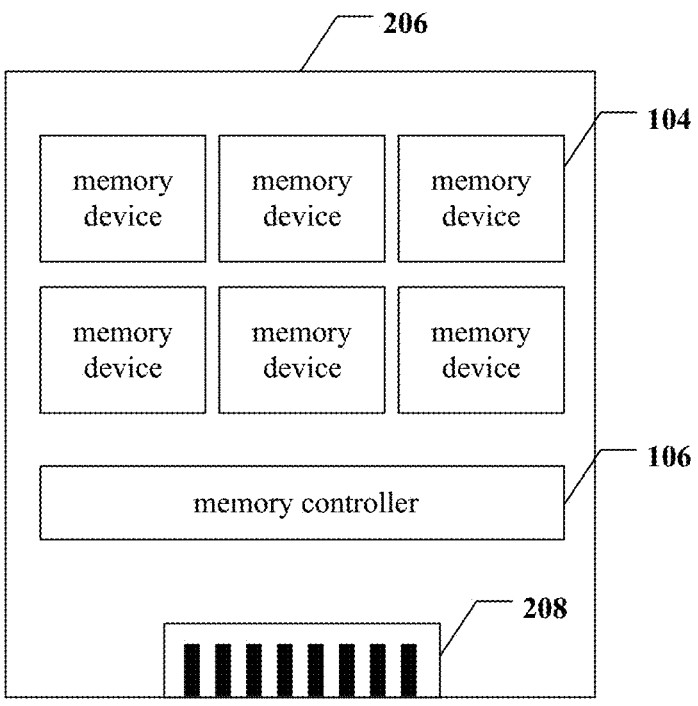
FIG. 2B is a schematic diagram of an example solid state drive with a memory system in accordance with an example of the present application.

In another example as shown in FIG. 2B, memory controller 20 and multiple memory devices may be integrated into a SSD 206. SSD 206 may further include an SSD connector 208 coupling the SSD 206 with a host (e.g., host 108 in FIG. 1). In some implementations, the storage capacity and/or operating speed of SSD 206 is greater than the storage capacity and/or operating speed of memory card 202.

In some examples, each memory block may be coupled to multiple word lines, and multiple memory cells coupled to each word line constitute a physical page.

Figure 3:
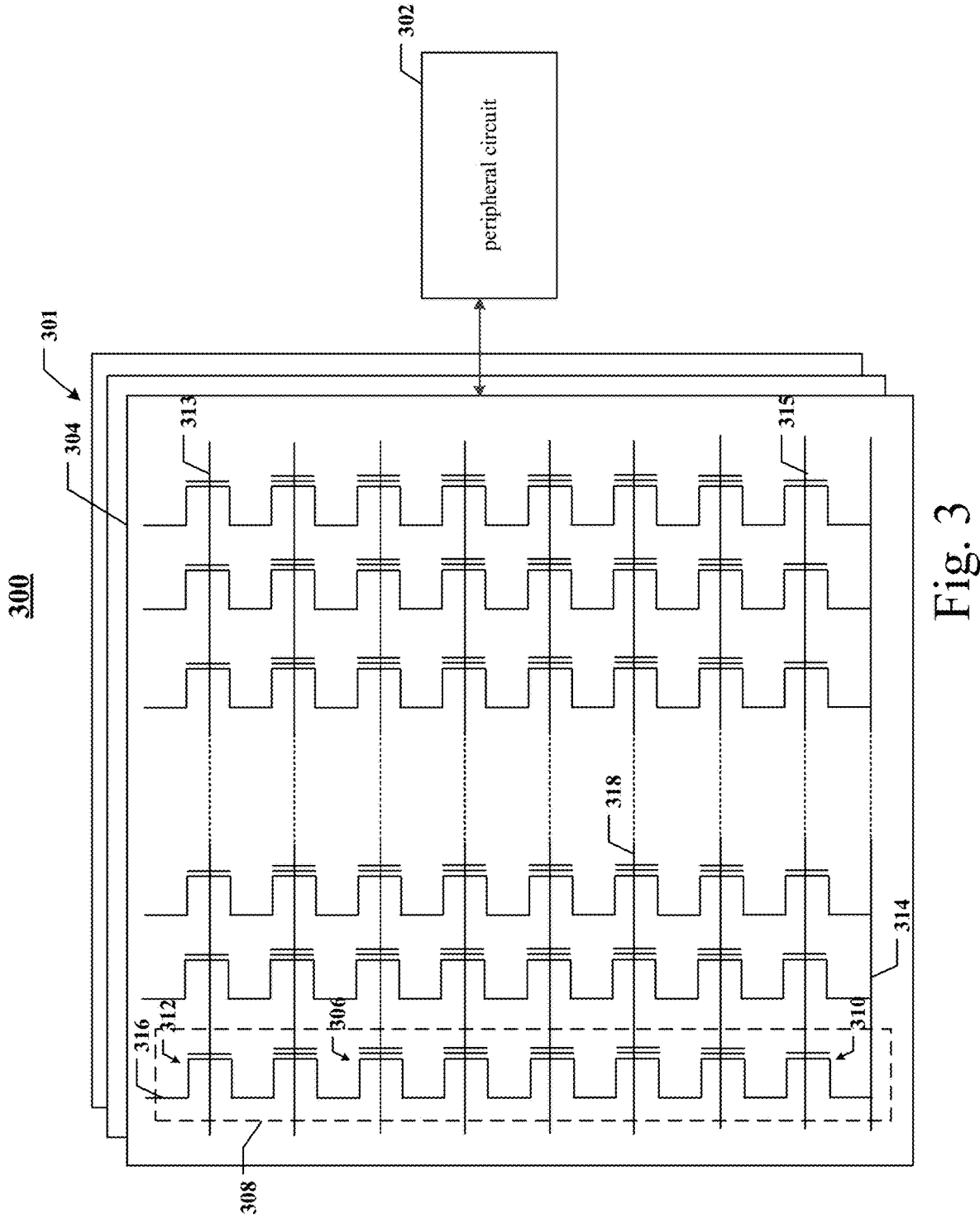
FIG. 3 is a schematic diagram of an example memory including peripheral circuit in accordance with an example of the present application.

FIG. 3 illustrates a schematic circuit diagram of an example memory device 300 including peripheral circuit in accordance with some aspects of the present application. Memory device 300 may be an example of memory device 104 in FIG. 1. The memory device 300 may include an array of memory cells 306 and a peripheral circuit 302 coupled to the array of memory cells 306. Taking memory cell array 301 being a three-dimensional NAND memory cell array as an example for illustration, where memory cells 306 is a NAND-type memory cell, and memory cells 306 are provided in the form of an array of memory strings 308, each memory string 308 extending vertically over a substrate (not shown). In some implementations, each memory string 308 includes multiple memory cells 306 coupled in series and stacked vertically. Each memory cell 306 may retain a continuous analog value, e.g., voltage or charge, depending on the number of electrons trapped within the area of the memory cell 306. Each memory cell 306 may be a "floating gate" type memory cell including a floating gate transistor, or a "charge trap" type memory cell including a charge trap transistor.

In some implementations, each memory cell 306 is a Single-level Cell (SLC) that includes two possible memory states and may thus store one bit of data. For example, a first memory state of "0" may correspond to a first voltage range, and a second memory state of "1" may correspond to a second voltage range. In some implementations, each memory cell 306 is a Multi-Level Cell (MLC) capable of storing more than a single bit of data in more than four memory states. For example, an MLC may store two bits per cell (also known as a Double-Level Cell), three bits per cell (also known as a Trinary-Level Cell (TLC)), four bits per cell (also known as a Quad-Level Cell (QLC)), five bits per cell (also known as a Penta-level cell (PLC)), or more than five bits per cell. Each MLC can be programmed to assume a range of possible nominal storage values. In one example, if each MLC stores two bits of data, the MLC can be programmed to assume one of three possible programming levels from the erased state through writing one of three possible nominal storage values into the cell, a fourth nominal storage value may be used for the erase state.

It should be noted that the storage state mentioned here is also the storage state of the memory cell mentioned in this application. Different memory cells have different numbers of storage states. e.g., a SLC type memory cell includes 2 storage states (e.g., two memory states), where the 2 storage states include a programming state and an erase state. As another example, an MLC type memory cell includes 4 storage states, where the four storage states include one erase state and three programming states. As yet another example, a TLC type memory cell includes 8 storage states, where the 8 storage states include one erase state and seven programming states. In some implementation, the QLC type memory cell includes 16 storage states, where the 16 storage states include one erase state and fifteen programming states.

As shown in FIG. 3, each memory string 308 may include a bottom select gate (BSG) 310 (also referred to as a source side select gate) at its source terminal and a top select gate (TSG) 312 (also referred to as a drain side select gate) at its drain terminal. BSG 310 and TSG 312 may be configured to activate the selected memory cell string 308 during read operation and program operation. In some implementations, the sources of memory strings 308 in a same memory block 304 are coupled through a same source line (SL) 314 (e.g., a common SL). In other words, in accordance with some implementations, all memory strings 308 in a same memory block 304 have an array common source (ACS). In accordance with some implementations, TSG 312 of each memory string 308 is coupled to a corresponding bit line (BL) 316 from which data may be read or written via an output bus (not shown). In some implementations, each memory string 308 is configured to be selected or deselected through applying a select voltage (e.g., above the threshold voltage of a transistor with a TSG 312) or a deselect voltage (e.g., 0V) to the corresponding TSG 312 via one or more TSG lines 313 and/or applying a select voltage (e.g., above the threshold voltage of a transistor with a BSG 310) or a deselect voltage (e.g., 0V) to the corresponding BSG 310 via one or more BSG lines 315.

As also shown in FIG. 3, a memory string 308 may be organized into multiple memory blocks 304 each of which may have a common source line 314 (e.g., coupled to ground). In some implementations, each memory block 304 is the basic data unit for an erase operation, e.g., all memory cells 306 on the same memory block 304 are erased simultaneously. To erase the memory cell 306 in the selected memory block 304, the source line 314 coupled to the selected memory block 304 and to the unselected memory blocks 304 in the same plane as the selected memory block 304 may be biased with an erase voltage (Vers) (e.g., a high positive voltage (e.g., 20V or higher)). It should be understood that, in some examples, erase operations may be performed at the half-memory block level, at the quarter-memory block level, or at a level with any suitable number of memory blocks or any suitable fraction of memory blocks. The memory cells 306 of adjacent memory strings 308 may be coupled through a word line 318 that selects which row of memory cells 306 is affected by read and program operations.

Referring to FIG. 3, each memory cell 306 of the multiple memory cells is coupled to a corresponding word line 318, and each memory string 308 is coupled to a corresponding bit line 316 through a corresponding select transistor (e.g., top select transistor (TSG) 312).

Figure 4:
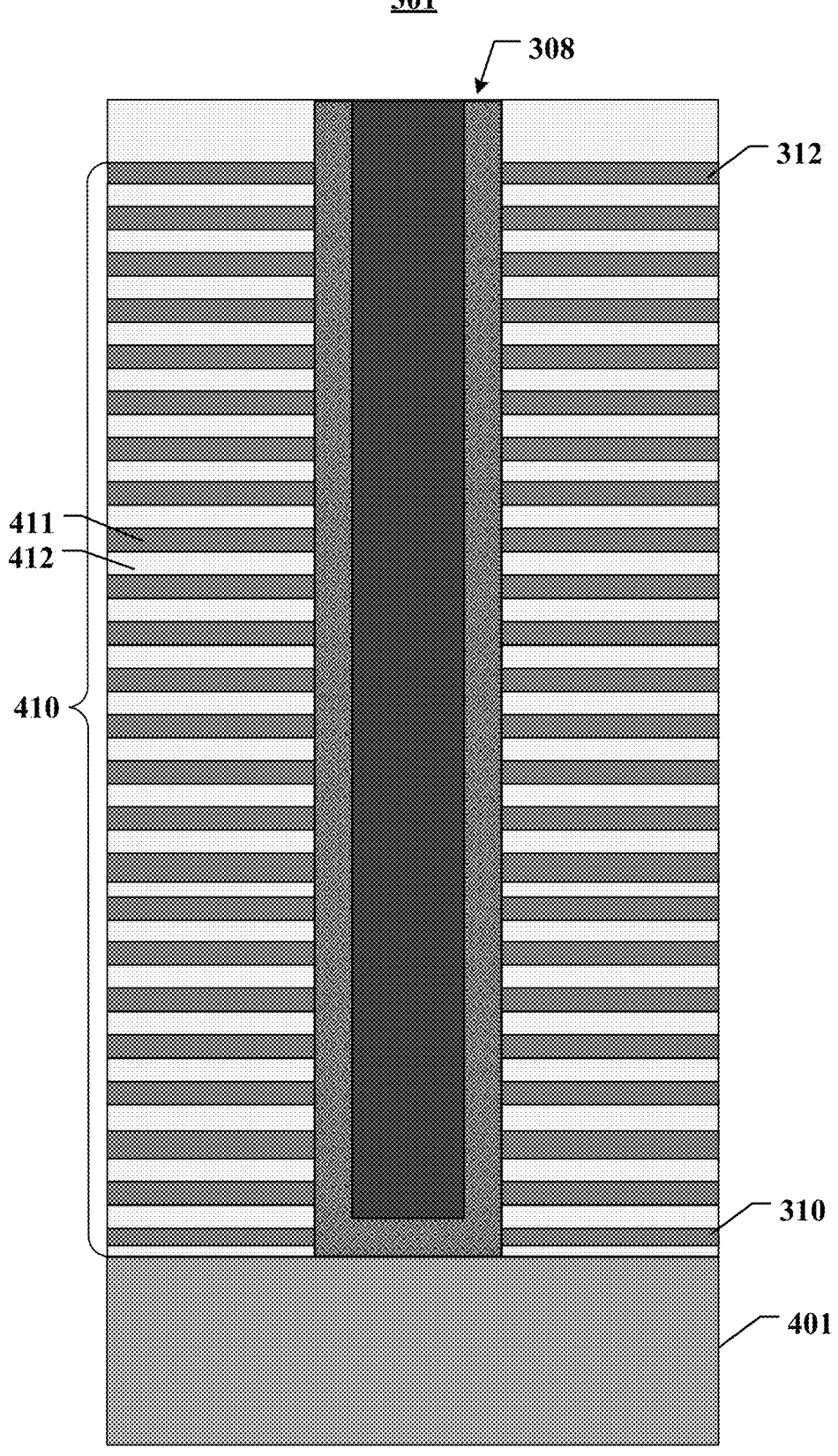
FIG. 4 is a schematic cross-sectional view of an array of memory cells including NAND-type memory strings in accordance with an example of the present application.

FIG. 4 illustrates a schematic cross-sectional view of an example memory cell array 301 including memory strings 308, e.g., NAND, in accordance with some aspects of the present application. As shown in FIG. 4, the NAND memory cell array 301 may include a stacked structure 410, the stacked structure 410 includes multiple gate layers 411 and multiple insulating layers 412 alternately stacked in sequence, and the channel structure vertically penetrating through the gate layers 411 and the insulating layers 412, where the channel structure is coupled to each gate layer to form a memory cell, and the channel structure is coupled to multiple gate layers in the stacked structure 410 to form the memory string 308. Gate layers 411 and the insulating layers 412 may be stacked alternately, and two adjacent gate layers 411 are separated by an insulating layer 412.

A constituent material of the gate layer 411 may include a conductive material. Conductive materials include, but are not limited to, tungsten (W), cobalt (Co), copper (Cu), aluminum (Al), polysilicon, doped silicon, silicide, or any combination thereof. In some examples, each gate layer 411 includes a metal layer, e.g., a tungsten layer. In some examples, each gate layer 411 includes a doped polysilicon layer. Each gate layer 411 may include a control gate surrounding a memory cell. A gate layer 411 at the top of a stacked structure 410 may extend laterally as an upper selection gate line, a gate layer 411 at the bottom of a stacked structure 410 may extend laterally as a lower selection gate line, and a gate layer 411 extending laterally between a upper selection gate line and a lower selection gate line may serve as a word line layer.

In some examples, a stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some examples, a memory string 308 includes a channel structure extending vertically through stacked structure 410. In some implementations, a channel structure includes a channel hole filled with semiconductor material(s) (e.g., as a semiconductor channel) and dielectric material(s) (e.g., as a memory film). In some implementations, a semiconductor channel includes silicon, e.g., polysilicon. In some implementations, a memory film is a composite dielectric layer including a tunneling layer, a storage layer (also referred to as a "charge trapping/storage layer"), and a blocking layer. A channel structure may have a cylindrical shape (e.g., a pillar shape). In accordance with some implementations, a semiconductor channel, a tunneling layer, a storage layer and a blocking layer are radially arranged in this sequence from the center of the pillar toward the outer surface of the pillar. A tunneling layer may include silicon oxide, silicon oxynitride, or any combination thereof. A storage layer may include silicon nitride, silicon oxynitride, or any combination thereof. A barrier layer may include silicon oxide, silicon oxynitride, a high-k (high-k) dielectric, or any combination thereof. In an example, a memory film may include a composite layer of silicon oxide/silicon oxynitride/silicon oxide (ONO).

Figure 5:
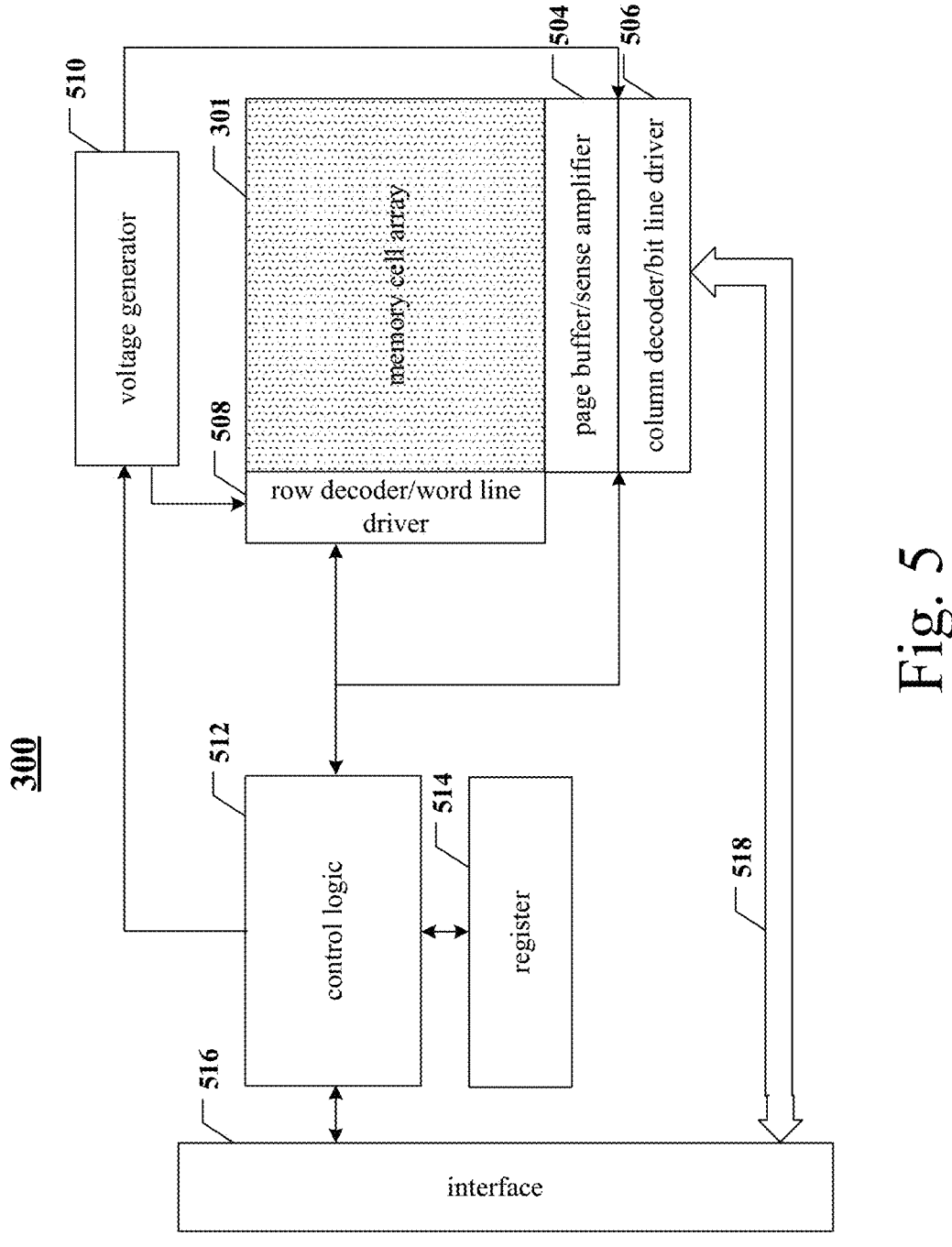
FIG. 5 is a schematic diagram of an example memory device including an array of memory cells and peripheral circuit in accordance with an example of the present application.

Referring back to FIG. 3, the peripheral circuit 302 may be coupled to the array of memory cells 306 through bit line 316, word line 318, source line 314, BSG line 315, and TSG line 313. The peripheral circuit 302 may include any suitable analog, digital, and mixed-signal circuitry for facilitating operation of the array of memory cells 306 through applying a voltage signal and/or a current signal to and sensing voltage signal and/or current signal from each target memory cell 306 via bit line 316, word line 318, source line 314, BSG line 315, and TSG line 313. The peripheral circuit 302 may include various types of peripheral circuit formed with metal-oxide-semiconductor (MOS) technology. For example, FIG. 5 illustrates some example peripheral circuit, the peripheral circuit includes page buffer/sense amplifier 504, column decoder/bit line driver 506, row decoder/word line driver 508, voltage generator 510, control logic 512, register 514, interface 516 and data bus 518. It should be understood that in some examples, additional peripheral circuit not shown in FIG. 5 may also be included.

The page buffer/sense amplifier 504 may be configured to read data from and program (write) data to the array of memory cells 306 in accordance with control signals from the control logic 512. In one example, the page buffer/sense amplifier 504 may store programming data (written data) to be programmed into the array of memory cells 306. In another example, the page buffer/sense amplifier 504 may perform a programming verify operation to ensure that data has been correctly programmed into memory cell 306 coupled to selected word line 318. In yet another example, the page buffer/sense amplifier 504 may also sense a low power signal from bit line 316 representing a data bit stored in memory cell 306 and amplify a small voltage swing to a recognizable logic level during a read operation. The column decoder/bit line driver 506 may be configured to be controlled by control logic 512 and to select one or more memory strings 308 through applying a bit line voltage generated from voltage generator 510.

The row decoder/word line driver 508 may be configured to be controlled by control logic 512 and select/deselect memory block 304 of memory cell array 301 and select/deselect word line 318 of memory block 304. The row decoder/word line driver 508 may also be configured to drive word line 318 with a word line voltage generated from voltage generator 510. In some implementations, the row decoder/word line driver 508 may also select/deselect and drive the BSG line 315 and the TSG line 313. As described in detail below, the row decoder/word line driver 508 is configured to perform programming operations on the memory cells 306 coupled to the selected word line 318. The voltage generator 510 may be configured to be controlled by the control logic 512, and generate a word line voltage (e.g., read voltage, programming voltage, pass voltage, channel boost voltage, verify voltage, etc.), bit line voltage and source line voltage to be supplied to the array of memory cells 306.

The control logic 512 may be coupled to each of other portions of the peripheral circuit described above, and configured to control operations of each of the other portions of the peripheral circuit. The register 514 may be coupled to the control logic 512 and include status register, command register and address register for storing status information, command operation code (OP code) and command address for controlling operations of each of the peripheral circuit. The interface 516 may be coupled to control logic 512 and act as a control buffer to buffer and relay control commands received from a host (not shown) to control logic 512 and to buffer and relay status information received from the control logic 512 to the host. Interface 516 may also be coupled to column decoder/bit line driver 506 via data bus 518 and act as a data I/O interface and data buffer to buffer and relay data to/from memory cell array 301.

The basic principle of three-dimensional NAND memory is that carriers (electrons or holes) cross the charge barrier and inject a certain amount of charge into the memory cell to complete the process of data write, the storage data may then be read in accordance with the threshold voltage when the memory cell is turned on. Therefore, in order to read correct data, an error correction algorithm with strong error correction capability and high efficiency is usually introduced when reading data.

However, as the use time increases, the charge stored in the memory cell will change with the increase in use time, repeated read operations, cross temperature, etc., therefore affecting the accuracy of data reading. When the threshold voltage offsets upward or downward significantly, when the original read voltage is used to read the data of the memory cell, the possibility of occurring read error will be very high, and a read error exceeding the error correction capability will also cause data read of the memory cell to fail.

Figure 6:
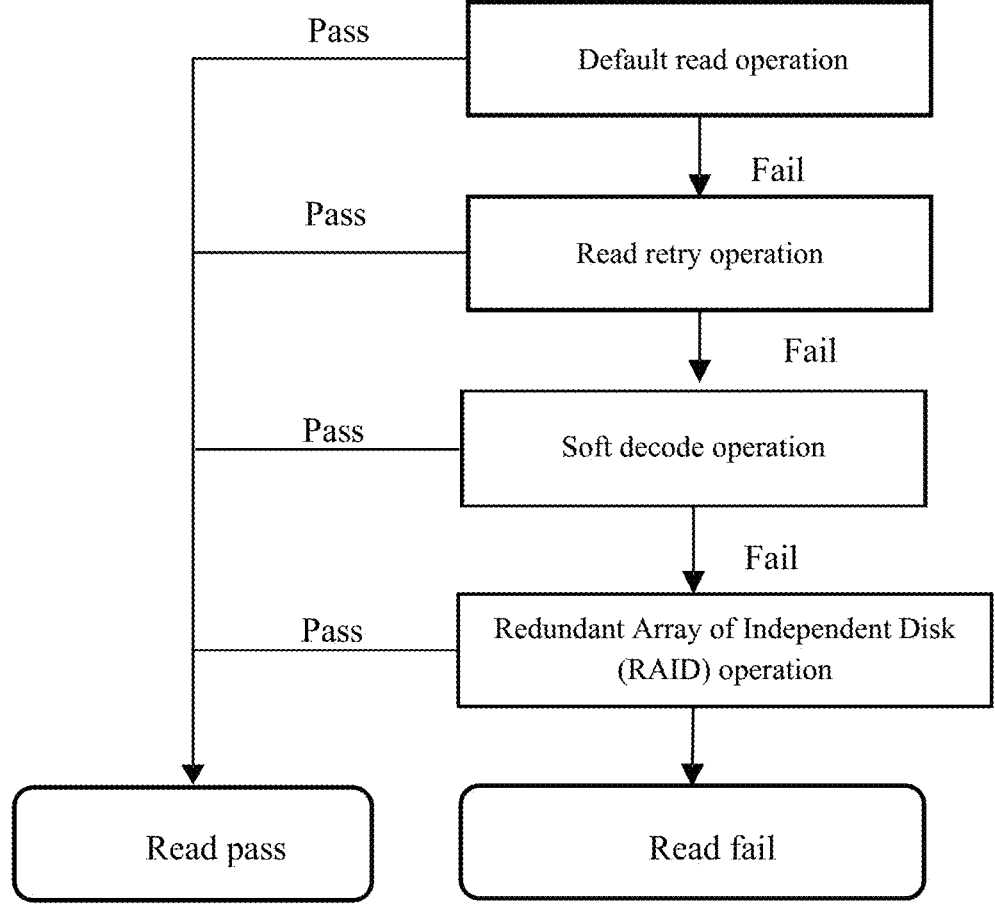
FIG. 6 is a schematic diagram of an example flow of a read operation of a memory system provided by the present application.

FIG. 6 illustrates a schematic diagram of an example flow of a read operation of a memory system. In conjunction with what is shown in FIG. 6, when the memory controller controls the memory device to perform a read operation, a default read operation (FW) is first performed on the memory cell at the corresponding physical address; if the default read operation fails, a read retry operation is performed; after the read retry operation fails, a soft decode operation is performed; after the soft decode fails, a Redundant Array of Independent Disk (RAID) operation is performed; and after the RAID operation fails, the read operation stops and the read fails because the error cannot be corrected, then the memory controller sends a read fail signal to the host 108. Read retry operation and default read operation may be applicable to hard decode.

In some implementations, the read retry operation may usually be performed through querying the retry table provided by the manufacturer. The essence of the read retry operation is an error correction mechanism, the retry table may provide a reference voltage for reading data, which attempts to read each memory cell again with a read voltage that deviates from the normal threshold voltage through querying the retry table, combined with error correction algorithm for error correction, thereby attempting to read the data correctly. If the erroneous read data is corrected, query for the retry table is stopped. If the erroneous read data cannot be corrected, the retry table will be queried until the entire retry table is traversed.

The read retry operation described above requires querying the retry table one by one, which will inevitably increase the number of retry and take a long time. In addition, the retry table provided by the manufacturer is only a reference value in some environments, and the real usage scenarios are ever-changing, therefore, many scenarios cannot be covered by the retry table provided by the manufacturer, therefore, even if the retry table is traversed, the data may not be corrected, resulting in a lot of wasted time processing the command. In summary, the method of performing the read retry operation through repeatedly polling the retry table takes a long time, affects the response time of subsequent commands, and thus affects the performance of the device.

Based on one or more of the problems described above, in a first aspect, an example of this application proposes a memory device. As shown in FIG. 7, the memory device includes: an array of memory cells, including multiple memory cells, a preset number of memory cells forming one code word; peripheral circuit, coupled to the array of memory cells and configured to include the following operations:

Operation S10. generate a first boundary voltage and a second boundary voltage in accordance with a first result corresponding to at least one code word at a target read voltage; the first result including the number of bits which represents the number of bits in the at least one code word which are flipped in two read results at a first read voltage and a second read voltage; a difference between the first read voltage and the second read voltage being lower than a preset voltage;

Operation S20. make at least one adjustment to the target read voltage, and obtain the corresponding first result at the adjusted target read voltage after each adjustment;

Operation S30. in a process of the adjustment, change a current direction of adjustment to the voltage in accordance with the target read voltage after one adjustment exceeding a range defined by the first boundary voltage and the second boundary voltage;

Operation S40. determine a target valley voltage in accordance with the corresponding first result at the adjusted target read voltage meeting a preset condition, the target valley voltage being taken as a read voltage at which a read operation is performed on the at least one code word.

Here, the structure of the memory device refers to the FIG. 3 described above and will not be repeated here.

In some examples, the memory device including an array of memory cells, the array of memory cells including multiple memory cells, a preset number of the memory cells forming one code word (CW).

In some examples, the number of memory cells contained in one code word is the same as the number of memory cells contained in one encode or decode when error correction encode or decode is being performed. In some examples, the number of memory cells contained in a code word may be less than or equal to the number of memory cells coupled to a physical page, e.g., the number of memory cells contained in a code word is ¼ of the number of memory cells coupled to a physical page. In some examples, a code word may include a number ranging from 24 to 212 memory cells. In one example, a code word may include 24, 28, or 212 memory cells.

In general, different memory systems may choose code words of different sizes to meet their requirement for performance, reliability, and storage.

Memory cells in different types of memory devices (e.g., MLC, TLC or QLC) may store different numbers of bits.

It should be noted that in actual code words, there will be some additional reserved space for management and error correction, thus the actual number of memory cells required may slightly exceed the calculation results described above.

It may be understood that a code word may include multiple memory cells, and the number of memory cells included in a code word may be adjusted in accordance with actual situations.

In some examples, during the process of reading the memory device, one read operation reads data of one physical page, and when the number of memory cells included in one code word may be less than the number of memory cells coupled to one physical page, the code word is a unit that may be performed to obtain the first result, but the case of multiple code words is not excluded. That is, the first result corresponding to at least one code word at the current read voltage may be obtained here. For example, a physical page may include 4 code words, the page buffer hardware operation may count the Fail Bit Count (FBC) of each of the 4 code words at one time, and then the FBC of the four code words are added to obtain the FBC of one physical page, and the added value is used by subsequent calculations. It may be understood that the first result here may be based on data of one physical page, and one physical page may include multiple code words.

In some examples, the array of memory cells includes memory cells with P storage bits, and the P storage bits correspond to P pages respectively, and the P bit memory cells read their P bits of storage data through Q-level read voltages; where P, Q are both integers greater than 1, and $Q=2^P-1$.

Figure 8A:
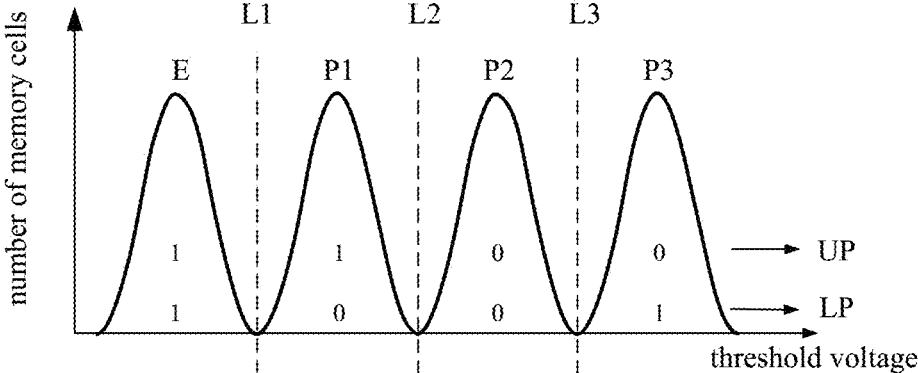
FIG. 8A is a schematic diagram of the threshold voltage distribution corresponding to a memory cell including 2 memory bits provided by an example of the present application.

In one example, when the storage bits of the memory cell include two bits, the corresponding storage states include the 0-th state to the 4-th state, referring to FIG. 8A, the 4 states are the 0-th (also referred to as erase state) state E, the 1st state (also referred to as the 1st storage state) P1, the 2nd state (also referred to as the 2nd storage state) P2 and the 3rd state (also referred to as the 3rd storage state) P3, and the binary data corresponding to the 4 states are 11, 10, 00, 01 respectively. Accordingly, the memory device includes two pages, namely a Lower Page (LP) and an Upper Page (UP).

Taking the memory cell shown in FIG. 8A as an example, the two-bit memory cell passes through read voltages at three levels (the first-level read voltage L1, the second-level read voltage L2, and the third-level read voltage L3 shown in FIG. 8A) to read its two-bit and four-state storage data.

In one example, one page corresponds to read voltages at multiple levels, and another page corresponds to read voltages at one level, as shown in FIG. 8A, the binary data corresponding to the lower page is 1001, and reading the lower page requires corresponding first-level read voltage L1 and third-level read voltage L3. The binary data corresponding to the upper page is 1100, and reading the upper page requires corresponding second-level read voltage L2.

Figure 8B:
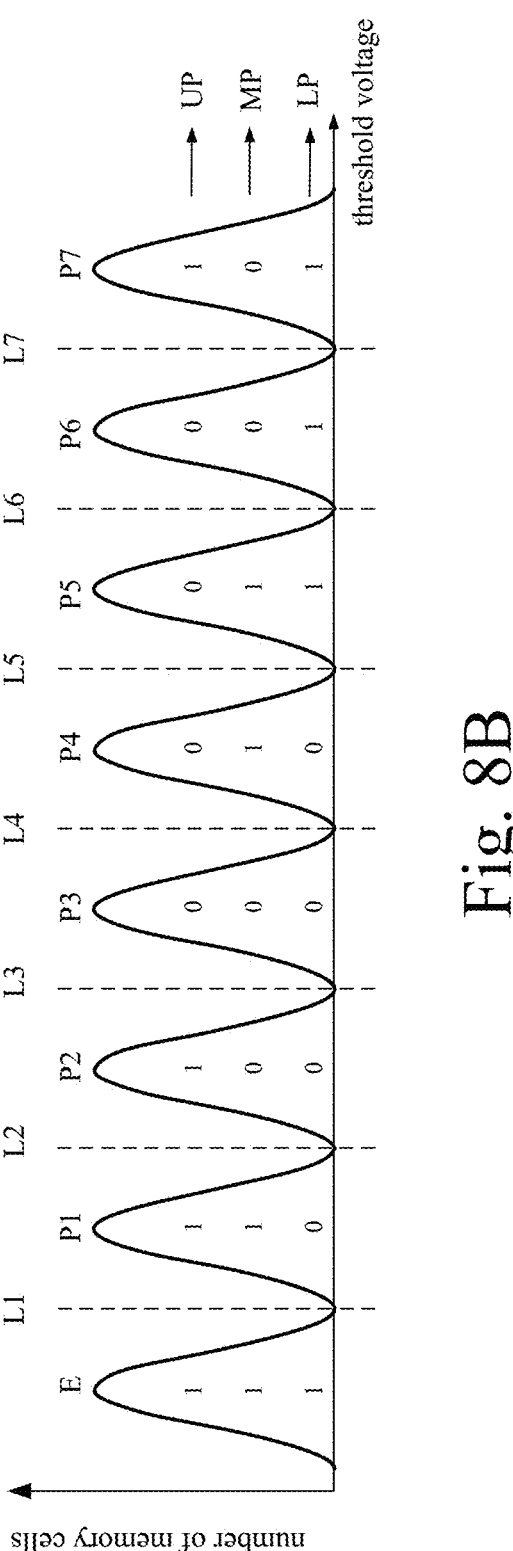
FIG. 8B is a schematic diagram of the threshold voltage distribution corresponding to a memory cell including 3 memory bits provided by an example of the present application.

In one example, when the storage bits of the memory cell include three bits, the corresponding storage states include the 0-th state to the 7-th state, referring to FIG. 8B, the 8 states are the 0-th (also referred to as erase state) state E, the 1st state (also referred to as the 1st storage state) P1, the 2nd state (also referred to as the 2nd storage state) P2 . . . the 7th state (also referred to as the 7-th storage state) P7, and the binary data corresponding to the 8 states are 111, 110, 100, 000, 010, 011, 001, 101, respectively. Accordingly, the memory device includes three pages, namely a Lower Page (LP), a Middle Page (MP), and an Upper Page (UP).

Taking the memory cell shown in FIG. 8B as an example, the three-bit memory cell passes through read voltages at seven levels (the first-level read voltage L1, the second-level read voltage L2, and the third-level read voltage L3, the fourth-level read voltage L4, the fifth-level read voltage L5, the sixth-level read voltage L6 and the seventh-level read voltage L7 as shown in FIG. 8B) to read its three-bit and eight-state storage data.

In one example, each page corresponds to read voltages at multiple levels, as shown in FIG. 8B, the binary data corresponding to the lower page is 10000111, and reading the lower page requires corresponding first-level read voltage L1 and fifth-level read voltage L5. The binary data corresponding to the middle page is 11001100, and reading the middle page requires corresponding second-level read voltage L2, fourth-level read voltage L4 and sixth-level read voltage L6. The binary data corresponding to the upper page is 11100001, and reading the upper page requires corresponding third-level read voltage L3 and seventh-level read voltage L7.

Figure 8C:
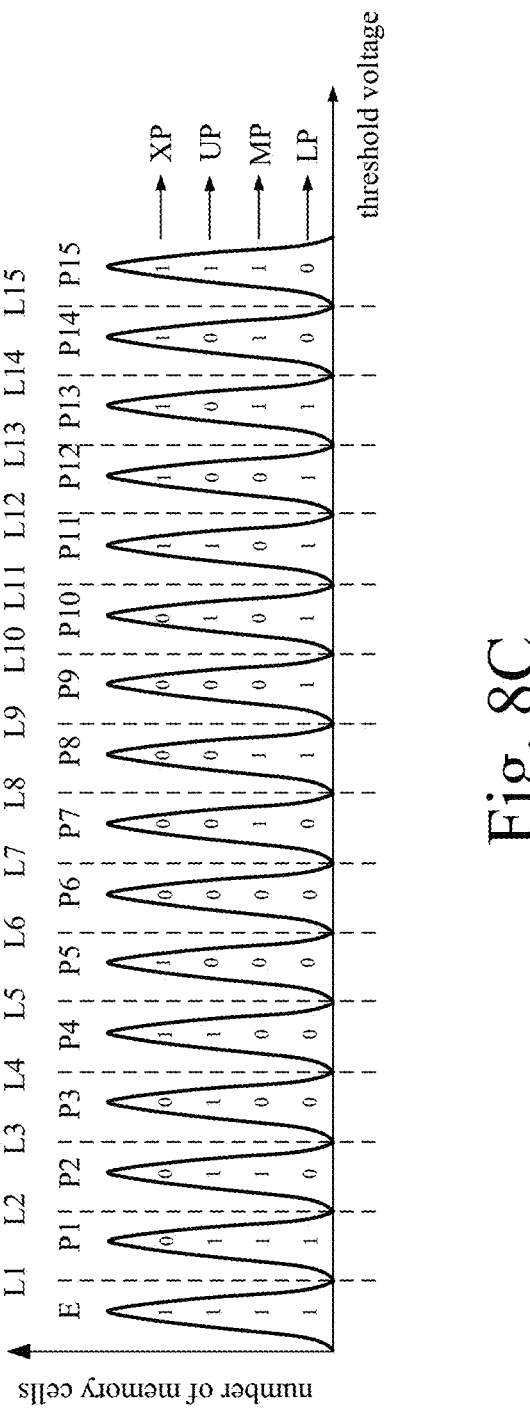
FIG. 8C is a schematic diagram of the threshold voltage distribution corresponding to a memory cell including 4 memory bits provided by an example of the present application.

In one example, when the storage bits of the memory cell include four bits, the corresponding storage states include the 0-th state to the 15-th state, referring to FIG. 8C, the 16 states are the 0-th (also referred to as erase state) state E, the 1st state (also referred to as the 1st storage state) P1, the 2nd state (also referred to as the 2nd storage state) P2 . . . the 15-th state (also referred to as the 15-th storage state) P15, and the binary data corresponding to the 16 states are 1111, 0111, 0110 . . . 1110 respectively. Accordingly, the memory device includes four pages, namely lower page, middle page, upper page, and extra page (XP). Here, the four storage bits corresponding to the 16 states are stored in the lower page, middle page, upper page, and extra page respectively.

Taking the memory cell shown in FIG. 8C as an example, the four-bit memory cell passes through read voltages at 15 levels (the first-level read voltage L1, the second-level read voltage L2, and the third-level read voltage L3, the fourth-level read voltage L4, the fifth-level read voltage L5, the sixth-level read voltage L6, the seventh-level read voltage L7, the eighth-level read voltage L8, the ninth-level read voltage L9, the tenth-level read voltage L10, the eleventh-level read voltage L11, the twelfth-level read voltage L12, the thirteenth-level read voltage L13, the fourteenth-level read voltage L14, the fifteenth-level read voltage L15 as shown in FIG. 8C) to read its four-bit and sixteen-state storage data.

In one example, each page corresponds to read voltages at multiple levels, as shown in FIG. 8C, the binary data corresponding to the lower page is 1100000011111100, and reading the lower page requires corresponding second-level read voltage L2, eighth-level read voltage L8, and fourteenth-level read voltage L14. The binary data corresponding to the middle page is 1110000110000111, and reading the middle page requires corresponding third-level read voltage L3, seventh-level read voltage L7, ninth-level read voltage L9 and thirteenth-level read voltage L13. The binary data corresponding to the upper page is 1111100000110001, and reading the upper page requires corresponding fifth-level read voltage L5, tenth-level read voltage L10, twelfth-level read voltage L12, and fifteenth-level read voltage L15. The binary data corresponding to the extra page is 1000110000011111, and reading the extra page requires corresponding first-level read voltage L1, fourth-level read voltage L4, sixth-level read voltage L6 and eleventh-level read voltage L11.

The lower page is usually closest to the source/drain, thus the read voltages at each of the levels corresponding to the lower page is determined preferentially, which is at the fastest access speed and with the shortest response time, and ensures balanced performance and durability during data access.

It should be noted that the method of preferentially determining the read voltages at each of the levels corresponding to the lower page is only an example and is not used to limit the sequence of determining the read voltages at each of the multiple levels corresponding to at least part of the pages in the example of the present application.

It should be noted that the difference between the first read voltage and the second read voltage may be less than the preset voltage. In some examples, the second read voltage is greater than the first read voltage, and the range of the difference between the first read voltage and the second read voltage is set to 5 mV to 20 mV, e.g., may be 5 mV, 10 mV, 15 mV, and 20 mV. In some other examples, the second read voltage is less than the first read voltage, and the range of the difference between the first read voltage and the second read voltage is set to –5 mV to –20 mV, e.g., may be –5 mV, –10 mV, –15 mV, and –20 mV.

It should be noted that the first read voltage and the second read voltage here are in sequence related, that is to say, the second read voltage is obtained in accordance with the first read voltage after a third adjustment. Based on this, the voltage difference between the first read voltage and the second read voltage is the step size of the third adjustment. The difference between the first read voltage and the second read voltage being less than the preset voltage may be understood that a smaller voltage difference exists between the first read voltage and the second read voltage. The preset voltage is related to the step size of the third adjustment, and may be a voltage slightly greater than the step size of the third adjustment. In some examples, the range of the preset voltage is set to 6 mV to 21 mV, e.g., the preset voltage may be 6 mV, 11 mV, 16 mV, and 21 mV. In some examples, the range of the preset voltage is set to –6 mV to –21 mV, e.g., the preset voltage may be –6 mV, –11 mV, –16 mV, and –21 mV. In some examples, the range of the preset voltage is set to –4 mV to –21 mV, e.g., the preset voltage may be –4 mV, –11 mV, –16 mV, and –21 mV.

It should be noted that the first read voltage and the second read voltage are both general concepts, and the target read voltage and all read voltages which are the target read voltages after a first adjustment and a second adjustment may be referred to as a first read voltage, and all read voltages obtained after making a third adjustment to the first read voltages may be referred to as a second read voltage. That is to say, the first read voltage is a general concept, which may be understood as the target read voltage or the target adjusted read voltage (the voltage obtained after making a first adjustment or a second adjustment to the target read voltage with the target step size; the range of the target step size may be set to 20 mV to 40 mV, e.g., the step size of the first adjustment may be 20 mV., 30 mV, 40 mV; the range of the target step size may also be set to 50 mV to 150 mV, e.g., the step size of the second adjustment may be 50 mV, 60 mV, 70 mV, 80 mV, 100 mV, 120 mV or 150 mV).

In examples of the present application, a corresponding first result at a voltage may be understood as: a third adjustment is made to a voltage, e.g., a first voltage difference $\Delta V1$ exists between the voltage and the voltage after the third adjustment, a number of bits of a preset number of memory cells flipped in two read results at the voltage and the voltage after the third adjustment may be taken as the corresponding first result at the voltage, where the preset number of memory cells may form at least one code word.

In one example, a corresponding first result at a first read voltage may be understood as: a third adjustment is made to the first read voltage, e.g., a first voltage difference $\Delta V1$ exists between the first read voltage and a second read voltage, a number of bits in a preset number of memory cells which are flipped in two read results at the first read voltage and the second read voltage may be taken as the corresponding first result at the first read voltage. The first read voltage may be the target read voltage in the first stage (V0 shown in FIG. 9D), and the second read voltage may be the read voltage after the third adjustment to the first read voltage (V1 shown in FIG. 9D); or the first read voltage may be the target adjusted read voltage in the first stage (V2 shown in FIG. 9D), and the second read voltage may be the read voltage after the third adjustment to the target adjusted read voltage (V3 shown in FIG. 9D).

In various examples of the present application, the obtaining of the target valley voltage may be understood as follows: determine a voltage as the target valley voltage in accordance with the corresponding first result at a voltage meeting a preset condition. For example, in accordance with the corresponding first result at the read voltage in the first stage being less than or equal to a second preset value, the read voltage in the first stage is determined as the target valley voltage in the first stage; the range of the second preset value is set to 5 to 30, in some examples, the second preset value may be 5, 10, 15, 20, 25, 30.

In various examples of the present application, obtaining the predicted valley voltage may be understood as follows: generating the predicted valley voltage in accordance with a voltage and a first mapping function. For example, the predicted valley voltage in the second stage is obtained in accordance with the predicted valley voltage in the first stage/the target valley voltage and a first mapping function of the first stage, and the first mapping function is to present the relationship between the predicted valley voltage in the first stage/the target valley voltage in the first stage and the predicted valley voltage in the second stage. Obtaining the predicted valley voltage may also be understood as follows: generating the predicted valley voltage in accordance with the corresponding first result at a voltage, the stage number in which a voltage is, and the second mapping function. For example, the predicted valley voltage in the first stage is generated in accordance with the corresponding first result at the target read voltage in the first stage, the stage number at which the first stage is, and the second mapping function; the second mapping function is to present the relationship between the corresponding first result at the target read voltage, the stage number at which each stage is, and the predicted valley voltage.

In various examples of the present application, the obtaining the adjusted voltage (e.g. the adjusted read voltage/the adjusted target read voltage) may be understood as: the voltage which is obtained after making an adjustment to a voltage with a target step size. For example, multiple first adjustments are made to the target read voltage with a first step size, and the target read voltage after the multiple first adjustments are obtained, respectively; or multiple second adjustments are made to the target read voltage with a step size, and the target read voltage after the multiple second adjustments are obtained.

In some examples, before obtaining the corresponding first result at the at least one code word at the target read voltage, the read mode of the memory device is set to a single level read (SLR) mode; the single-level read mode including reading at least one bit of the storage data stored in the memory cell through a one-level read voltage. In some examples, the memory device is configured to: enter a single-level read mode in response to a mode set command, and, in the single-level read mode, obtain a first result corresponding to at least one code word at the target read voltage.

It should be noted that the predicted valley voltage here may be directly taken as the target valley voltage to perform a read operation on the data to be read in accordance with the requirements, or to obtained the target valley voltage after further processing. The method of generating the predicted valley voltage will be further described later.

Here and below, taking the array of memory cells including a memory cell with a storage number of 3 bits as an example for detailed description, but this is not used to limit the examples of the present application. In some examples, as shown in FIGS. 9A, 9B, 9C, 9D, 9E and 9F, the number of storage bits of the memory cell of at least one code word is 3 bits, corresponding to the lower page, the middle page, and the upper page respectively; where each page corresponds to multiple stages, the multiple stages of the lower page include a first level and a fifth level, and the first-level read voltage L1 is less than the fifth-level read voltage L5; the multiple stages of the middle page include a second level, a fourth level and a sixth level, and the second-level read voltage L2 and the fourth-level read voltage L4 are both less than the sixth-level read voltage L6; the multiple stages of the upper page include a third level and a seventh level, and the third-level read voltage L3 is less than the seventh-level read voltage L7. Here, the fifth-level read voltage L5, the sixth-level read voltage L6, and the seventh-level read voltage L7 correspond to the read voltage in the first stage for the lower page, the middle page, and the upper page, respectively; and the first-level read voltage L1 corresponds to the read voltage in the second stage for the lower page, the second-level read voltage L2 and the fourth-level read voltage L4 correspond to the read voltages in the second stage for the middle page, and the third-level read voltage L3 corresponds to the read voltage in the second stage for the upper page.

In some examples, the target read voltage may be an empirical value (e.g., the read voltage corresponding to successful reading of data); or it may be default values configured when the memory device leaves the factory, the default value is obtained through extensive simulation experiments before the memory device leaves the factory; the default valley voltage may be the default values configured when the memory device leaves the factory, the default value is obtained through extensive simulation experiments before the memory device leaves the factory.

In some examples, the range of the absolute value of the difference between the initial first boundary voltage and the initial second boundary voltage (hereinafter briefly referred to as the initial absolute value) may be a first range, the first range is less than the absolute value of the difference between two adjacent default peak voltages (hereinafter briefly referred to as a second absolute value), and is greater than the absolute value of the difference between a valley voltage and an adjacent peak voltage (hereinafter briefly referred to as a first absolute value). The target read voltage is between the initial first boundary voltage and the initial second boundary voltage.

Figure 10A:
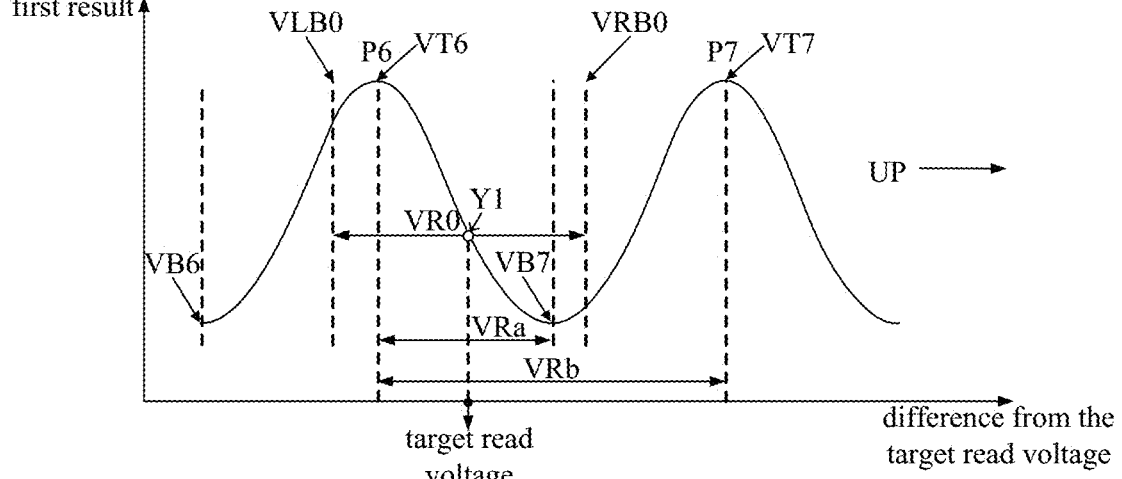
FIGS. 10A and 10B is schematic diagram 1 of a method for confirming the seventh-level read voltage corresponding to the upper page shown in FIG. 9C provided by an example of the present application.

In one example, as shown in FIG. 10A, the absolute value of the difference between the initial first boundary voltage VLB0 and the initial second boundary voltage VRB0 for the seventh-level target read voltage (the initial absolute value VR0 of the seventh-level target read voltage) may be less than or equal to the absolute value of the difference between the sixth-level default peak voltage VT6 and the seventh-level default peak voltage VT7, or may be greater than or equal to the absolute value of the difference between the sixth-level default peak voltage VT6 and the seventh-level default peak voltage VT7, that is, the initial absolute value VR0 is greater than or equal to the first absolute value VRa and less than or equal to the second absolute value VRb.

Figure 10B:
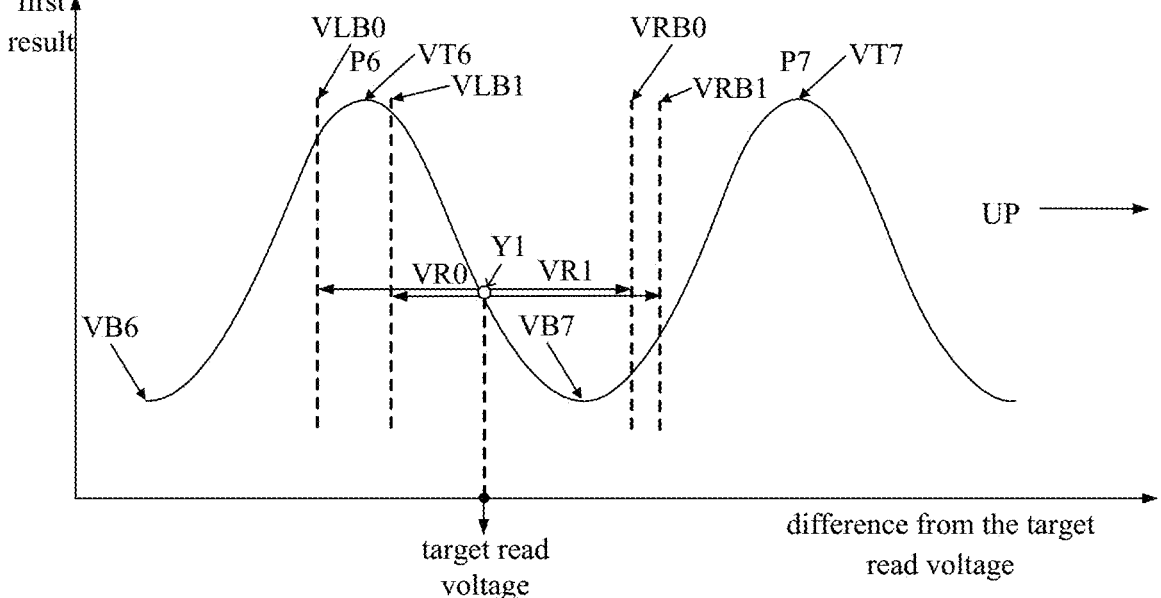
Figure 10C:
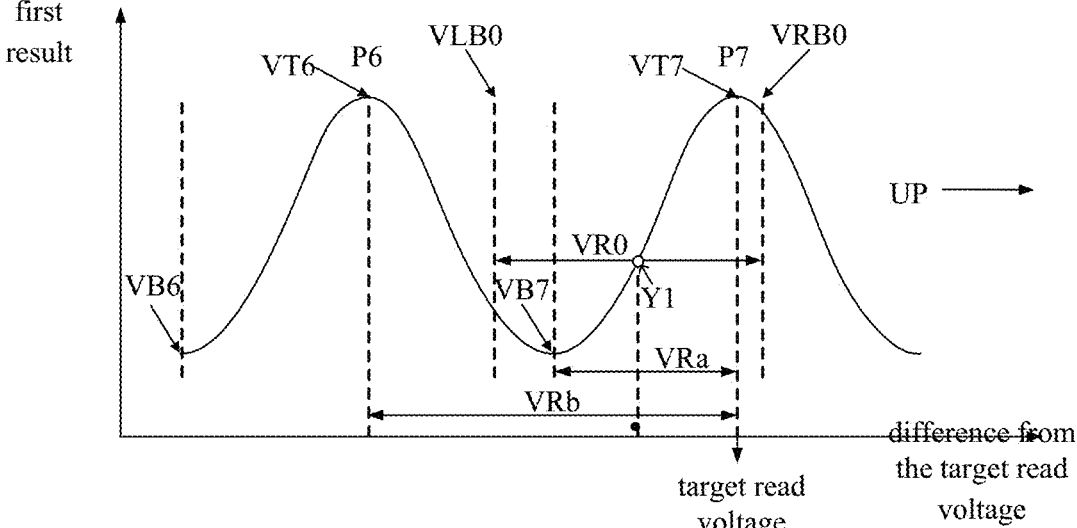
FIGS. 10C and 10D is a schematic diagram 2 of a method for confirming the seventh-level read voltage corresponding to the upper page shown in FIG. 9C provided by an example of the present application.

In one example, as shown in FIG. 10C, the initial absolute value VR0 of the seventh-level target read voltage may also be less than or equal to the absolute value of the difference between the sixth-level default peak voltage VT6 and the seventh-level default peak voltage VT7, or may be greater than or equal to the absolute value of the difference between the seventh-level default valley voltage VB7 and the seventh-level default peak voltage VT7, that is, the initial absolute value VR0 is greater than or equal to the first absolute value VRa and less than or equal to the second absolute value VRb.

In the present application, the term "corresponding first result at the target read voltage" may be briefly referred to as "first result for the first time", the term "the corresponding first result at the predicted valley voltage" may be briefly referred to as "predicted first result", and the term "corresponding first result at the default valley voltage" may be briefly referred to as "default first result".

In some examples, the absolute value of the difference between the first boundary voltage and the second boundary voltage (hereinafter briefly referred to as the target absolute value) is positively related to the degree of offset, and the degree of offset is the absolute value of the difference between the first result for the first time and the default first result.

Figure 10D:
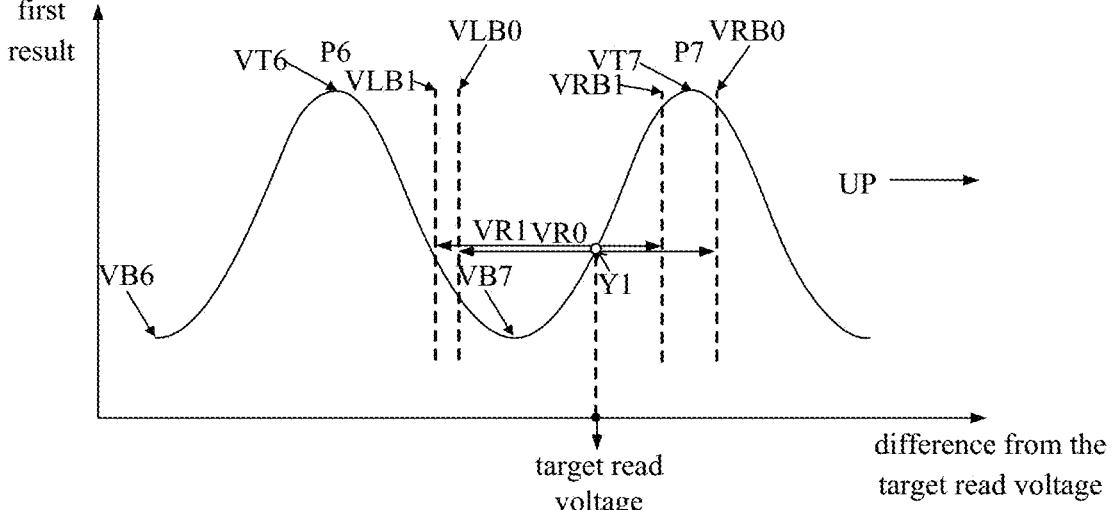
Figure 10E:
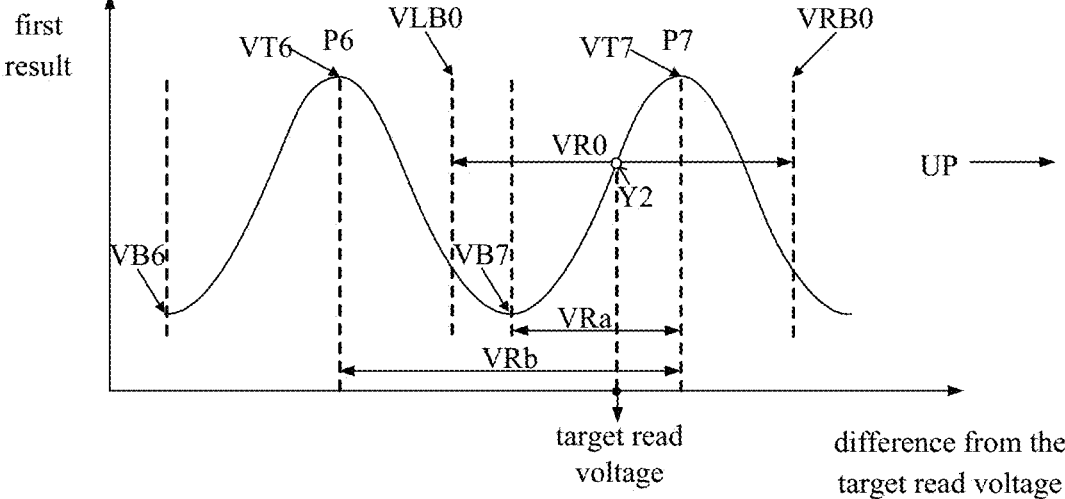
FIGS. 10E and 10F is a schematic diagram 3 of a method for confirming the seventh-level read voltage corresponding to the upper page shown in FIG. 9C provided by an example of the present application.
Figure 10F:
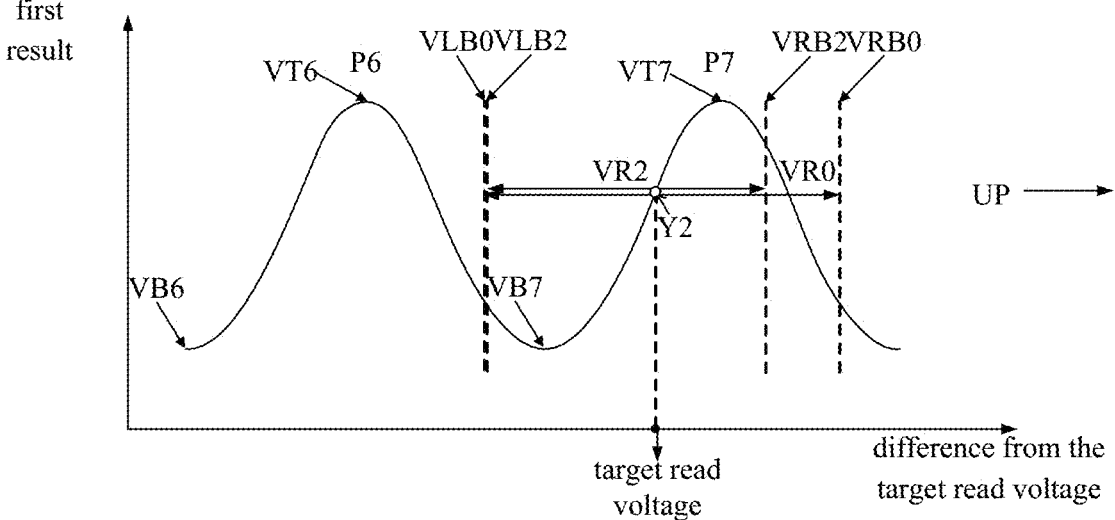

In one example, the greater the absolute value of the difference between the first result for the first time and the default first result, the greater the target absolute value. As shown in FIG. 10D, the difference between the first result for the first time and the default first result is less than the difference between the first result for the first time and the default first result in FIG. 10F, it may be obtained that the target absolute value VR1 as shown in FIG. 10D is less than the target absolute value VR2 as shown in FIG. 10F.

In some examples, the relationship between the first boundary voltage and the second boundary voltage, and the corresponding first result at the target read voltage includes the relationship between the initial first boundary voltage and the initial second boundary voltage, and the corresponding first result at the target read voltage, the relationship between the adjustment value for adjusting the initial first boundary voltage and the initial second boundary voltage for the target read voltage and the corresponding first result at the target read voltage, the first boundary voltage and the second boundary voltage for the target read voltage are generated in accordance with the initial first boundary voltage and the initial second boundary voltage and the adjustment value.

In some examples, the first mapping function is also used to represent the relationship between the level for the target read voltage and/or the usage scenario for the memory device (e.g., data retention scenario or read disturb scenario) and the corresponding first result at the target read voltage.

In one example, in a data retention scenario, as shown in FIGS. 10C and 10D, when the corresponding first result Y1 (e.g., 500) at the target read voltage at the seventh level exceeds the threshold (such as 400), it may be considered that the threshold voltage VT of the memory cell of the memory device is in a strong left-offset state in accordance with the characteristics of the memory device, in accordance with the corresponding first result Y1 at the seventh-level target read voltage, the first boundary voltage and the second boundary voltage for the target read voltage are generated in accordance with the initial first boundary voltage and the initial second boundary voltage for the target read voltages at the seventh level and the increased adjustment value; the adjustment value may include a first adjustment value and a second adjustment value, respectively used to adjust the initial first boundary voltage and the initial second boundary voltage. The first adjustment value and the second adjustment value may be negative values indicates that the adjustment direction is the left offset direction, and the absolute value of the first adjustment value may be less than the absolute value of the second adjustment value.

In one example, in a read disturb scenario, as shown in FIGS. 10A and 10B, when the corresponding first result Y1 (e.g., 400) at the target read voltage at the seventh level exceeds the threshold (such as 300), it may be considered that the threshold voltage VT of the memory cell of the memory device is in a strong right-offset state in accordance with the characteristics of the memory device, in accordance with the corresponding first result Y1 at the target read voltage at the seventh level, the first boundary voltage and the second boundary voltage for the target read voltage are generated in accordance with the initial first boundary voltage and the initial second boundary voltage for the target read voltage at the seventh level and the increased adjustment value; the adjustment value includes a first adjustment value and a second adjustment value, respectively used to adjust the initial first boundary voltage and the initial second boundary voltage, the first adjustment value and the second adjustment value being positive values indicates that the adjustment direction is the left offset direction, and the absolute value of the first adjustment value is greater than the absolute value of the second adjustment value.

For example, in accordance with the threshold voltage VT offset law of NAND under various conditions, a smaller left and right boundary (e.g., initial first boundary voltage {DMY, −5, −5, −8, −8, −12, −18, −20}, initial second boundary voltage {DMY, 10, 10, 5, 8, 8, 8,8}, unit: 10 mv) at the current level (e.g., the seventh level). In accordance with the corresponding first result at the target read voltage at the current level (e.g., the seventh level), the initial first boundary voltage and the initial second boundary voltage at the level (e.g., the seventh level) are adjusted (e.g., the offset value and movement direction are adjusted).

In some examples, in a data retention scenario: when the first result (e.g., 500) for the first time at the seventh level exceeds the threshold (such as 400), it may be considered that the threshold voltage VT of the memory cell is in a strong left-offset state in accordance with NAND characteristics, and the initial first boundary voltages and the initial second boundary voltages at the first level to the seventh level are readjusted to the first boundary voltages and the second boundary voltages at the first level to the seventh level (e.g., the first boundary voltage {DMY, −5, −2, −2, −14, −34, −42, −50}, the second boundary voltage {DMY, 5, 16, 5, 0, 0, 0, 0}, unit: 10 mv).

In some examples, in a read disturb scenario: when the first result (e.g., 400) for the first time at the first level exceeds the threshold (such as 300), it may be considered that the threshold voltage VT of the memory cell is in a strong right-offset state in accordance with NAND characteristics, and the initial first boundary voltage and the initial second boundary voltage at the first level are readjusted to the first boundary voltage and the second boundary voltage at the first level (e.g., the first boundary voltage at the first level L1 {0}, the second boundary voltage at the first level L1 {24}).

In some examples, in accordance with the threshold voltage VT offset law of NAND under various conditions, a greater left boundary and right boundary (e.g., less than the initial first boundary voltage {DMY, −5, −5, −8, −8, −12, −18, −20}, greater than the initial second boundary voltage {DMY, 10, 10, 5, 8, 8, 8, 8}, unit: 10 mv) at the current level (e.g., the first level), in accordance with the corresponding first result at the target read voltage at the current level (e.g., the seventh level), the initial first boundary voltage and the initial second boundary voltage at the level (e.g., the seventh level) are adjusted (e.g., the offset value and movement direction are adjusted) as a smaller left boundary and right boundary (e.g., less than the initial first boundary voltage {DMY, −5, −5, −8, −8, −12, −18, −20}, greater than the initial second boundary voltage {DMY, 10, 10, 5, 8, 8, 8, 8}, unit: 10 mv).

In some examples, the offset of the next point is predicted in accordance with the direction and step size of the initial offset, and if the predicted offset exceeds the left boundary and right boundary and the iteration has not yet converged at this point, search backward is performed from the boundaries until the target valley voltage location is found.

In some examples, the memory cell including multiple storage bits, and the multiple storage bits corresponding to read voltages in multiple stages; the peripheral circuit is configured to: obtain the initial first boundary voltage and the initial second boundary voltage corresponding to the target stage in the multiple stages; in accordance with a first result corresponding to at least one code word at a target read voltage in the target stage, performing an adjustment to the initial first boundary voltage and the initial second boundary voltage corresponding to the target stage to obtain a first boundary voltage and a second boundary corresponding to the target stage; determine the target valley voltage corresponding to the target stage in accordance with the corresponding first result at the adjusted target read voltage in the target stage meeting the preset condition.

It should be noted that, here and below, multiple stages include a first stage and a second stage, the first stage and the second stage are used to distinguish the high-level read voltage and the low-level read voltage in the read voltages in multiple stages corresponding to at least part of the pages, and the low-level read voltage is less than the high-level read voltage. For a memory cell containing multiple storage bits, a page corresponding to one storage bit may include one stage or multiple stages, and one stage may include one level or multiple levels.

In one example, referring to FIG. 8A, the memory device includes a lower page and an upper page, where the lower page corresponds to multiple stages, and the multiple stages of the lower page include a first level and a third level, the first-level read voltage L1 is less than the third-level read voltage L3. Here, the third-level read voltage L3 corresponds to the read voltage in the first stage for the lower page (the high-level read voltage in the lower page), and the first-level read voltage L1 corresponds to the read voltage in the second stage for the lower page (the low-level read voltage for the lower page).

In one example, referring to FIG. 8B, the memory device includes a lower page, a middle page and an upper page, where each page corresponds to multiple stages, the multiple stages of the lower page include a first level and a fifth level, and the first-level read voltage L1 is less than the fifth-level read voltage L5; the multiple stages of the middle page include a second level, a fourth level and a sixth level, and the second-level read voltage L2 and the fourth-level read voltage L4 are both less than the sixth-level read voltage L6; the multiple stages of the upper page include a third level and a seventh level, and the third-level read voltage L3 is less than the seventh-level read voltage L7. Here, the fifth-level read voltage L5, the sixth-level read voltage L6, and the seventh-level read voltage L7 correspond to the read voltages of the first stage the lower page, the middle page, and the upper page, respectively; and the first-level read voltage L1, the second-level read voltage L2, the fourth-level read voltage L4, and the third-level read voltage L3 correspond to the read voltage in the second stage for the lower page, the middle page, and the upper page, respectively.

Figure 10G:
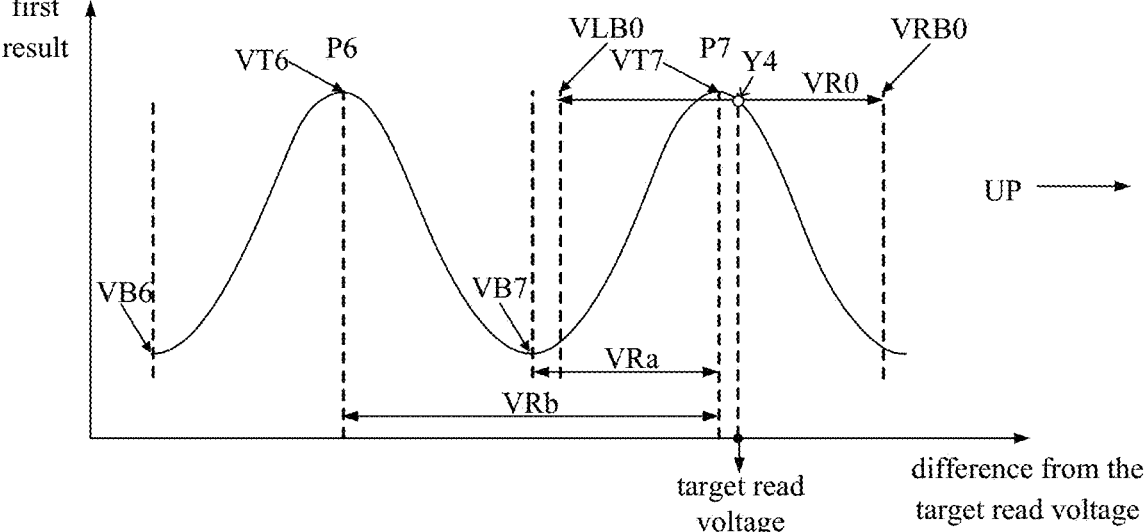
FIGS. 10G, 10H and 10I is a schematic diagram 4 of a method for confirming the seventh-level read voltage corresponding to the upper page shown in FIG. 9C provided by an example of the present application.
Figure 10H:
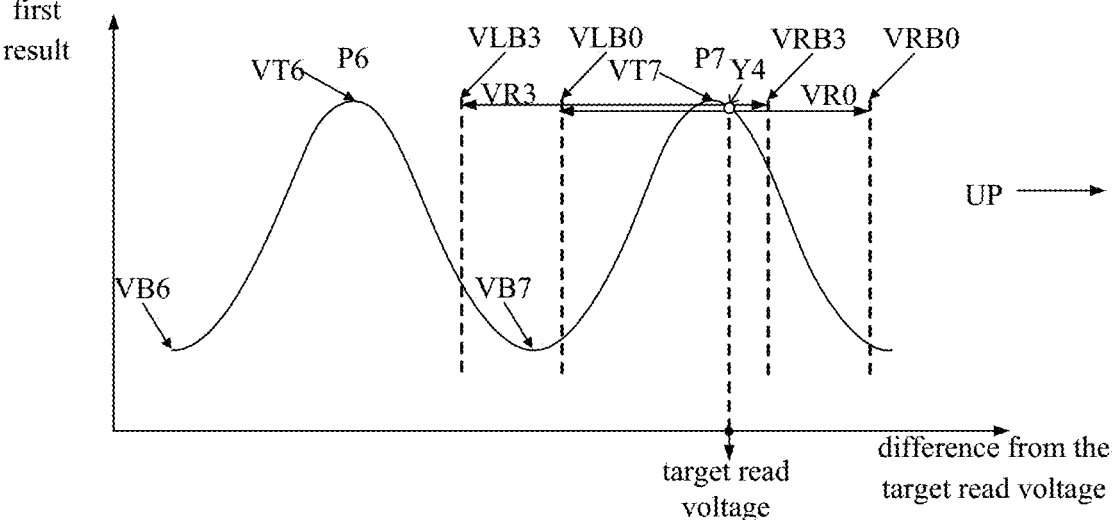
Figure 10I:
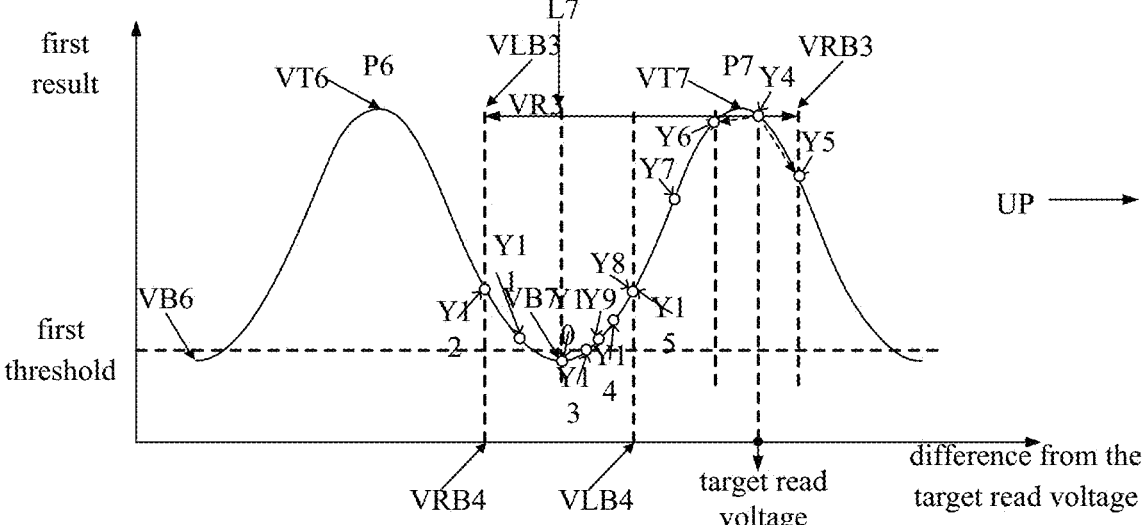

In one example, referring to FIG. 8C, the memory device includes a lower page, a middle page, an upper page and an extra page, where each page corresponds to multiple stages, the multiple stages of the lower page include a second level, an eighth level and a fourteenth level, the second-level read voltage L2 and the eighth-level read voltage L8 are both less than the fourteenth-level read voltage L14; the multiple stages of the middle page include a third level, a seventh level, a ninth level and a thirteenth level, the third-level read voltage L3, the seventh-level read voltage L7 and the ninth-level read voltage L9 are all less than the thirteenth level read voltage L13; the multiple stages of the upper page include a fifth level, a tenth level, a twelfth level and a fifteenth level, the fifth-level read voltage L5, the tenth-level read voltage L10 and the twelfth-level read voltage L12 are less than the fifteenth-level read voltage L15; the multiple stages of the extra page include a first level, a fourth level, a sixth level and a eleventh level, the first-level read voltage L1, the fourth-level read voltage L4, and the sixth-level read voltage L6 are less than the eleventh-level read voltage L11. Here, the fourteenth-level read voltage L14, the thirteenth-level read voltage L13, the fifteenth-level read voltage L15 and the eleventh-level read voltage L11 correspond to the read voltages in the first stage for the lower page, the middle page, the upper page and the extra page, respectively; and the second-level read voltage L2 and the eighth-level read voltage L8 correspond to the read voltage in the second stage for the lower page; the third-level read voltage L3, the seventh-level read voltage L7, and the ninth-level read voltage L9, correspond to the read voltage in the second stage for the middle page; the fifth-level read voltage L5, the tenth-level read voltage L10, and the twelfth-level read voltage L12 correspond to the read voltage in the second stage for the upper page; the first-level read voltage L1, the fourth-level read voltage L4, and the sixth-level read voltage L6 correspond to the read voltages in the second stage for the extra page. As shown in FIGS. 10G, 10H and 10I, in some examples, the peripheral circuit is configured to: obtain the initial first boundary voltage VLB0 and the initial second boundary voltage VRB0 for the target read voltage at the seventh level; in accordance with the first result Y4 corresponding to at least one code word at the target read voltage at the seventh level, adjust the initial first boundary voltage VLB0 and the initial second boundary voltage VRB0 for the target read voltage at the seventh level to obtain the first boundary voltage VLB3 and the second boundary voltage VRB3 for the target read voltage at the seventh level; make multiple adjustments to the target read voltage at the seventh level and obtain the corresponding first results (multiple first results Y5 to Y12) at the adjusted target read voltage after each adjustment; determine the target valley voltage at the seventh level (seventh-level read voltage L7) in accordance with the corresponding first result at the adjusted target read voltage is less than first threshold value; in a process of the adjustment, change a current direction of adjustment to the voltage in accordance with the target read voltage after one adjustment exceeding a range defined by the first boundary voltage VLB3 and the second boundary voltage VRB3.

For example, when the target read voltage after the first adjustment exceeds the range defined by the second boundary voltage VRB3, a current direction of adjustment to the voltage is changed.

In the first adjustment and the second adjustment, in the case of the second boundary voltage VRB3, although the first result Y5 corresponding to the target read voltage after the first adjustment is less than the first result Y6 corresponding to the target read voltage after the second adjustment, the target read voltage after the first adjustment exceeds the range defined by the second boundary voltage VRB3, a current direction of adjustment to the voltage is changed and the direction of the second adjustment is determined as the correct direction, and an adjustment to the left offset direction is continued by using the target read voltage after the second adjustment as the benchmark, after the adjustment to the left offset direction, it is closer to the valley location where the seventh-level read voltage L7 is located, and the seventh-level read voltage L7 may be determined subsequently.

It should be noted that, in the first adjustment and the second adjustment, in the case where the second boundary voltage VRB3 does not exist or is not considered, since the first result Y5 corresponding to the target read voltage after the first adjustment is less than the first result Y6 corresponding to the target read voltage after the second adjustment, in an adjustment after the first adjustment and the second adjustment, a current direction of adjustment to the voltage is changed and the direction of the first adjustment is determined as the correct direction, and an adjustment to the right offset direction is continued by using the target read voltage after the first adjustment as the benchmark, after the adjustment to the right offset direction, it is further away from the valley location where the seventh-level read voltage L7 is located, thus the seventh-level read voltage L7 cannot be determined or a wrong seventh-level read voltage L7 is determined subsequently.

In some examples, the range defined by the initial first boundary voltage and the initial second boundary voltage is smaller than the first preset range; the peripheral circuit is configured to: in accordance with a first result corresponding to at least one code word at a target read voltage in the target stage is greater than a first preset value, expand the range defined by the initial first boundary voltage and the initial second boundary voltage corresponding to the target stage to obtain a first boundary voltage and a second boundary corresponding to the target stage.

As shown in FIGS. 10G and 10H, in some examples, the peripheral circuit is configured to: in accordance with the absolute value of the difference between the initial first boundary voltage VLB0 and the initial second boundary voltage VRB0 at the seventh level (hereinafter briefly referred to as the initial absolute value VR0 at the seventh level) is less than the second absolute value VRb, and the first result Y4 corresponding to at least one code word at the target read voltage at the seventh level is greater than the first preset value (e.g., 400), the range defined by the initial first boundary voltage VLB0 and the initial second boundary voltage VRB0 at the seventh level is expanded to obtain the first boundary voltage VLB3 and the second boundary voltage VRB3 at the seventh level, the absolute value of the difference between the first boundary voltage VLB3 and the second boundary voltage VRB3 at the seventh level (hereinafter briefly referred to as the target absolute value VR3 at the seventh level) is greater than the initial absolute value VR0 at the seventh level.

In some examples, usage scenarios for the memory device include a first scenario and a second scenario; the peripheral circuit is configured to: based on the usage scenario for the memory device being a first scenario, expand the range defined by the initial first boundary voltage and the initial second boundary voltage corresponding to the target stage by the way of offsetting both of the initial first boundary voltage and the initial second boundary voltage corresponding to the target stage in a decreasing direction; based on the usage scenario for the memory device being a second scenario, expand the range defined by the initial first boundary voltage and the initial second boundary voltage corresponding to the target stage by the way of offsetting both of the initial first boundary voltage and the initial second boundary voltage corresponding to the target stage in an increasing direction.

In one example, in a data retention scenario, as shown in FIGS. 10G and 10H, when the corresponding first result Y4 (e.g., 500) at the target read voltage at the seventh level exceeds the threshold (such as 400), it may be considered that the threshold voltage VT of the memory cell of the memory device is in a strong left-offset state in accordance with the characteristics of the memory device, in accordance with the corresponding first result Y4 at the target read voltage at the seventh level, the first boundary voltage and the second boundary voltage for the target read voltage are generated in accordance with the initial first boundary voltage and the initial second boundary voltage for the target read voltage at the seventh level and the increased adjustment value; the adjustment value includes a first adjustment value and a second adjustment value, respectively used to adjust the initial first boundary voltage and the initial second boundary voltage, the first adjustment value and the second adjustment value being negative values indicates that the adjustment direction is the left offset direction, both the first adjustment value and the second adjustment value are negative values, and the target absolute value VR3 at the seventh level is greater than the initial absolute value VR0 at the seventh level.

Figure 10J:
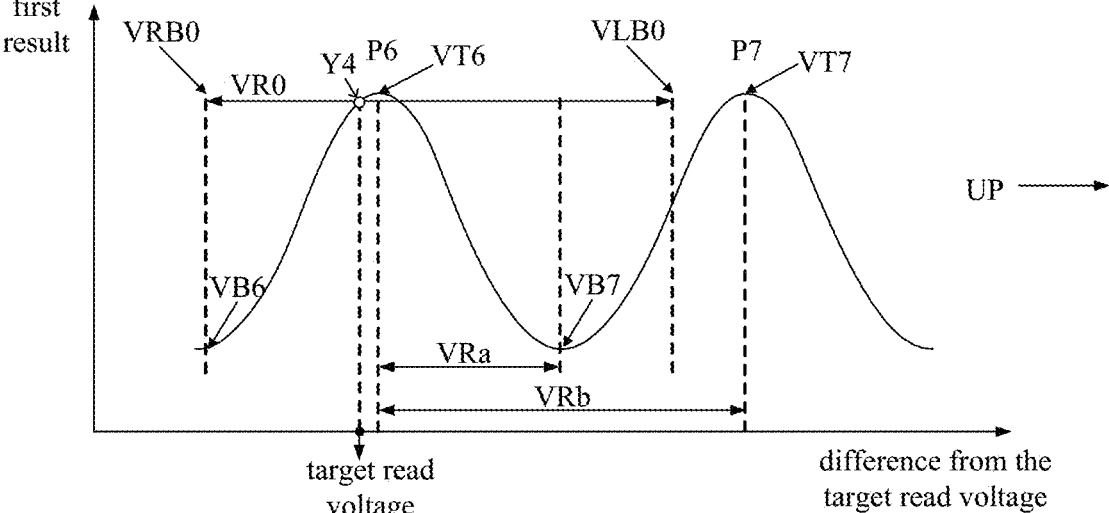
FIGS. 10J and 10K is schematic diagram 5 of a method for confirming the seventh-level read voltage corresponding to the upper page shown in FIG. 9C provided by an example of the present application.
Figure 10K:
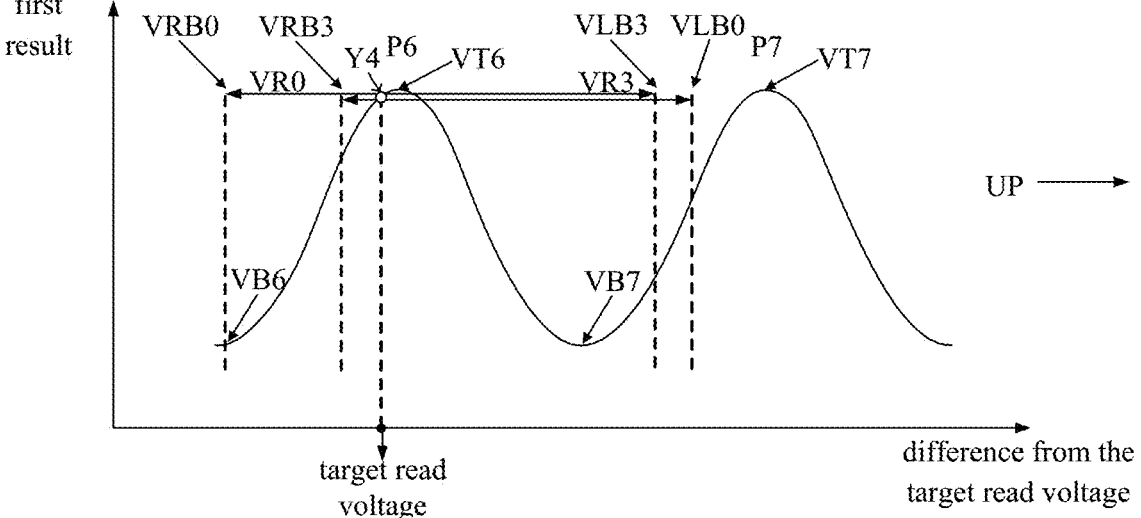

In one example, in a read disturb scenario, as shown in FIGS. 10J and 10K, when the corresponding first result Y4 (e.g., 400) at the target read voltage at the seventh level exceeds the threshold (such as 300), it may be considered that the threshold voltage VT of the memory cell of the memory device is in a strong right-offset state in accordance with the characteristics of the memory device, in accordance with the corresponding first result Y4 at the target read voltage at the seventh level, the first boundary voltage and the second boundary voltage for the target read voltage are generated in accordance with the initial first boundary voltage and the initial second boundary voltage for the target read voltage at the seventh level and the increased adjustment value; the adjustment value includes a first adjustment value and a second adjustment value, respectively used to adjust the initial first boundary voltage and the initial second boundary voltage, the first adjustment value and the second adjustment value being positive values indicates that the adjustment direction is the left offset direction, both the first adjustment value and the second adjustment value are positive values, and the target absolute value VR3 at the seventh level is greater than the initial absolute value VR0 at the seventh level.

In some examples, the range defined by the initial first boundary voltage and the initial second boundary voltage is larger than the second preset range; the peripheral circuit is configured to: in accordance with a first result corresponding to at least one code word at a target read voltage in the target stage is less than a second preset value, narrow the range defined by the initial first boundary voltage and the initial second boundary voltage corresponding to the target stage to obtain a first boundary voltage and a second boundary corresponding to the target stage.

Figure 10L:
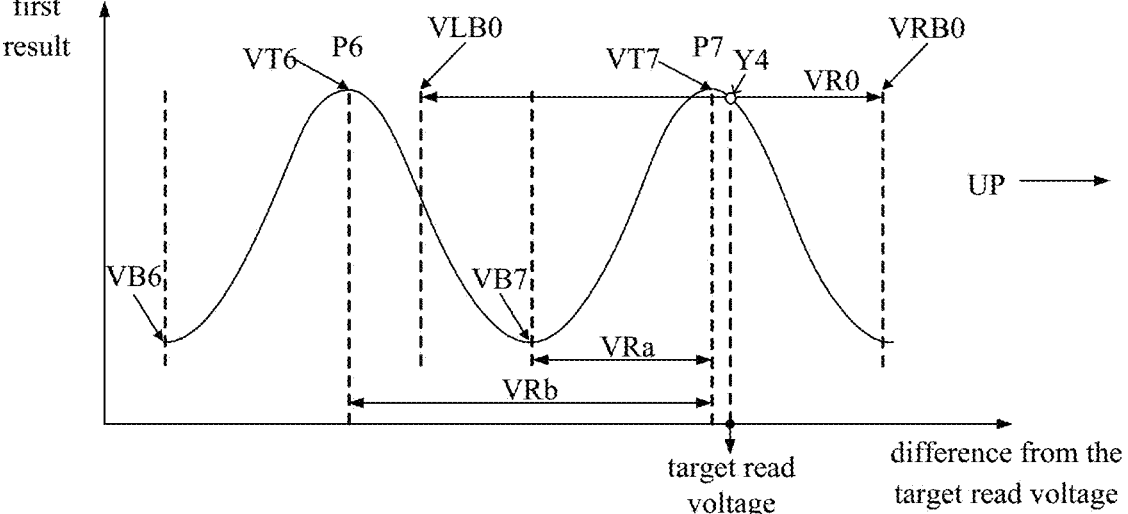
FIGS. 10L and 10M is a schematic diagram 6 of a method for confirming the seventh-level read voltage corresponding to the upper page shown in FIG. 9C provided by an example of the present application.
Figure 10M:
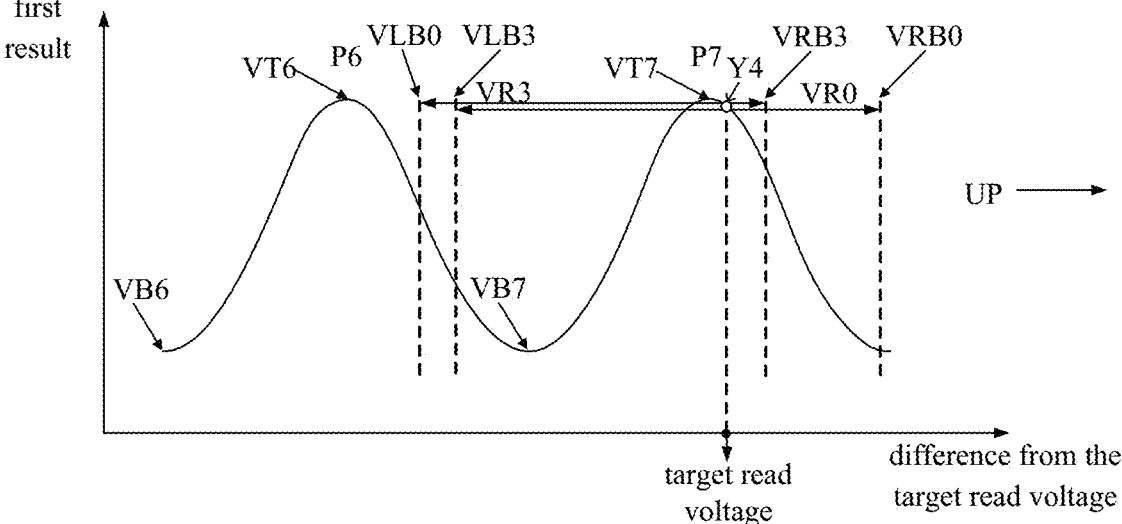

As shown in FIGS. 10L and 10M, in some examples, the peripheral circuit is configured to: in accordance with the absolute value of the difference between the initial first boundary voltage VLB0 and the initial second boundary voltage VRB0 at the seventh level (hereinafter briefly referred to as the initial absolute value VR0 at the seventh level) is greater than the second absolute value VRb, and the first result Y4 corresponding to at least one code word at the target read voltage at the seventh level is greater than the first preset value (e.g., 400), the range defined by the initial first boundary voltage VLB0 and the initial second boundary voltage VRB0 at the seventh level is narrowed down to obtain the first boundary voltage VLB3 and the second boundary voltage VRB3 at the seventh level, the absolute value of the difference between the first boundary voltage VLB3 and the second boundary voltage VRB3 at the seventh level (hereinafter briefly referred to as the target absolute value VR3 at the seventh level) is less than the initial absolute value VR0 at the seventh level.

In some examples, the peripheral circuit is configured to: make M first adjustments with a first step size to the target read voltage to be adjusted, and obtain M corresponding first results at the target read voltages after the M first adjustments respectively; take the minimum first result among the M first results as the knee-point value, and the read voltage corresponding to the knee-point value is the knee-point voltage; make N second adjustments to the knee-point voltage with a second step size, and obtain N corresponding first results at the target read voltages after the N second adjustments respectively; the second step size is less than the first step size; M and N are both positive integers greater than 1; and determine the target valley voltage in accordance with the corresponding first result at the obtained target read voltage after the N second adjustments meeting the preset condition.

Figure 10N:
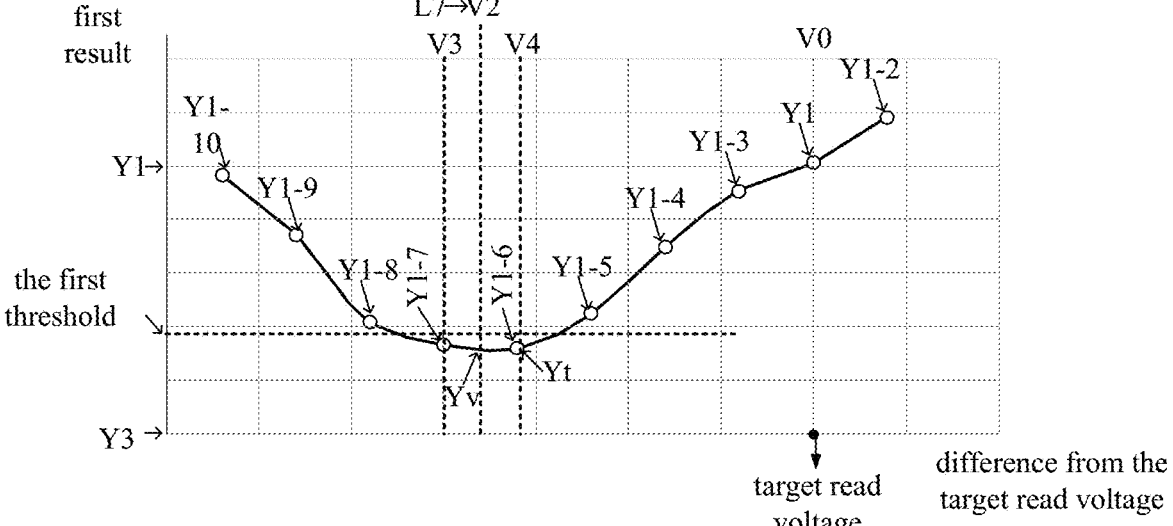
FIG. 10N is a schematic diagram 7 of a method for confirming the seventh-level read voltage corresponding to the upper page shown in FIG. 9C provided by an example of the present application.

In some examples, as shown in FIG. 10N, taking the target read voltage at the seventh level being the target read voltage as an example, the peripheral circuit is configured to obtain the knee-point voltage V4 through the following operations:

after obtaining the first result Y1 corresponding to the target read voltage, using the target read voltage as the benchmark, making a first adjustment to the target read voltage with the first step size value (positive value) for the first time to obtain the first result Y1-2, and making a first adjustment to the target read voltage with the first step size value (negative value) for the second time to obtain the first result Y1-3;

in accordance with the first result Y1-2 is greater than the first result Y1-1 and the first result Y1-3 is less than the first result Y1-1, it is determined to make multiple adjustments to the target read voltage with the first step size value (negative value) to obtain first results after the multiple adjustments (e.g., the first results Y1-4, Y1-5, Y1-6, Y1-7, or the first results Y1-4 to Y1-9, or the first results Y1-4 to Y1-10);

in accordance with at least one upward trend, determining to stop the first adjustment to the target read voltage; here, one upward trend may be understood as, if the first result Y1-(N+1) obtained by making a first adjustment to the target read voltage with the first step size value (negative value) for the N-th time is less than the first result Y1-(N+2) obtained by making a first adjustment to the target read voltage with the first step size value (negative value) for the (N+1)-th time, one upward trend is determined; e.g., if the first result Y7 is greater than the first result Y1-6, or the first result Y1-8 is greater than the first result Y1-7, or the first result Y1-9 is greater than the first result Y1-8, or the first result Y1-10 Greater than the first result Y1-9, one upward trend is determined;

determining the minimum value among the corresponding first results at the obtained read voltages after the multiple first adjustments as the knee-point value, and the target read voltage corresponding to the knee-point value is the knee-point voltage; e.g., the minimum value among multiple first results is the first result Y1-6, the first result Y1-6 is taken as the knee-point value Yt, and the target read voltage corresponding to the knee-point value Yt is the knee-point voltage V4.

As shown in FIG. 10N, in some examples, the corresponding first results at the target read voltage after multiple first adjustments include the first adjacent value and the second adjacent value adjacent to the knee-point value, and the peripheral circuit is configured to: in accordance with the difference between the first adjacent value and the knee-point value being less than the difference between the second adjacent value and the knee-point value, the range of the multiple second adjustments is limited to between the target read voltage corresponding to the first adjacent value and the knee-point voltage; and take the average of the read voltage and the knee-point voltage corresponding to the first adjacent value, and take the average as the target valley voltage in accordance with the corresponding first result at the average being less than the first threshold; in accordance with the corresponding first result at the average being greater than or equal to the first threshold, continue to perform the second adjustment between the read voltage corresponding to the first adjacent value and the knee-point voltage until the corresponding first result at the adjusted target read voltage is less than the first threshold.

In some examples, as shown in FIG. 10N, taking the target read voltage at the seventh level being the target read voltage as an example, the peripheral circuit is configured to: after obtaining the knee-point value Yt and the knee-point value V4, take the knee-point voltage V4 as the benchmark, make at least one second adjustment with the second step size to obtain the adjusted target read voltage. The detailed process of making at least one second adjustment with the second step size may be understood with reference to the detailed process of making at least one first adjustment with the first step size in the above example, where the first step size is greater than the second step size, which will not be repeated here.

Here, the absolute value of the first step size is greater than the absolute value of the second step size; in one example, the range of the first step size value is set to 50 mV to 150 mV, the value may be 50 mV, 60 mV, 70 mV, 80 mV, 100 mV, 120 mV or 150 mV; or the range of the first step size value is set to −50 mV to −150 mV, the value may be −50 mV, −60 mV, −70 mV, −80 mV, −100 mV, −120 mV or −150 mV. The second step size value range is set to 20 mV to 50 mV, the value may be 20 mV, 30 mV, 40 mV; or the second step size value range is set to −20 mV to −50 mV, the value may be −20 mV, −30 mV, −40 Mv, −50 mV.

In some examples, as shown in FIG. 10N, taking the target read voltage at the seventh level being the target read voltage as an example, the peripheral circuit is configured to: in accordance with the difference between the first adjacent value (first result Y1-7) and the knee-point value Yt (first result Y1-6) is less than the difference between the second adjacent value (first result Y1-5) and the knee-point value Yt, limit the range of the multiple second adjustments to be between the target read voltage V3 and the knee-point voltage V4 corresponding to the first adjacent value (first result Y1-7); and take the average of the read voltage V3 corresponding to the first adjacent value and the knee-point voltage V4, and in accordance with the corresponding first result Yv at the average being less than the first threshold, take the average as the target valley voltage V2 and determine the target valley voltage V2 as the seventh-level read voltage L7.

In some examples, the peripheral circuit is configured to: before making M first adjustments to the target read voltage to be adjusted, generate a first threshold in accordance with a first result corresponding to at least one code word at a target read voltage, the first threshold is to present the maximum among the corresponding first results at the read voltages near the target valley voltage; in accordance with the corresponding first result at the adjusted target read voltage being greater than or equal to the first threshold, generate the target read voltage after the next adjustment based on the corresponding first result at the target read voltage after the previous adjustment, until the corresponding first result at the adjusted target read voltage is less than the first threshold; and after the corresponding first result at the adjusted target read voltage is less than the first threshold, make M first adjustments with a first step size to the target read voltage to be adjusted.

In some examples, the peripheral circuit is configured to: take the predicted valley voltage in the first stage as the initial target read voltage; make at least one adjustment to the initial target read voltage, and obtain the corresponding first result at the adjusted target read voltage after each adjustment; determine the target valley voltage in accordance with the corresponding first result at the adjusted target read voltage meeting the preset condition; generate the predicted valley voltage in the second stage in accordance with the determined target valley voltage in the first stage; and perform a second read operation on at least one code word in accordance with the determined target valley voltage in the first stage and the predicted valley voltage in the second stage.

Figure 9A:
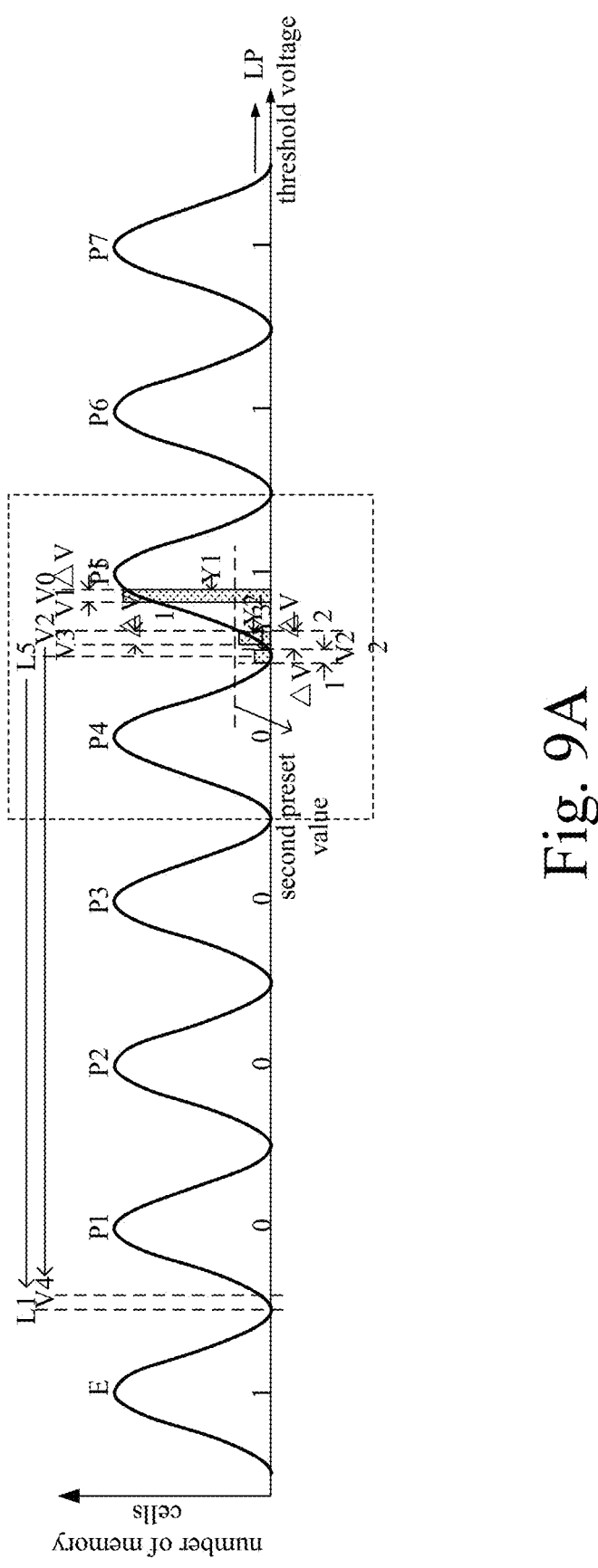
FIG. 9A is a schematic diagram of a method for confirming the predicted valley voltage/target valley voltage in a first stage and a second stage corresponding to the lower page shown in FIG. 8B provided by an example of the present application.

In one example, as shown in FIGS. 9A and 9D, peripheral circuit is configured to: take the predicted valley voltage at the fifth level (V2 shown in FIG. 9D) as the initial target read voltage at the fifth level; make at least one adjustment to the predicted valley voltage at the fifth level, and obtain the corresponding first result Y3 at the adjusted target read voltage (V22 shown in FIG. 9D) after each adjustment; determine the initial target read voltage at the fifth level to be the fifth-level read voltage L5 in accordance with the corresponding first result at the adjusted target read voltage is less than or equal to a second preset value. As shown in FIGS. 9B and 9E, FIGS. 9C and 9F, the sixth-level read voltage L6 and the seventh-level read voltage L7 are determined by using a method similar to determining the fifth-level read voltage L5.

Figure 9B:
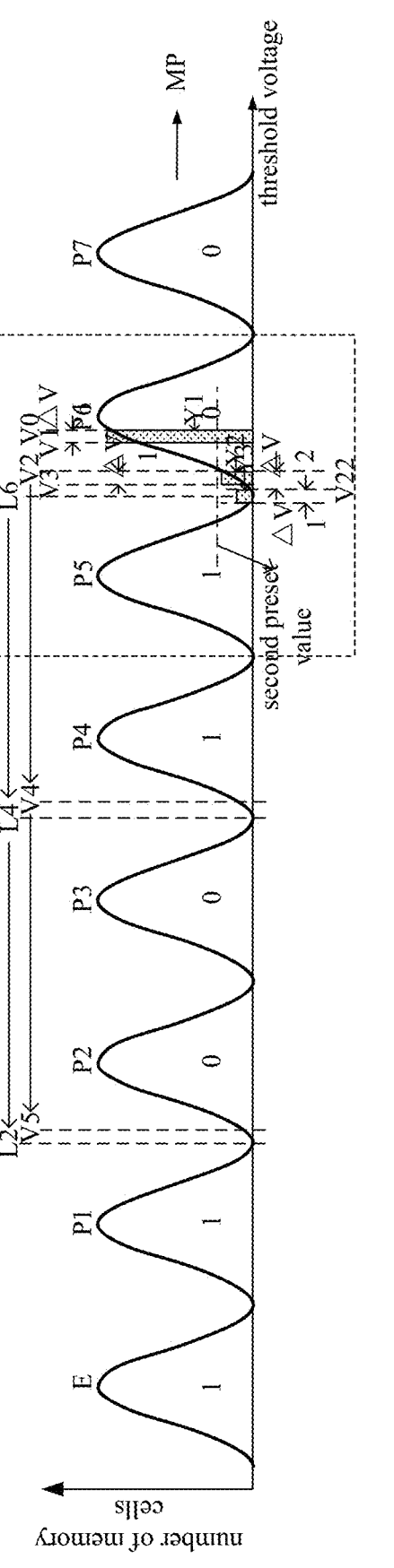
FIG. 9B is a schematic diagram of a method for confirming the predicted valley voltage/target valley voltage in a first stage and a second stage corresponding to the middle page shown in FIG. 8B provided by an example of the present application.
Figure 9C:
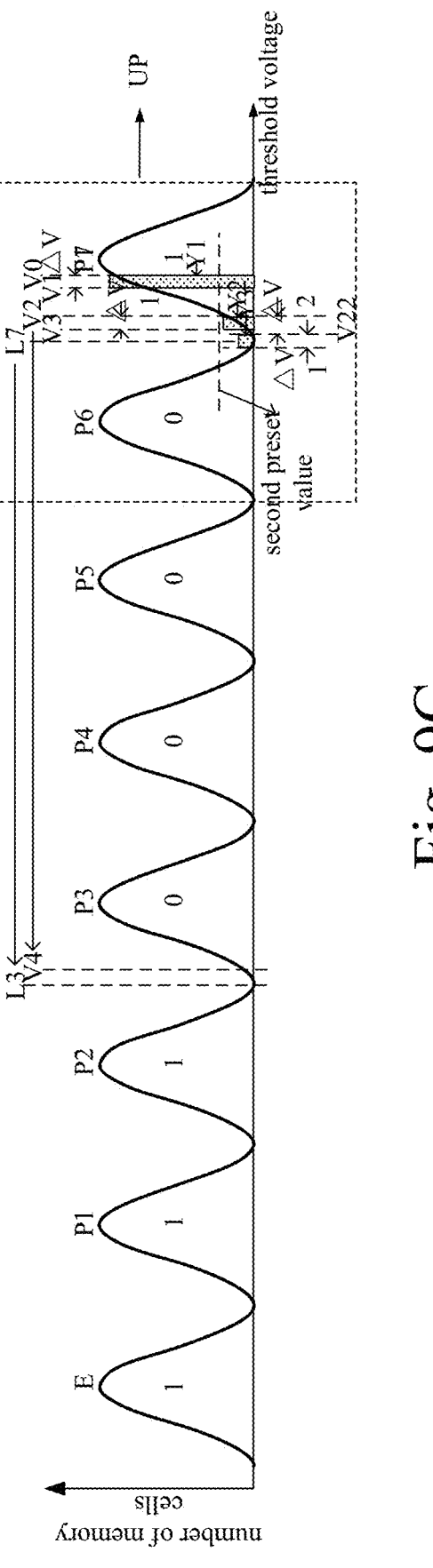
FIG. 9C is a schematic diagram of a method for confirming the predicted valley voltage/target valley voltage in a first stage and a second stage corresponding to the upper page shown in FIG. 8B provided by an example of the present application.
Figure 9:
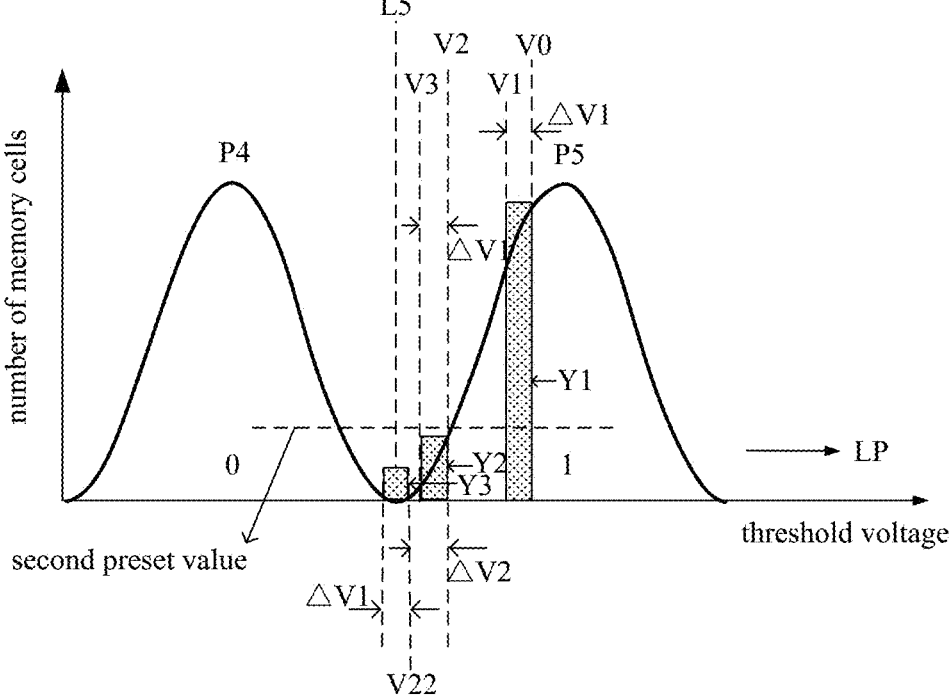
FIG. 9D is an enlarged schematic diagram of the rectangular dotted frame area of FIG. 9A.
FIG. 9E is an enlarged schematic diagram of the rectangular dotted frame area of FIG. 9B.
FIG. 9F is an enlarged schematic diagram of the rectangular dotted frame area of FIG. 9C.

A second read operation is performed on the lower page of at least one code word in accordance with determining the fifth-level read voltage L5 and the predicted valley voltage at the first level (V4 shown in FIG. 9A), a second read operation is performed on the middle page of at least one code word in accordance with determining the sixth-level read voltage L6, the predicted valley voltage at the fourth level (V4 shown in FIG. 9A) and the predicted valley voltage at the second level (V5 shown in FIG. 9B); a second read operation is performed on the upper page of at least one code word in accordance with determining the seventh-level read voltage L7 and the predicted valley voltage at the third level (V4 shown in FIG. 9C).

In some examples, peripheral circuit is configured to: generate the predicted valley voltage in a second stage which is the highest read voltage among read voltages in the multiple second stages for each of the pages in accordance with the predicted valley voltage in the first stage/the target valley voltage in the first stage for each of the pages; and generate the predicted valley voltage in a second stage which is a lower read voltage than an adjacent read voltage, in accordance with the predicted valley voltage in a second stage which is a higher read voltage among read voltages in the multiple second stages for each of the pages in sequence, until the predicted valley voltage in each second stage for each of the pages is generated.

Figure 9E:
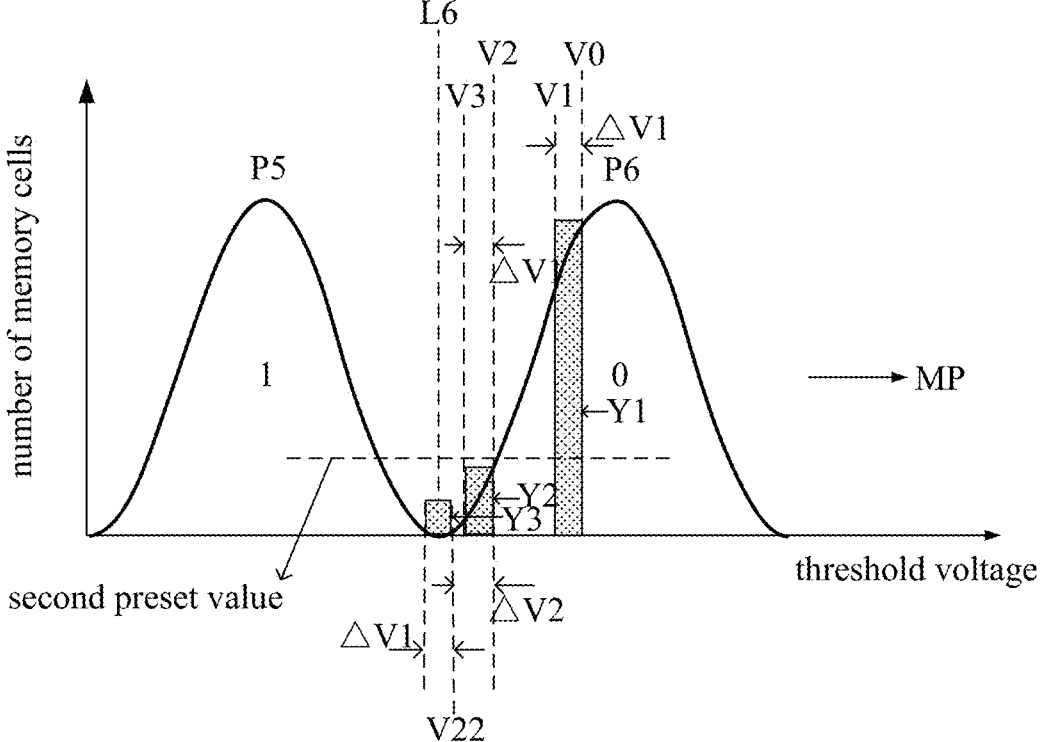
Figure 9F:
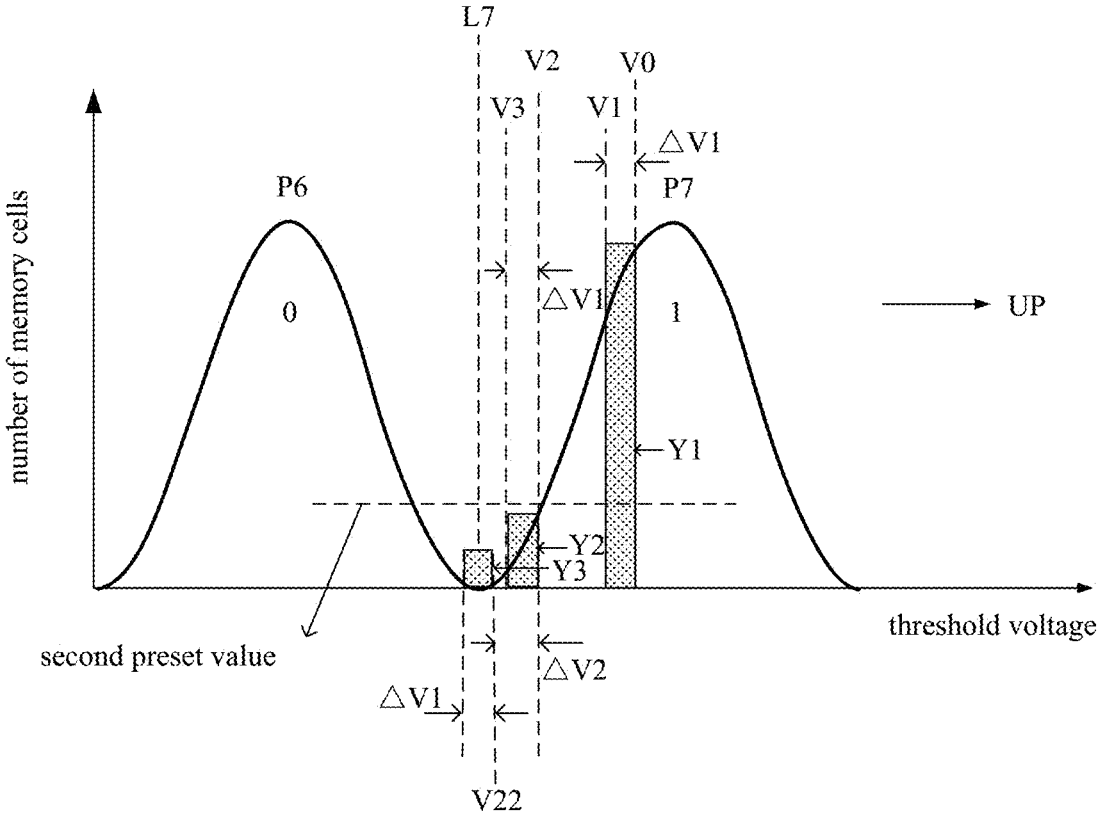

In one example, as shown in FIGS. 9B and 9E, a middle page contains a first stage (e.g., a sixth level) and multiple second stages (e.g., a fourth level and a second level); the peripheral circuit is configured to: generate the predicted valley voltage at the fourth level for the middle page in accordance with the predicted valley voltage at the sixth level for the middle page/determined target valley voltage at the sixth level; generate the predicted valley voltage at the second level for the middle page in accordance with the predicted valley voltage at the fourth level for the middle page. As shown in FIGS. 9A and 9D, the predicted valley voltage at the first level for the lower page is generated in accordance with the predicted valley voltage at the fifth level for the lower page/determined target valley voltage at the fifth level. As shown in FIGS. 9C and 9F, the predicted valley voltage at the third level for the upper page is generated in accordance with the predicted valley voltage at the seventh level for the upper page/determined target valley voltage at the seventh level.

In some examples, in the scenario of a QLC type memory cell, the number of storage bits of the memory cell includes four bits, the corresponding storage states include the 0th state to the 15th state, and the four storage bits corresponding to the 16 states are stored in a lower page, a middle page, an upper page, and an extra page respectively; a lower page contains one first stage (e.g., a fourteenth level) and multiple second stages (e.g., an eighth level and a second level); a middle page contains one first stage (e.g., a thirteenth level) and multiple second stages (e.g., the ninth level, the seventh level, and the third level); an upper page contains one first stage (e.g., a fifteenth level) and multiple second stages (e.g., a twelfth level, a tenth level and a fifth level); an extra page contains one first stage (e.g., an eleventh level) and multiple second stages (e.g., a sixth level, a fourth level and a first level).

In some implementations, the peripheral circuit is configured to: generate the predicted valley voltage at the eighth level for the lower page in accordance with the predicted valley voltage at the fourteenth level for the lower page/determined target valley voltage at the fourteenth level, generate the predicted valley voltage at the second level for the lower page in accordance with the predicted valley voltage at the eighth level for the lower page; generate the predicted valley voltage at the ninth level for the middle page in accordance with the predicted valley voltage at the thirteenth level for the middle page/determined target valley voltage at the thirteenth level, generate the predicted valley voltage at the seventh level for the middle page in accordance with the predicted valley voltage at the ninth level for the middle page, generate the predicted valley voltage at the third level for the middle page in accordance with the predicted valley voltage at the seventh level for the middle page; generate the predicted valley voltage at the twelfth level for the upper page in accordance with the predicted valley voltage at the fifteenth level for the upper page/determined target valley voltage at the fifteenth level, generate the predicted valley voltage at the tenth level for the upper page in accordance with the predicted valley voltage at the twelfth level for the upper page, generate the predicted valley voltage at the fifth level for the upper page in accordance with the predicted valley voltage at the tenth level for the upper page; generate the predicted valley voltage at the sixth level for the extra page in accordance with the predicted valley voltage at the eleventh level for the extra page/determined target valley voltage at the eleventh level, generate the predicted valley voltage at the fourth level for the extra page in accordance with the predicted valley voltage at the sixth level for the extra page, generate the predicted valley voltage at the first level for the extra page in accordance with the predicted valley voltage at the fourth level for the extra page. In this way, the 15 voltages required to read the QLC type memory cell are generated, e.g., the 15 voltages are the 15 predicted valley voltages, or a part of the 15 voltages is the target valley voltage, and the other part is the predicted valley voltage generated in accordance with the target valley voltage.

In some examples, the first boundary voltage is less than the second boundary voltage, peripheral circuit is configured to: in accordance with the generated target read voltage after the next adjustment being less than or equal to a first boundary voltage, starting from the first boundary voltage, adjust the target read voltage in an increasing direction; or, in accordance with the generated target read voltage after the next adjustment being greater than or equal to the second boundary voltage, starting from the second boundary voltage, adjust the read voltage in a decreasing direction.

As shown in FIG. 10I, when the target read voltage after the first adjustment exceeds the first boundary voltage VLB3 or the range defined by the second boundary voltage VRB3, a current direction of adjustment to the voltage is changed.

In the first adjustment and the second adjustment, in the case of the second boundary voltage VRB3, although the first result Y5 corresponding to the target read voltage after the first adjustment is less than the first result Y6 corresponding to the target read voltage after the second adjustment, the target read voltage after the first adjustment exceeds the range defined by the second boundary voltage VRB3, a current direction of adjustment to the voltage is changed and the direction of the second adjustment is determined to be the correct direction, and an adjustment to the left offset direction is continued by using the target read voltage after the second adjustment as the benchmark, after the adjustment to the left offset direction, it is closer to the valley location where the seventh-level read voltage L7 is located, and the seventh-level read voltage L7 may be determined subsequently.

In the seventh adjustment and the eighth adjustment, in the case of the first boundary voltage VLB3, the target read voltage after the eighth adjustment exceeds the range defined by the first boundary voltage VLB3, a current direction of adjustment to the voltage is changed and the opposite direction of the direction of the eighth adjustment is determined as the correct direction, and an adjustment to the right offset direction is performed by using the first boundary voltage VLB3 as the benchmark, after the adjustment to the right offset direction, it is closer to the valley location where the seventh-level read voltage L7 is located, and the seventh-level read voltage L7 may be determined subsequently.

In some examples, the peripheral circuit is configured to: take, as a near-valley voltage, the adjusted target read voltage corresponding to the first result that is less than the first threshold for the first time among multiple corresponding first results at target read voltages after multiple adjustments; in the process of making multiple first adjustments to the near-valley voltage with a first step size, starting from the near-valley voltage, adjust with the first step size until the corresponding first result at the adjusted target read voltage in the first direction is greater than the first threshold; starting from the near-valley voltage, make adjustments in a second direction opposite to the first direction with the first step size until the corresponding first result at the adjusted target read voltage in the second direction is greater than the first threshold.

In some examples, the peripheral circuit is configured to: generate a first threshold in accordance with the corresponding first result at the target read voltage and the first mapping function; the first mapping function is to present the relationship between the first threshold and the corresponding first result at the target read voltage; generate a predicted value of the target read voltage after the next adjustment in accordance with the corresponding first result at the target read voltage after the previous adjustment and the second mapping function, and the stage number at which the target stage is; the second mapping function is to present the relationship between the corresponding first result at the target read voltage after the previous adjustment, the stage number at which the target stage is and the predicted value of the target valley voltage in the target stage.

In some examples, the first mapping function is to present the relationship between the difference of the predicted valley voltage in a first stage/the target valley voltage in a first stage relative to the target read voltage in a first stage, and the predicted valley voltage in a second stage, and/or the relationship between memory device usage scenario and the corresponding first result at the target read voltage.

In one example, in a data retention scenario, when the difference between the predicted valley voltage in the first stage/the target valley voltage in the first stage and the target read voltage in the first stage exceeds a threshold, it may be considered that the threshold voltage VT of the memory cell of the memory device is in a strong left-offset state in accordance with the characteristics of the memory device, in accordance with the difference of the predicted valley voltage in the first stage/the target valley voltage in the first stage and the predicted valley voltage in the first stage/the target valley voltage in the first stage relative to the target read voltage, it may be adjusted to obtain the predicted valley voltage in the second stage based on the first mapping function, where the predicted valley voltage in the second stage is in a strong left-offset state relative to the target read voltage in the second stage.

In one example, in a read operation interference scenario, when the difference between the predicted valley voltage in the first stage/the target valley voltage in the first stage and the target read voltage exceeds a threshold, it may be preferentially considered that the threshold voltage VT of the memory cell of the memory device is in a strong right-offset state in accordance with the characteristics of the memory device, in accordance with the difference of the predicted valley voltage in the first stage/the target valley voltage in the first stage and the predicted valley voltage in the first stage/the target valley voltage in the first stage relative to the target read voltage, it may be adjusted to obtain the predicted valley voltage in the second stage based on the first mapping function.

In some examples, the predicted valley voltage in the first stage may refer to the predicted read voltage after a prediction in accordance with the corresponding first result at the target read voltage in the first stage and usage scenario for the memory device. Among them, the predicted valley voltage in the first stage is obtained by querying the preset mapping table in accordance with the first result (here refers to the corresponding first result at the target read voltage in the first stage), the preset mapping table stores the empirical value of the predicted valley voltage in the first stage corresponding to the first result, and these empirical values are obtained through a large number of simulation experiments.

In some examples, the second mapping function is to present the relationship between the difference of the corresponding first result at the target read voltage in the first stage relative to the first result threshold configured when the memory device leaves the factory, and the predicted valley voltage in the first stage, the stage number at which the predicted valley voltage in the first stage is at, and/or the relationship between and memory device usage scenario and the predicted valley voltage in the first stage.

In one example, in a data retention scenario, when the corresponding first result at the target read voltage in the first stage exceeds the threshold (such as 400), it may be considered that the threshold voltage VT of the memory cell of the memory device is in a strong left-offset state in accordance with the characteristics of the memory device, in accordance with the corresponding first result at the target read voltage in the first stage, it may be adjusted to obtain the predicted valley voltage in the first stage based on the second mapping function, where the predicted valley voltage in the first stage is in a strong left-offset state relative to the target read voltage in the first stage.

In one example, in a read operation interference scenario, when the corresponding first result at the target read voltage in the first stage exceeds the threshold (such as 300), it may be considered that the threshold voltage VT of the memory cell of the memory device is in a strong left-offset state in accordance with the characteristics of the memory device, in accordance with the corresponding first result at the target read voltage in the first stage, it may be adjusted to obtain the predicted valley voltage in the first stage based on the second mapping function, where the predicted valley voltage in the first stage is in a strong left-offset state relative to the target read voltage in the first stage.

In some examples, the peripheral circuit is configured to: in the process of making N second adjustments to the knee-point voltage with the second step size, starting from the knee-point voltage, make adjustments in two opposite directions with the second step size, in the process of making adjustments in each direction, count one for upward trend when the corresponding first result at the target read voltage after the next adjustment is greater than the corresponding first result at the target read voltage after the previous adjustment, and determine the third boundary voltage and the fourth boundary voltage in accordance with a total counted number being greater than or equal to a preset number; in the process of making adjustments in each direction, if the corresponding first result at the target read voltage after one adjustment is lower than the second threshold, or taking the minimum first result among multiple corresponding first results at the target read voltages after multiple adjustments as a reference value, when the number of first results from remaining first results which differ from the reference value with a difference being less than a third threshold is greater than a preset number, stop the adjustments and take, as the target valley voltage, the read voltage corresponding to the minimum first result among the multiple first results.

As shown in FIG. 10I, in the seventh adjustment and the eighth adjustment, in the case of the first boundary voltage VLB3, the target read voltage after the eighth adjustment exceeds the range defined by the first boundary voltage VLB3, the first boundary voltage VLB3 is determined as the third boundary voltage VLB4, a current direction of adjustment to the voltage is changed and the opposite direction of the direction of the eighth adjustment is determined as the correct direction, and an adjustment to the right offset direction is performed by using the voltage before the seventh adjustment as the benchmark, an upward trend is determined through the ninth, tenth, and eleventh adjustments, the voltage after the eleventh adjustment is determined as the fourth boundary voltage VRB4, among the multiple adjustments between the third boundary voltage VLB4 and the fourth boundary voltage VRB4, if the corresponding first result at the target read voltage after one adjustment is lower than the second threshold, or taking the minimum first result among multiple corresponding first results at the target read voltages after multiple adjustments as a reference value, when the number of first results from remaining first results which differ from the reference value with a difference being less than a third threshold is greater than a preset number, stop the adjustments and take, as the target valley voltage, the read voltage corresponding to the minimum first result among the multiple first results.

As shown in FIG. 10I, in one example, the voltage before the seventh adjustment is adjacent to the voltage after the seventh adjustment and the voltage before the sixth adjustment, the average of the voltage after the seventh adjustment and the voltage before the sixth adjustment may be taken as the seventh-level read voltage L7.

In some examples, the peripheral circuit is configured to: in the process of making adjustments in each direction, take the corresponding adjusted target read voltages as the third voltage boundary and the fourth voltage boundary respectively in accordance with the total counted number being equal to the preset number; in the process of making adjustments in each direction, if the third boundary voltage and the fourth boundary voltage have been determined, obtain the corresponding first result at the read voltage after the last adjustment, the read voltage after the last adjustment is the average of the third boundary voltage and the fourth boundary voltage; take, as the target valley voltage, the read voltage corresponding to the minimum first result among the multiple corresponding first results at all the adjusted target read voltages.

In some examples, the array of memory cells includes memory cells with multiple storage bits, and the multiple storage bits correspond to multiple pages respectively; at least part of the pages corresponding to multiple stages, the multiple stages including the first stage and the second stage, and the read voltage in the second stage is less than the read voltage in the first stage; The peripheral circuit is configured to: generate a target valley voltage in the second stage of the multiple stages and/or a target valley voltage in other first stage corresponding to a lower read voltage with the determined target valley voltage in accordance with a target valley voltage in the first stage to which the stage number corresponding to the determined target valley voltage belonging.

In some examples, the peripheral circuit is configured to: take both the predicted valley voltage in the first stage and the predicted valley voltage in the second stage as the initial target read voltage; obtain the corresponding first result at the initial target read voltage; determine the initial target read voltage as the target valley voltage in accordance with the corresponding first result at the initial target read voltage meeting a preset condition; and perform a second read operation on at least one code word in accordance with the target valley voltage.

In some examples, the preset condition may be that the corresponding first result at the initial target read voltage is less than or equal to a second preset value; and the second preset value is taken as the determination threshold for determining the target valley voltage, that is, when the first result is less than or equal to the second preset value, it indicates that the error rate of the read result is low and the reliability of the read result is high when the read voltage corresponding to the first result is the target valley voltage. Here, the magnitude of the second preset value is related to the type of memory device, storage density, etc. The second preset value may be an empirical value, or it may be default values configured when the memory device leaves the factory, the default value is obtained through extensive simulation experiments before the memory device leaves the factory. In one example, the range of the second preset value is set to 5 to 30, and in some examples, the second preset value may be 5, 10, 15, 20, 25, 30.

In one example, as shown in FIGS. 9A and 9D, peripheral circuit is configured to: take the predicted valley voltage at the fifth level (V2 shown in FIG. 9D) as the initial target read voltage at the fifth level; obtain the first result Y2 corresponding to the initial target read voltage at the fifth level; determine initial target read voltage at the fifth level as the fifth-level read voltage L5 in accordance with the corresponding first result Y2 at the initial target read voltage at the fifth level is less than or equal to a second preset value. The first-level read voltage L1 is determined in a similar way as determining the fifth-level read voltage L5.

In one example, as shown in FIGS. 9B and 9E, peripheral circuit is configured to: take the predicted valley voltage at the sixth level (V2 shown in FIG. 9E) as the initial target read voltage at the sixth level; obtain the first result Y2 corresponding to the initial target read voltage at the sixth level; determine initial target read voltage at the sixth level as the sixth-level read voltage L6 in accordance with the corresponding first result Y2 at the initial target read voltage at the sixth level is less than or equal to a second preset value. The fourth-level read voltage LA and the second-level read voltage L2 are determined in a similar way as determining the sixth-level read voltage L6.

In one example, as shown in FIGS. 9C and 9F, peripheral circuit is configured to: take the predicted valley voltage at the seventh level (V2 shown in FIG. 9F) as the initial target read voltage at the seventh level; obtain the first result Y2 corresponding to the initial target read voltage at the seventh level; determine initial target read voltage at the seventh level as the seventh-level read voltage L7 in accordance with the corresponding first result Y2 at the initial target read voltage at the seventh level is less than or equal to a second preset value. The third-level read voltage L3 is determined in a similar way as determining the seventh-level read voltage L7.

A second read operation is performed on the lower page of at least one code word in accordance with the determined fifth-level read voltage L5 and the determined first-level read voltage L1; a second read operation is performed on the middle page of at least one code word in accordance with the determined sixth-level read voltage L6 and the determined fourth-level read voltage L4; a second read operation is performed on the upper page of at least one code word in accordance with the determined seventh-level read voltage L7 and the determined third-level read voltage L3.

In some examples, the peripheral circuit is configured to: take the predicted valley voltage in the first stage and the predicted valley voltage in the second stage as the initial target read voltage; make at least one adjustment to the initial target read voltage, and obtain the corresponding first result at the adjusted target read voltage after each adjustment; determine the adjusted target read voltage as the target valley voltage in accordance with the corresponding first result at the adjusted target read voltage meeting a preset condition; and performing a second read operation on at least one code word in accordance with the target valley voltage.

In some examples, at least one adjustment may be a first adjustment; the first adjustment may be understood as an adjustment with a relatively large amplitude, and the amplitude of the first adjustment is greater than the amplitude of a second adjustment. In some examples, the range of the step size of the first adjustment is set to 50 mV to 150 mV, e.g., the step size of the first adjustment may be 50 mV, 60 mV, 70 mV, 80 mV, 100 mV, 120 mV or 150 mV. In one example, as shown in 9A and FIG. 10, a first adjustment is made to the predicted valley voltage V2 at the fifth level to obtain the target read voltage V22 at the fifth level after the adjustment, a second voltage difference ΔV2 exists between the predicted valley voltage V2 at the fifth level and the target read voltage V22 at the fifth level after the adjustment, and the size of the second voltage difference ΔV2 is the step size of the first adjustment. The step size of the first adjustment is greater than the step size of the third adjustment, e.g., the second voltage difference ΔV2 is greater than the first voltage difference ΔV1.

In one example, as shown in FIGS. 9A and 9D, peripheral circuit is configured to: take the predicted valley voltage at the fifth level (V2 shown in FIG. 9D) as the initial target read voltage at the fifth level; make at least one adjustment to the predicted valley voltage at the fifth level, and obtain the corresponding first result Y3 at the adjusted target read voltage (V22 shown in FIG. 9D) after each adjustment; determine the initial target read voltage at the fifth level as the fifth-level read voltage L5 in accordance with the corresponding first result at the adjusted target read voltage is less than or equal to a second preset value. The first-level read voltage L1 is determined in a similar way as determining the fifth-level read voltage L5. As shown in FIGS. 9B and 9E, FIGS. 9C and 9F, the sixth-level read voltage L6, the fourth-level read voltage L4, and the second-level read voltage L2 are determined, and the seventh-level read voltage L7, the third-level read voltage L3 are determined by using a method similar to determining the fifth-level read voltage L5.

A second read operation is performed on the lower page of at least one code word in accordance with the determined fifth-level read voltage L5 and the determined first-level read voltage L1; a second read operation is performed on the middle page of at least one code word in accordance with the determined sixth-level read voltage L6 and the determined fourth-level read voltage L4; a second read operation is performed on the upper page of at least one code word in accordance with the determined seventh-level read voltage L7 and the determined third-level read voltage L3.

In some examples, the peripheral circuit is configured to: read the storage data of at least one code word at the first read voltage to obtain a second result; read the storage data of at least one code word at the second read voltage to obtain a third result; perform a logical operation on the second result and the third result to obtain a fourth result; and count the number of bits in the fourth result which represent flip of bits in the third result relative to the second result to obtain a first result.

In one example, as shown in FIGS. 9A and 9D, the data stored in the lower page of the memory cell in at least one code word is read at the first read voltage (V0 shown in FIG. 9D), the memory cell whose threshold voltage is less than the first read voltage is marked as bit 1, and the memory cell whose threshold voltage is greater than the first read voltage is marked as bit 0; a second result is obtained.

In one example, as shown in FIGS. 9A and 9D, the data stored in the lower page of the memory cell in at least one code word is read at the second read voltage (V1 shown in FIG. 9D), the memory cell whose threshold voltage is less than the second read voltage is marked as bit 1, and the memory cell whose threshold voltage is greater than the second read voltage is marked as bit 0; a third result is obtained.

In one example, XOR is performed on the second result and the third result to obtain the fourth result. It should be noted that the XOR operation is one of the basic logical operations, in binary, if two binary numbers at the same location are the same, the result is "0"; and if two binary numbers at the same location are different, the result is "1" (e.g., same is 0, and different is 1).

In one example, a bit of 1 in the fourth result indicates that the data of a memory cell in at least one code word read at the first read voltage is different from that read at the second read voltage, a bit of 0 in the fourth result indicates that the data of a memory cell in at least one code word read at the first read voltage is the same as that read at the second read voltage, in other words, the number of bits 1 in the fourth result represents the number of bits of the at least one code word flipped in the two read results at the first read voltage and the second read voltage, the number of bits 0 in the fourth result represents the number of the at least one code resulting in two same read results at the first read voltage and the second read voltage. Since the single-level read mode is employed, e.g., both of the two read operations described above are to read one bit of data stored in the lower page of the memory cell of at least one code word, the number of bit 1 in the fourth result represents the number of memory cells of the at least one code word that are flipped in the two read results of the first read voltage and the second read voltage, the number is denoted as the corresponding first result at the first read voltage. For example, the first result Y1 corresponds to at least one code word at the target read voltage in the first stage (V0 shown in FIG. 9D), the first result Y2 corresponds to the at least one code word at the target adjusted read voltage in the first stage (V2 shown in FIG. 9D), the first result Y3 corresponds to the at least one code word at the target read voltage in the first stage after an adjustment (V22 shown in FIG. 9D).

In some examples, the peripheral circuit includes: a first latch, a second latch, and a third latch; the first latch is configured to store a second result; the second latch is configured to store a third result; and the third latch is configured to store a fourth result.

In one example, the storage data of at least one code word read at a first read voltage (e.g., a second result) is stored in a first latch, the storage data of at least one code word read at a second read voltage (e.g., a third result) is stored in a second latch, the data obtained by XORing the second result and the third result (e.g., the fourth result) is stored in a third latch.

In a first aspect, in the memory devices provided by examples of the present application, by transmitting a first result (size of the first result may be several bytes) instead of at least one code word (e.g. code word size may be 4 KB), the amount of data transferred is reduced; since the first boundary voltage and the second boundary voltage are generated in accordance with the corresponding first result at the target read voltage and correspond to a dynamic first threshold, the iterative convergence speed of determining the target valley voltage is faster; the process of obtaining the first result is converged inside the memory device and does not occupy space of, e.g., a memory controller, thus is less dependent on, e.g., a memory controller; the process of obtaining the predicted valley voltage/target valley voltage in accordance with the first result is completed in the memory device; the transmission time of the output port is reduced; therefore suitable for MLC, TLC or QLC type memory devices.

Figure 11:
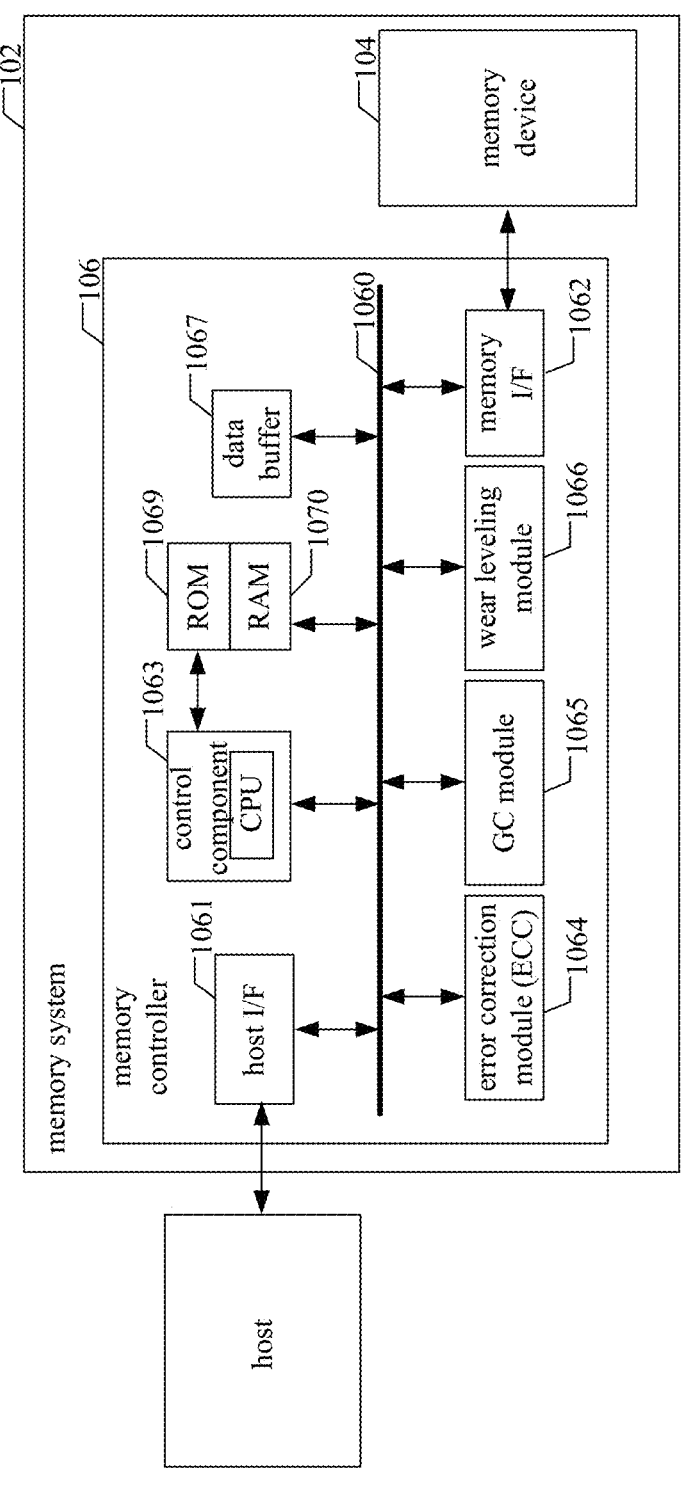
FIG. 11 is a schematic structural diagram of an example structure of a memory system provided by an example of the present application.
Figure 12:
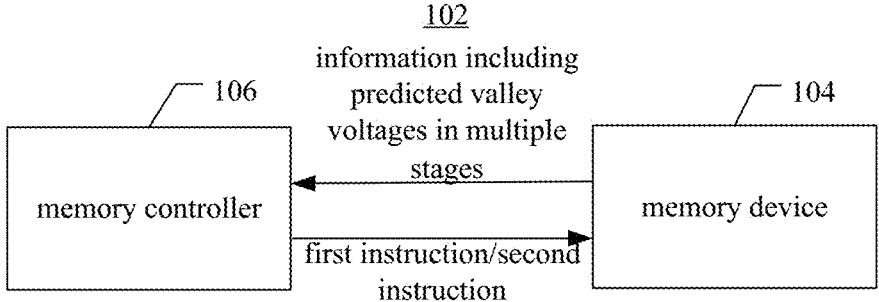
FIG. 12 is a block diagram of a memory system provided by an example of the present application.

In a second aspect, an example of the present application provides a memory system, as shown in FIGS. 11 and 12, the memory system 102 includes: one or more memory devices 104 of the first aspect; and a memory controller 106 coupled to and controlling the memory device 104.

As shown in FIG. 11, in some examples, the memory system 102 is coupled to the host, and responds to instructions from the host to perform various feedbacks. The memory system 102 may include: a memory controller 106 and a memory device 104, the memory controller 106 is used to control the memory device 104 to perform operations such as read, write, and erase, and the memory controller 106 and the memory device 104 may also be coupled in any suitable manner.

The memory controller 106 may include a host interface (I/F) 1061, a memory interface (I/F) 1062, a control component 1063, a Read-Only Memory (ROM) 1069, a Random Access Memory (RAM) 1070, an error correction module 1064, a garbage collection module 1065, a wear leveling module 1066, a data buffer 1067 and a bus 1060. The host interface 1061 is a connection interface between the host 108 and the memory controller 106, the host interface 1061 allows the host and the memory controller to communicate in accordance with a specific protocol, to send read request and write request, and to perform other operations. The memory interface 1062 is a connection interface between the memory controller 106 and the memory device 104, the memory interface 1062 is used to implement data transmission between the memory controller 106 and the memory device 104. The control component 1063 is used to control the memory system 102 as a whole, and the performed specific operations described above regarding the memory controller are mainly performed and completed by the control component 1063 here. In some examples, the control component 1063 is, e.g., a central processing unit (CPU), a microprocessor (MCU), etc. ROM 1069 typically contains firmware or firmware program code for the memory controller 106, which is used to initialize and operate various components of the memory controller, and RAM 1070 is typically used to buffer data. The error correction module 1064 may further include an encode part and a decode part; the encode part is used to encode the data to be stored to obtain check data, and the decode part is used to decode the check data to detect and correct possible erroneous data during data transmission.

The garbage collection module 1065 is used to read out the valid data on some storage blocks after the storage space of the memory device reaches a certain threshold, rewrite them, and then mark these storage blocks to obtain new spare storage blocks. The general implementation of garbage collection may be divided into three operations: selecting source storage blocks with less valid data; finding valid data from the source storage blocks; writing valid data to the target storage block. At this point, all data in the source storage block becomes invalid data, and the source storage block is marked and may be taken as a new spare storage block. The wear leveling module 1066 is used to balance the wear (number of erases) of each storage block in the memory system through data statistics and algorithms. The general implementation of wear leveling may be divided into two operations: selecting the source storage block where the cold data is located; reading the valid data on the source storage block and writing it to the storage block with a relatively large number of erases, at this point, valid data in the source memory block becomes invalid data and is marked. The data buffer 1067 is used to buffer data.

In some examples, the memory controller is configured to: send a first instruction before performing a read operation on data stored in the memory device, where the first instruction indicates to obtain information representing the valley voltage; the memory device is configured to: receive the first instruction, obtain information representing the valley voltage, and send the obtained information representing the valley voltage to the memory controller; and the memory controller is further configured to: control the memory device to perform a read operation with the valley voltage in the information representing the valley voltage, and perform an error correction decode operation on the read result of the read operation.

In some examples, the memory device 104 includes: an array of memory cells, including multiple memory cells, a preset number of memory cells forming one code word; peripheral circuit of the memory device 104, coupled to the array of memory cells and configured to perform the following operations: obtaining a first result corresponding to at least one code word at a target read voltage; the first result including the number of bits which represents the number of bits in the at least one code word which are flipped in two read results at a first read voltage and a second read voltage; a difference between the first read voltage and the second read voltage being lower than a preset voltage; generating a first threshold in accordance with the corresponding first result at the target read voltage; the first threshold is to present the corresponding first result at the maximum in the effective range of the predicted valley voltage; making at least one adjustment to the target read voltage, and obtain the corresponding first result at the adjusted target read voltage after each adjustment; and determining the valley voltage in accordance with the relationship between the corresponding first result at the target read voltage after one adjustment and the first threshold meeting a first preset condition or the corresponding first result at the target read voltage after multiple adjustments meeting a second preset condition; the valley voltage is taken as a read voltage at which a read operation is performed on the at least one code word. In some examples, the memory controller 106 is configured to control the memory device 104 to perform a first read operation on at least one code word.

In a second aspect, in a memory system provided by an example of the present application, by transmitting a first result (size of the first result may be several bytes) instead of at least one code word (e.g. code word size may be 4 KB), the amount of data transferred between the memory device and the memory controller is reduced; since the first boundary voltage and the second boundary voltage are generated in accordance with the corresponding first result at the target read voltage and correspond to a dynamic first threshold, the iterative convergence speed of determining the valley voltage is faster; the process of obtaining the first result is converged inside the memory device and does not occupy space of a memory controller, thus is less dependent on a memory controller; the process of obtaining the predicted valley voltage/determining the valley voltage in accordance with the first result is completed in the memory device; the transmission time of the input and output ports of the memory device and/or the time of the error correction decode operation of the memory controller is reduced; saves the iteration time of the memory controller error correction decode algorithm is saved, and the error correction decode speed is faster; therefore suitable for MLC, TLC or QLC type memory devices.

In a third aspect, an example of the present application provides a memory controller, including a control component configured to: generate a first boundary voltage and a second boundary voltage in accordance with a first result corresponding to at least one code word at a target read voltage, where the at least one code word is formed by a preset number of memory cells in at least one memory device coupled to the memory controller; the first result represents the number of bits in the at least one code word which are flipped in two read results at a first read voltage and a second read voltage; a difference between the first read voltage and the second read voltage being lower than a preset voltage; make at least one adjustment to the target read voltage, and obtain the corresponding first result at the adjusted target read voltage after each adjustment; in a process of the adjustment, change a current direction of adjustment to the voltage in accordance with the target read voltage after one adjustment exceeding a range defined by the first boundary voltage and the second boundary voltage; determine a valley voltage in accordance with the corresponding first result at the adjusted target read voltage meeting a preset condition, the valley voltage being taken as a read voltage at which a read operation is performed on the at least one code word.

In some examples, the memory cell including multiple storage bits, and the multiple storage bits corresponding to read voltages in multiple stages; the control component is configured to: obtain the initial first boundary voltage and the initial second boundary voltage corresponding to the target stage in the multiple stages; in accordance with a first result corresponding to at least one code word at a target read voltage in the target stage, performing an adjustment to the initial first boundary voltage and the initial second boundary voltage corresponding to the target stage to obtain a first boundary voltage and a second boundary corresponding to the target stage; determine the valley voltage corresponding to the target stage in accordance with the corresponding first result at the adjusted target read voltage in the target stage meeting the preset condition.

In some examples, the range defined by the initial first boundary voltage and the initial second boundary voltage is smaller than the first preset range; the control component is configured to: in accordance with a first result corresponding to at least one code word at a target read voltage in the target stage is greater than a first preset value, expand the range defined by the initial first boundary voltage and the initial second boundary voltage corresponding to the target stage to obtain a first boundary voltage and a second boundary corresponding to the target stage.

In some examples, usage scenarios for the memory device include a first scenario and a second scenario; the control component is configured to: based on the usage scenario for the memory device being a first scenario, expand the range defined by the initial first boundary voltage and the initial second boundary voltage corresponding to the target stage by the way of offsetting both of the initial first boundary voltage and the initial second boundary voltage corresponding to the target stage in a decreasing direction; based on the usage scenario for the memory device being a second scenario, expand the range defined by the initial first boundary voltage and the initial second boundary voltage corresponding to the target stage by the way of offsetting both of the initial first boundary voltage and the initial second boundary voltage corresponding to the target stage in an increasing direction.

In some examples, the range defined by the initial first boundary voltage and the initial second boundary voltage is larger than the second preset range; the memory controller is configured to: in accordance with a first result corresponding to at least one code word at a target read voltage in the target stage is less than a second preset value, narrowing the range defined by the initial first boundary voltage and the initial second boundary voltage corresponding to the target stage to obtain a first boundary voltage and a second boundary corresponding to the target stage.

In some examples, the control component is configured to: make M first adjustments with a first step size to the target read voltage to be adjusted, and obtain M corresponding first results at the target read voltages after the M first adjustments respectively; take the minimum first result among the M first results as the knee-point value, and the read voltage corresponding to the knee-point value is the knee-point voltage; make N second adjustments to the knee-point voltage with a second step size, and obtain N corresponding first results at the target read voltages after the N second adjustments respectively; the second step size is less than the first step size; M and N are both positive integers greater than 1; and determine the valley voltage in accordance with the corresponding first result at the obtained target read voltage after the N second adjustments meeting the preset condition.

In some examples, the control component is configured to: before making M first adjustments to the target read voltage to be adjusted, generate a first threshold in accordance with a first result corresponding to at least one code word at a target read voltage, the first threshold is to present the maximum among the corresponding first results at the read voltages near the valley voltage; in accordance with the corresponding first result at the adjusted target read voltage being greater than or equal to the first threshold, generate the target read voltage after the next adjustment based on the corresponding first result at the target read voltage after the previous adjustment, until the corresponding first result at the adjusted target read voltage is less than the first threshold; and after the corresponding first result at the adjusted target read voltage is less than the first threshold, make M first adjustments with a first step size to the target read voltage to be adjusted.

In some examples, the first boundary voltage is less than the second boundary voltage, the control component is configured to: in accordance with the generated target read voltage after the next adjustment being less than or equal to a first boundary voltage, starting from the first boundary voltage, adjust the read voltage in an increasing direction; or, in accordance with the generated target read voltage after the next adjustment being greater than or equal to the second boundary voltage, starting from the second boundary voltage, adjust the read voltage in a decreasing direction.

In some examples, the control component is configured to: take, as a near-valley voltage, the adjusted target read voltage corresponding to the first result that is less than the first threshold for the first time among multiple corresponding first results at target read voltages after multiple adjustments; in the process of making multiple first adjustments to the near-valley voltage with a first step size, starting from the near-valley voltage, make adjustments in a first direction with the first step size until the corresponding first result at the adjusted target read voltage in the first direction is greater than the first threshold; starting from the near-valley voltage, make adjustments in a second direction opposite to the first direction with the first step size until the corresponding first result at the adjusted target read voltage in the second direction is greater than the first threshold.

In some examples, the control component is configured to: generate a first threshold in accordance with the corresponding first result at the target read voltage and the first mapping function; the first mapping function is to present the relationship between the first threshold and the corresponding first result at the target read voltage; generate a predicted value of the target read voltage after the next adjustment in accordance with the corresponding first result and the second mapping function at the target read voltage after the previous adjustment, and the stage number at which the target stage is; the second mapping function is to present the relationship between the corresponding first result at the target read voltage after the previous adjustment, the stage number at which the target stage is and the predicted value of the valley voltage in the target stage.

In some examples, the control component is configured to: in the process of making N second adjustments to the knee-point voltage with the second step size, starting from the knee-point voltage, make adjustments in two opposite directions with the second step size, in the process of making adjustments in each direction, count one for upward trend when the corresponding first result at the target read voltage after the next adjustment is greater than the corresponding first result at the read voltage after the previous adjustment, and determine the third boundary voltage and the fourth boundary voltage in accordance with a total counted number being greater than or equal to a preset number; in the process of making adjustments in each direction, if the corresponding first result at the target read voltage after one adjustment is lower than the second threshold, or taking the minimum first result among multiple corresponding first results at the target read voltages after multiple adjustments as a reference value, when the number of first results from remaining first results which differ from the reference value with a difference being less than a third threshold is greater than a preset number, stop the adjustments and take, as the target valley voltage, the read voltage corresponding to the minimum first result among the multiple first results.

In some examples, the control component is configured to: in the process of making adjustments in each direction, take the corresponding adjusted target read voltages as the third voltage boundary and the fourth voltage boundary respectively in accordance with the total counted number being equal to the preset number; in the process of making adjustments in each direction, if the third boundary voltage and the fourth boundary voltage have been determined, obtain the corresponding first result at the read voltage after the last adjustment, the read voltage after the last adjustment is the average of the third boundary voltage and the fourth boundary voltage; take, as the target valley voltage, the read voltage corresponding to the minimum first result among the multiple corresponding first results at all the adjusted target read voltages.

In some examples, the array of memory cells includes memory cells with multiple storage bits, and the multiple storage bits correspond to multiple pages respectively; at least part of the pages corresponding to multiple stages, the multiple stages including the first stage and the second stage, and the read voltage in the second stage is less than the read voltage in the first stage; The control component is configured to: generate a target valley voltage in the second stage of the multiple stages and/or a target valley voltage in other first stage corresponding to a lower read voltage with the determined target valley voltage in accordance with a target valley voltage in the first stage to which the stage number corresponding to the determined target valley voltage belonging.

In a third aspect, in a memory controller provided by an example of the present application, by transmitting a first result (size of the first result may be several bytes) instead of at least one code word (e.g. code word size may be 4 KB), the amount of data transferred between the memory device and the memory controller is reduced; since the first boundary voltage and the second boundary voltage are generated in accordance with the corresponding first result at the target read voltage and correspond to a dynamic first threshold, the iterative convergence speed of determining the valley voltage is faster; the process of obtaining the first result is converged inside the memory device and does not occupy space of a memory controller, thus is less dependent on a memory controller; completing the process of obtaining the predicted valley voltage/determining the valley voltage in accordance with the first result is more efficient in the memory controller than in the memory device; the transmission time of the input and output ports of the memory device and/or the time of the error correction decode operation of the memory controller is reduced; saves the iteration time of the memory controller error correction decode algorithm is saved, and the error correction decode speed is faster; therefore suitable for MLC, TLC or QLC type memory devices.

In a fourth aspect, an example of the present application provides a method for operating a memory device, the operating method includes: generating a first boundary voltage and a second boundary voltage in accordance with a first result corresponding to at least one code word at a target read voltage, where the at least one code word is formed by a preset number of memory cells in a memory device; the first result including the number of bits which represents the number of bits in the at least one code word which are flipped in two read results at a first read voltage and a second read voltage; a difference between the first read voltage and the second read voltage being lower than a preset voltage; making at least one adjustment to the target read voltage, and obtain the corresponding first result at the adjusted target read voltage after each adjustment; in a process of the adjustment, changing a current direction of adjustment to the voltage in accordance with the target read voltage after one adjustment exceeding a range defined by the first boundary voltage and the second boundary voltage; determining a valley voltage in accordance with the corresponding first result at the adjusted target read voltage meeting a preset condition, the valley voltage being taken as a read voltage at which a read operation is performed on the at least one code word.

In some examples, the operating method includes: obtaining the initial first boundary voltage and the initial second boundary voltage corresponding to the target stage in the multiple stages; in accordance with a first result corresponding to at least one code word at a target read voltage in the target stage, performing an adjustment to the initial first boundary voltage and the initial second boundary voltage corresponding to the target stage to obtain a first boundary voltage and a second boundary corresponding to the target stage; determining the valley voltage corresponding to the target stage in accordance with the corresponding first result at the adjusted target read voltage in the target stage meeting the preset condition; the memory cell including multiple storage bits, and the multiple storage bits corresponding to read voltages in multiple stages.

In some examples, the operating method includes: in accordance with a first result corresponding to at least one code word at a target read voltage in the target stage is greater than a first preset value, expanding the range defined by the initial first boundary voltage and the initial second boundary voltage corresponding to the target stage to obtain a first boundary voltage and a second boundary corresponding to the target stage; the range defined by the initial first boundary voltage and the initial second boundary voltage is smaller than the first preset range.

In some examples, the operating method includes: based on the usage scenario for the memory device being a first scenario, expanding the range defined by the initial first boundary voltage and the initial second boundary voltage corresponding to the target stage by the way of offsetting both of the initial first boundary voltage and the initial second boundary voltage corresponding to the target stage in a decreasing direction; based on the usage scenario for the memory device being a second scenario, expanding the range defined by the initial first boundary voltage and the initial second boundary voltage corresponding to the target stage by the way of offsetting both of the initial first boundary voltage and the initial second boundary voltage corresponding to the target stage in an increasing direction; the usage scenarios for the memory device include a first scenario and a second scenario.

In some examples, the operating method includes: in accordance with a first result corresponding to at least one code word at a target read voltage in the target stage is less than a second preset value, narrowing the range defined by the initial first boundary voltage and the initial second boundary voltage corresponding to the target stage to obtain a first boundary voltage and a second boundary correspond-ing to the target stage; the range defined by the initial first boundary voltage and the initial second boundary voltage is larger than the second preset range.

In some examples, the operating method includes: making M first adjustments with a first step size to the target read voltage to be adjusted, and obtaining M corresponding first results at the target read voltages after the M first adjust-ments respectively; using the minimum first result among the M first results as the knee-point value, and the read voltage corresponding to the knee-point value is the knee-point voltage; making N second adjustments to the knee-point voltage with a second step size, and obtaining N corresponding first results at the target read voltages after the N second adjustments respectively; the second step size is less than the first step size; M and N are both positive integers greater than 1; and determining the valley voltage in accordance with the corresponding first result at the obtained target read voltage after the N second adjustments meeting the preset condition.

In some examples, the operating method includes: before making M first adjustments to the target read voltage to be adjusted, generating a first threshold in accordance with a first result corresponding to at least one code word at a target read voltage, the first threshold is to present the maximum among the corresponding first results at the read voltages near the valley voltage; in accordance with the correspond-ing first result at the adjusted target read voltage being greater than or equal to the first threshold, generating the target read voltage after the next adjustment based on the corresponding first result at the target read voltage after the previous adjustment, until the corresponding first result at the adjusted target read voltage is less than the first thresh-old; and after the corresponding first result at the adjusted target read voltage is less than the first threshold, making M first adjustments with a first step size to the target read voltage to be adjusted.

In some examples, the operating method includes: in accordance with the generated target read voltage after the next adjustment being less than or equal to a first boundary voltage, starting from the first boundary voltage, adjusting the target read voltage in an increasing direction; or in accordance with the generated target read voltage after the next adjustment being greater than or equal to a second boundary voltage, starting from the second boundary volt-age, adjusting the read voltage in a decreasing direction; the first boundary voltage is less than the second boundary voltage.

In some examples, the operating method includes: taking, as a near-valley voltage, the adjusted target read voltage corresponding to the first result that is less than the first threshold for the first time among multiple corresponding first results at target read voltages after multiple adjust-ments; in the process of making multiple first adjustments to the near-valley voltage with a first step size, starting from the near-valley voltage, making adjustments in a first direction with the first step size until the corresponding first result at the adjusted target read voltage in the first direction is greater than the first threshold; starting from the near-valley voltage, making an adjustment in a second direction opposite to the first direction with the first step size until the corresponding first result at the adjusted target read voltage in the second direction is greater than the first threshold.

In some examples, the operating method includes: generating a first threshold in accordance with the corresponding first result at the target read voltage and the first mapping function; the first mapping function is to present the relationship between the first threshold and the corresponding first result at the target read voltage; generating a predicted value of the target read voltage after the next adjustment in accordance with the corresponding first result at the target read voltage after the previous adjustment and the second mapping function, and the stage number at which the target stage is; the second mapping function is to present the relationship between the corresponding first result at the target read voltage after the previous adjustment, the stage number at which the target stage is and the predicted value of the valley voltage in the target stage.

In some examples, the operating method includes: in the process of making N second adjustments to the knee-point voltage with the second step size, starting from the knee-point voltage, making adjustments in two opposite directions with the second step size, in the process of making adjustments in each direction, count one for upward trend when the corresponding first result at the target read voltage after the next adjustment is greater than the corresponding first result at the target read voltage after the previous adjustment, and determine the third boundary voltage and the fourth boundary voltage in accordance with a total counted number being greater than or equal to a preset number; in the process of making adjustments in each direction, if the corresponding first result at the target read voltage after one adjustment is lower than the second threshold, or taking the minimum first result among multiple corresponding first results at the target read voltages after multiple adjustments as a reference value, when the number of first results from remaining first results which differ from the reference value with a difference being less than a third threshold is greater than a preset number, stop the adjustments and take, as the target valley voltage, the read voltage corresponding to the minimum first result among the multiple first results.

In some examples, the operating method includes: in the process of making adjustments in each direction, take the corresponding adjusted target read voltages as the third voltage boundary and the fourth voltage boundary respectively in accordance with the total counted number being equal to the preset number; in the process of making adjustments in each direction, if the third boundary voltage and the fourth boundary voltage have been determined, obtaining the corresponding first result at the read voltage after the last adjustment, the read voltage after the last adjustment is the average of the third boundary voltage and the fourth boundary voltage; taking, as the target valley voltage, the read voltage corresponding to the minimum first result among the multiple corresponding first results at all the adjusted target read voltages.

In some examples, the operating method includes: generating a target valley voltage in the second stage of the multiple stages and/or a target valley voltage in other first stage corresponding to a lower read voltage with the determined target valley voltage in accordance with a target valley voltage in the first stage to which the stage number corresponding to the determined target valley voltage belonging; the array of memory cells includes memory cells with multiple storage bits, and the multiple storage bits correspond to multiple pages respectively; at least part of the pages corresponding to multiple stages, the multiple stages including the first stage and the second stage, and the read voltage in the second stage is less than the read voltage in the first stage.

In some examples, the operating method includes: reading the storage data of at least one code word at the first read voltage to obtain a second result; reading the storage data of at least one code word at the second read voltage to obtain a third result; perform a and the first result third result; performing a logical operation on the second result and the third result to obtain a fourth result; counting the number of bits in the fourth result which represent flip of bits in the third result relative to the second result to obtain a first result.

In a fifth aspect, an example of the present application provides a method for operating a memory system, the memory system including a memory device and a memory controller coupled to the memory device and controlling the memory device, the operating method including: performing any one of the operating methods for a memory device provided in the fourth aspect.

In some examples, a method for operating a memory device includes: sending, by a memory controller in the memory system, a first instruction, where the first instruction indicates to obtain information representing a valley voltage; receiving, by the memory device in the memory system, the first instruction, and obtaining information representing the valley voltage in accordance with the method for operating a memory device provided in the fourth aspect, and sending the obtained information representing the valley voltage in the multiple levels to the memory controller; controlling, by the memory controller, the memory device to perform a read operation with the predicted valley voltage in the information representing the valley voltage, and performing an error correction decode operation on the read result of the read operation.

In a sixth aspect, an example of the present application provides a method for operating a memory controller, the memory controller includes a control component, the operating method includes: generating a first boundary voltage and a second boundary voltage in accordance with a first result corresponding to at least one code word at a target read voltage, where the at least one code word is formed by a preset number of memory cells in at least one memory device coupled to the memory controller; the first result including the number of bits which represents the number of bits in the at least one code word which are flipped in two read results at a first read voltage and a second read voltage; a difference between the first read voltage and the second read voltage being lower than a preset voltage; making at least one adjustment to the target read voltage, and obtain the corresponding first result at the adjusted target read voltage after each adjustment; in a process of the adjustment, changing a current direction of adjustment to the voltage in accordance with the target read voltage after one adjustment exceeding a range defined by the first boundary voltage and the second boundary voltage; determining a valley voltage in accordance with the corresponding first result at the adjusted target read voltage meeting a preset condition, the valley voltage being taken as a read voltage at which a read operation is performed on the at least one code word.

In some examples, the operating method includes: obtaining the initial first boundary voltage and the initial second boundary voltage corresponding to the target stage in the multiple stages; in accordance with a first result corresponding to at least one code word at a target read voltage in the target stage, performing an adjustment to the initial first boundary voltage and the initial second boundary voltage corresponding to the target stage to obtain a first boundary voltage and a second boundary corresponding to the target stage; determining the valley voltage corresponding to the target stage in accordance with the corresponding first result at the adjusted target read voltage in the target stage meeting the preset condition; the memory cell including multiple storage bits, and the multiple storage bits corresponding to read voltages in multiple stages.

In some examples, the operating method includes: in accordance with a first result corresponding to at least one code word at a target read voltage in the target stage is greater than a first preset value, expanding the range defined by the initial first boundary voltage and the initial second boundary voltage corresponding to the target stage to obtain a first boundary voltage and a second boundary corresponding to the target stage; the range defined by the initial first boundary voltage and the initial second boundary voltage is smaller than the first preset range.

In some examples, the operating method includes: based on the usage scenario for the memory device being a first scenario, expanding the range defined by the initial first boundary voltage and the initial second boundary voltage corresponding to the target stage by the way of offsetting both of the initial first boundary voltage and the initial second boundary voltage corresponding to the target stage in a decreasing direction; based on the usage scenario for the memory device being a second scenario, expanding the range defined by the initial first boundary voltage and the initial second boundary voltage corresponding to the target stage by the way of offsetting both of the initial first boundary voltage and the initial second boundary voltage corresponding to the target stage in an increasing direction; the usage scenarios for the memory device include a first scenario and a second scenario.

In some examples, the operating method includes: in accordance with a first result corresponding to at least one code word at a target read voltage in the target stage is less than a second preset value, narrowing the range defined by the initial first boundary voltage and the initial second boundary voltage corresponding to the target stage to obtain a first boundary voltage and a second boundary corresponding to the target stage; the range defined by the initial first boundary voltage and the initial second boundary voltage is larger than the second preset range.

In some examples, the operating method includes: making M first adjustments with a first step size to the target read voltage to be adjusted, and obtaining M corresponding first results at the target read voltages after the M first adjustments respectively; using the minimum first result among the M first results as the knee-point value, and the read voltage corresponding to the knee-point value is the knee-point voltage; making N second adjustments to the knee-point voltage with a second step size, and obtaining N corresponding first results at the target read voltages after the N second adjustments respectively; the second step size is less than the first step size; M and N are both positive integers greater than 1; and determining the valley voltage in accordance with the corresponding first result at the obtained target read voltage after the N second adjustments meeting the preset condition.

In some examples, the operating method includes: before making M first adjustments to the target read voltage to be adjusted, generating a first threshold in accordance with a first result corresponding to at least one code word at a target read voltage, the first threshold is to present the maximum among the corresponding first results at the read voltages near the valley voltage; in accordance with the corresponding first result at the adjusted target read voltage being greater than or equal to the first threshold, generating the target read voltage after the next adjustment based on the corresponding first result at the target read voltage after the previous adjustment, until the corresponding first result at the adjusted target read voltage is less than the first threshold; and after the corresponding first result at the adjusted target read voltage is less than the first threshold, making M first adjustments with a first step size to the target read voltage to be adjusted.

In some examples, the operating method includes: in accordance with the generated target read voltage after the next adjustment being less than or equal to a first boundary voltage, starting from the first boundary voltage, adjusting the read voltage in an increasing direction; or in accordance with the generated target read voltage after the next adjustment being greater than or equal to a second boundary voltage, starting from the second boundary voltage, adjusting the read voltage in a decreasing direction; the first boundary voltage is less than the second boundary voltage.

In some examples, the operating method includes: taking, as a near-valley voltage, the adjusted target read voltage corresponding to the first result that is less than the first threshold for the first time among multiple corresponding first results at target read voltages after multiple adjustments; in the process of making multiple first adjustments to the near-valley voltage with a first step size, starting from the near-valley voltage, making adjustments in a first direction with the first step size until the corresponding first result at the adjusted target read voltage in the first direction is greater than the first threshold; starting from the near-valley voltage, making an adjustment in a second direction opposite to the first direction with the first step size until the corresponding first result at the adjusted target read voltage in the second direction is greater than the first threshold.

In some examples, the operating method includes: generating a first threshold in accordance with the corresponding first result at the target read voltage and the first mapping function; the first mapping function is to present the relationship between the first threshold and the corresponding first result at the target read voltage; generate a predicted value of the target read voltage after the next adjustment in accordance with the corresponding first result at the target read voltage after the previous adjustment and the second mapping function, and the stage number at which the target stage is; the second mapping function is to present the relationship between the corresponding first result at the target read voltage after the previous adjustment, the stage number at which the target stage is and the predicted value of the valley voltage in the target stage.

In some examples, the operating method includes: in the process of making N second adjustments to the knee-point voltage with the second step size, starting from the knee-point voltage, making adjustments in two opposite directions with the second step size, in the process of making adjustments in each direction, count one for upward trend when the corresponding first result at the target read voltage after the next adjustment is greater than the corresponding first result at the read voltage after the previous adjustment, and determine the third boundary voltage and the fourth boundary voltage in accordance with a total counted number being greater than or equal to a preset number; in the process of making adjustments in each direction, if the corresponding first result at the target read voltage after one adjustment is lower than the second threshold, or taking the minimum first result among multiple corresponding first results at the target read voltages after multiple adjustments as a reference value, when the number of first results from remaining first results which differ from the reference value with a difference being less than a third threshold is greater than a preset number, stop the adjustments and take, as the target valley voltage, the read voltage corresponding to the minimum first result among the multiple first results.

In some examples, the operating method includes: in the process of making adjustments in each direction, take the corresponding adjusted target read voltages as the third voltage boundary and the fourth voltage boundary respectively in accordance with the total counted number being equal to the preset number; in the process of making adjustments in each direction, if the third boundary voltage and the fourth boundary voltage have been determined, obtaining the corresponding first result at the read voltage after the last adjustment, the read voltage after the last adjustment is the average of the third boundary voltage and the fourth boundary voltage; taking, as the target valley voltage, the read voltage corresponding to the minimum first result among the multiple corresponding first results at all the adjusted target read voltages.

In some examples, the operating method includes: generating a target valley voltage in the second stage of the multiple stages and/or a target valley voltage in other first stage corresponding to a lower read voltage with the determined target valley voltage in accordance with a target valley voltage in the first stage to which the stage number corresponding to the determined target valley voltage belonging; the array of memory cells includes memory cells with multiple storage bits, and the multiple storage bits correspond to multiple pages respectively; at least part of the pages corresponding to multiple stages, the multiple stages including the first stage and the second stage, and the read voltage in the second stage is less than the read voltage in the first stage.

Figure 13A:
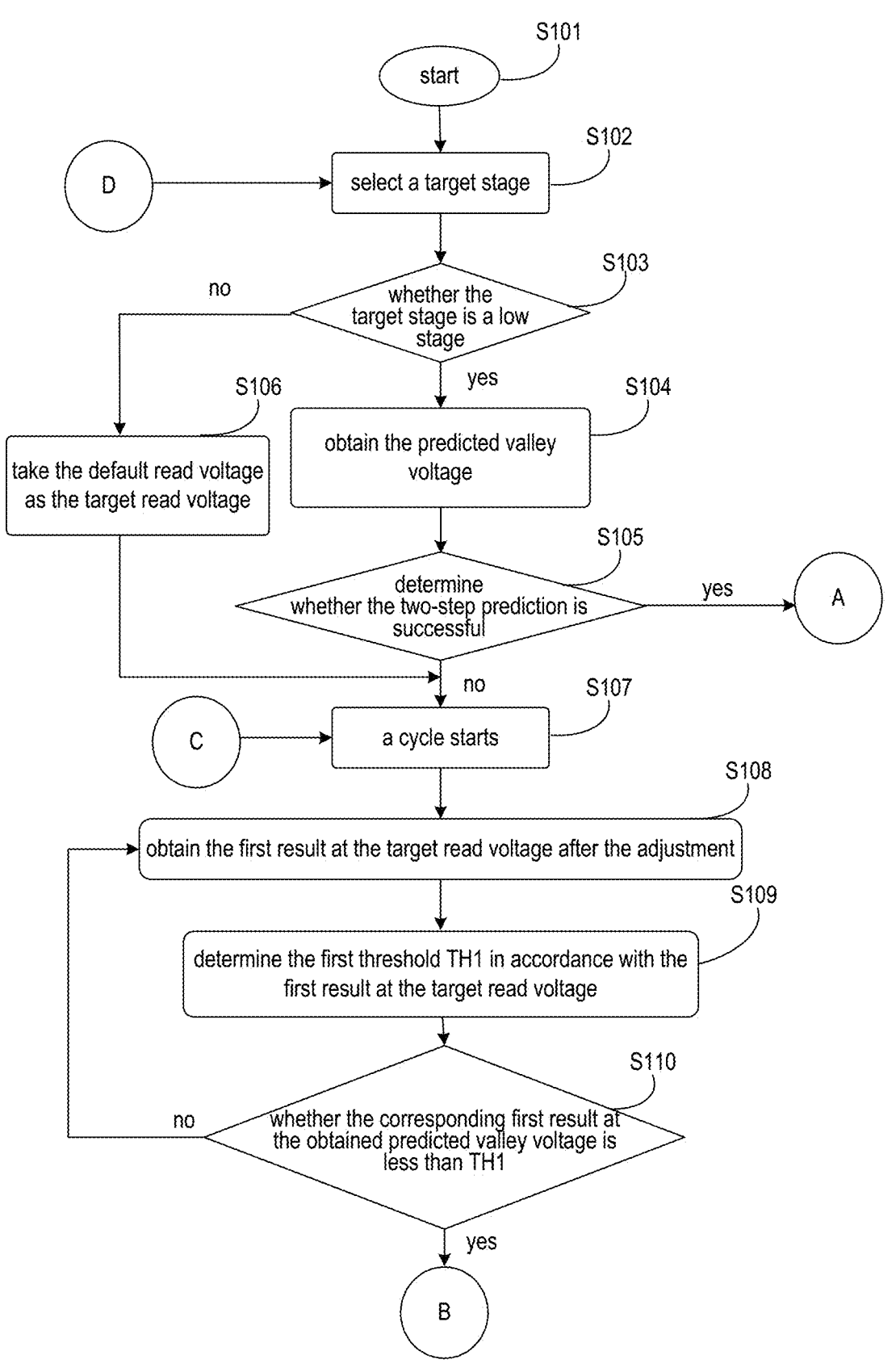
FIGS. 13A and 13B are a flowchart of a method for operating a memory device provided by an example of the present application.
Figure 13B:
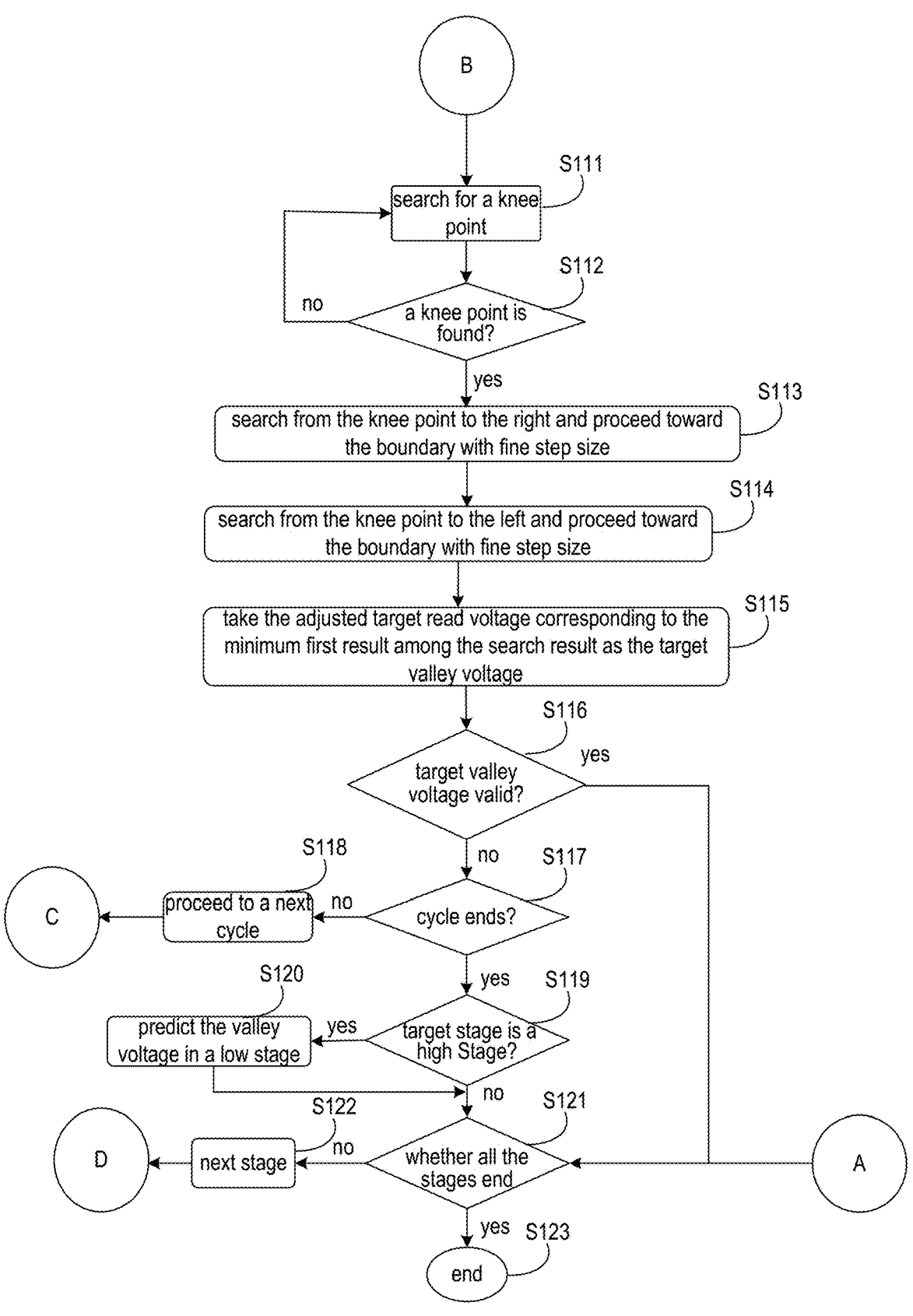

FIGS. 13A and 13B are a flowchart of a method for operating a memory device provided by an example of the present application. The process of determining the target valley voltage will be described in detail below through FIGS. 13A and 13B. It should be noted that here and below, the target valley voltage refers to the voltage used to perform a read operation on the data to be read.

In operation S101, the program of obtaining the target valley voltage is triggered, and the process of obtaining the target valley voltage is started. Next, operation S102 is performed.

As mentioned above, in accordance with the memory cell including multiple storage bits, the multiple storage bits respectively correspond to multiple pages, and at least one page corresponds to multiple stages. When determining the target valley voltage, the target valley voltage among the read voltages in each of the at least one stage corresponding to each of the multiple pages is determined in sequence. In operation S103, one stage is selected as the target stage from the multiple stages corresponding to one page, and the target valley voltage corresponding to the read voltage in the target stage is first determined. For example, taking TLC as an example, the target valley voltages for the first-level read voltage L1 and the fifth-level read voltage L5 corresponding to the lower page is first determined, and one of L1 or L5 may be selected as the target stage. After the target stage is determined, operation S103 is performed.

In operation S103, the type to which the target stage belongs is mainly determined. Here, the target stage may be divided into two categories, the first stage (also referred to as high stage) and the second stage (also referred to as low stage), in which the read voltage in the first stage is greater than the read voltage in the second stage. For example, still taking the lower page of TLC as an example, L5 is in the first stage and L1 is in the second stage. If L1 is selected as the target stage in operation S103, the target stage is the second stage, which is the low stage; if L5 is selected as the target stage in operation S104, the target stage is the first stage, which is the high stage. If the target stage is a low stage, operation S104 is performed; if the target stage is a high stage, operation S106 is performed.

In operation S104, the predicted valley voltage is obtained, here, the predicted valley voltage is the predicted valley voltage corresponding to a low stage generated in accordance with the target valley voltage corresponding to a high stage and the related mapping function. Here and below, the related mapping function may be obtained by fitting a large number of experimental results before the memory device leaves the factory, and is stored in the memory device. Next, operation S105 is performed.

In operation S105, it is determined whether the two-operation prediction is successful. Here, the so-called two-operation prediction may include the first-operation prediction and the second-operation prediction, where the first-operation prediction is to generate a predicted valley voltage in a high stage, the method is to generate the predicted valley voltage in the high stage in accordance with the corresponding first result at the target read voltage (default read voltage), the stage number at which the high stage is, and the fourth mapping function; the second operation of prediction is to generate the predicted valley voltage in a low stage, and the method is to generate the predicted valley voltage in a low stage in accordance with the aforementioned predicted valley voltage in a high stage, the stage number at which the low stage is and the third mapping function. After the two-operation prediction, confirmation of the predicted valley voltage is not performed, and the predicted valley voltage in a high stage and the predicted valley voltage in a low stage are directly used for hard decode, if the hard decode passes, it indicates that the two-operation method prediction is successful, at this point, the search for the target valley voltage is directly stopped and operation S121 is performed; If the hard decode fails, it indicates that the two-operation prediction fails, at this point, the point corresponding to the predicted valley voltage is taken as the near-valley point for subsequent iterations, and operation S107 is continued.

It should be noted that if the hard decode fails, it indicates that the two-operation prediction is unsuccessful, at this point, the target valley voltage needs to be determined through search or also called loop (or iteration), therefore, when the two-operation prediction is unsuccessful, a loop process will be entered, after the two-operation fails, the search process may be performed directly from the beginning of the loop, e.g., moving from operation S105 to S107. If the target stage is a high stage, prepare to determine the target valley voltage in the high stage through search or loop. In operation S106, the default read voltage is taken as the target read voltage. Here, the target read voltage may be taken as an initial value for subsequent searches or loops. In some implementations, the default read voltage may be the read voltage at which the threshold voltage of the memory cell does not offset, e.g., the corresponding read voltage at which just written in, and the corresponding offset value at this point is 0 DAC, which is a voltage offset. Operation S107 is performed after operation S106.

It should be noted that here and below, the conversion relationship between DAC and the aforementioned mV is 1DAC=10 mV.

In operation S107, it is started to determine the target valley voltage by searching or looping. Operation S108 is performed after operation S107.

For the first performing of the loop, in operation S108, the first result at the target read voltage is obtained; it may be understood that for the subsequent performing of the loop, in operation S108, the first result at the adjusted target read voltage is obtained. Operation S109 is performed after operation S108.

In operation S109, the first threshold TH1 is determined or adjusted in accordance with the first result at the target read voltage. It may be understood that when performing a read operation, the further the threshold voltage of the memory cell deviates from the threshold voltage during writing, the first result of reading with the target read voltage will generally be larger, based on this, the value of the first result at the default read voltage may be used to confirm the first threshold TH1, and the first threshold TH1 is to present the change (lifting) in the target valley voltage caused by the offset of the threshold voltage of the memory cell. Operation S110 is performed after operation S109.

It should be noted that operation S109 is mainly for the process of performing the loop for the first time, and for the process of subsequent performing the loop, this operation may be skipped.

In operation S110, the predicted valley voltage is generated, and it is determined whether the predicted valley voltage is less than the aforementioned first threshold TH1. Based on the corresponding first result at the target read voltage after the previous adjustment and the associated mapping function (e.g., the aforementioned second mapping function), the predicted read voltage after next adjustment is generated, and the generated predicted valley voltage is compared with the magnitude of the first threshold TH1. When the determination result in operation S110 is no, it indicates that the predicted valley voltage generated at this point is greater than or equal to the first threshold TH1, and the operation S108 of the loop continues where an adjustment is made to the target read voltage and the predicted valley voltage is re-generated, after each re-generation of the predicted valley voltage, a comparison with the first threshold TH1 is performed until the generated predicted read voltage is less than the first threshold TH1. That is to say, the aforementioned prediction formula or related mapping function is used to perform prediction iteration until the generated predicted read voltage is less than the first threshold TH1. When the determination result in operation S110 is yes, it indicates that the predicted valley voltage generated at this point is less than the first threshold TH1, and the process proceeds to the next operation S111.

In operation S111, search for an knee point. Here, the target read voltage after each adjustment is taken as the abscissa, and the corresponding first result at the corresponding adjusted target read voltage is taken as the ordinate, the abscissa and ordinate will form a point. The knee point may be understood as a point closer to the valley bottom. In some examples, starting from the near-valley point, searching with a coarser step size (a first step size) may be performed to the left boundary and the right boundary respectively until reaching the left boundary and the right boundary, and the point corresponding to the minimum first result during the search process is taken as the knee point. Here, the knee point is a point that is closer to the valley bottom than the near-valley point, and the point less than the first threshold in the preceding operation may be taken as a near-valley point, e.g., the near-valley point may be a point less than the first threshold that first appears in the preceding operation. The first step size may be a larger step size, and in some examples, the first step size may be 5DAC-15DAC, in one example, the first step size may be 5DAC, 10DAC or 15DAC. Operation S112 is performed after operation S111.

In operation S112, it is determined whether the knee point has been found. If the knee point is not found, the search continues and operation S111 is continued until the knee point is found. After the knee point is found, operation S113 is performed.

In operations S113 and S114, starting from the near-valley point, searching with a finer step size (a second step size) may be performed to the left boundary and the right boundary respectively until reaching the left boundary and the right boundary or the counted number for upward trend exceeds a preset number. Here, when a corresponding first result at the target read voltage after a next adjustment is greater than the corresponding first result at the target read voltage after a previous adjustment, one for upward trend is counted. In some examples, the preset number is 3-7, in one example, the preset number of may be 3, 5, or 7. It should be noted that the locations of operations S113 and S114 may be interchanged. The second step size may be a smaller step size, and in some examples, the second step size may be 2DAC-4DAC, in one example, the second step size may be 2DAC, 3DAC or 4DAC.

When the searches in operations S113 and S114 both meet the aforementioned conditions (the boundary is reached or the counted number for upward trend exceeds the preset number), operation S115 is performed.

In operation S115, the adjusted target read voltage corresponding to the minimum first result is taken as the target valley voltage. Operation S116 is performed after operation S115.

In operation S116, it is determined whether the target valley voltage is valid. Here, the way to determine whether the target valley voltage is valid may be: reading data with the target valley voltage, decoding the read data through the memory controller, and when the decoding is successful, it indicates whether the target valley voltage is valid. When the determination result in operation S116 is yes, operation S121 is performed; when the determination result in operation S116 is no, operation S117 is performed.

In operation S117, it is determined whether the loop ends. When the determination result in operation S117 is yes, operation S119 is performed; when the determination result in operation S117 is no, operation S118 is performed.

In operation S118, enter the next loop and searching continues. Operation S118 moves to operation S107.

In operation S119, it is determined whether the target stage is a high stage. When the determination result in operation S119 is yes, operation S120 is performed; when the determination result in operation S119 is no, operation S121 is performed.

In operation S120, a predicted valley voltage in a low stage is generated in accordance with the target valley voltage in a high stage. Here, the predicted valley voltage in a low stage may be generated through the target valley voltage in a high stage, the stage number at which the low stage is and the related mapping function (e.g., the afore-mentioned third mapping function). Operation S121 is performed after operation S120.

In operation S121, it is determined whether corresponding target valley voltages have been determined for read voltages in all the stages contained on this page. When the determination result in operation S121 is yes, it indicates that target valley voltages corresponding to read voltages in all the stages contained on this page have been determined, and operation S123 may be performed at this point; and when the determination result in operation S121 is no, it indicates that target valley voltages corresponding to read voltages in some of the stages contained on this page have not been determined, and operation S122 may be performed at this point.

In operation S122, for the stages in which the target valley voltages are not determined, the target valley voltage in each of the stages is determined in sequence. Operation S122 moves to operation S102.

In operation S101, the process of obtaining the target valley voltage ends. It should be noted that after operation S123, the determination of the target valley voltage corresponding to the read voltages in all stages for the next page may be started.

Figure 14A:
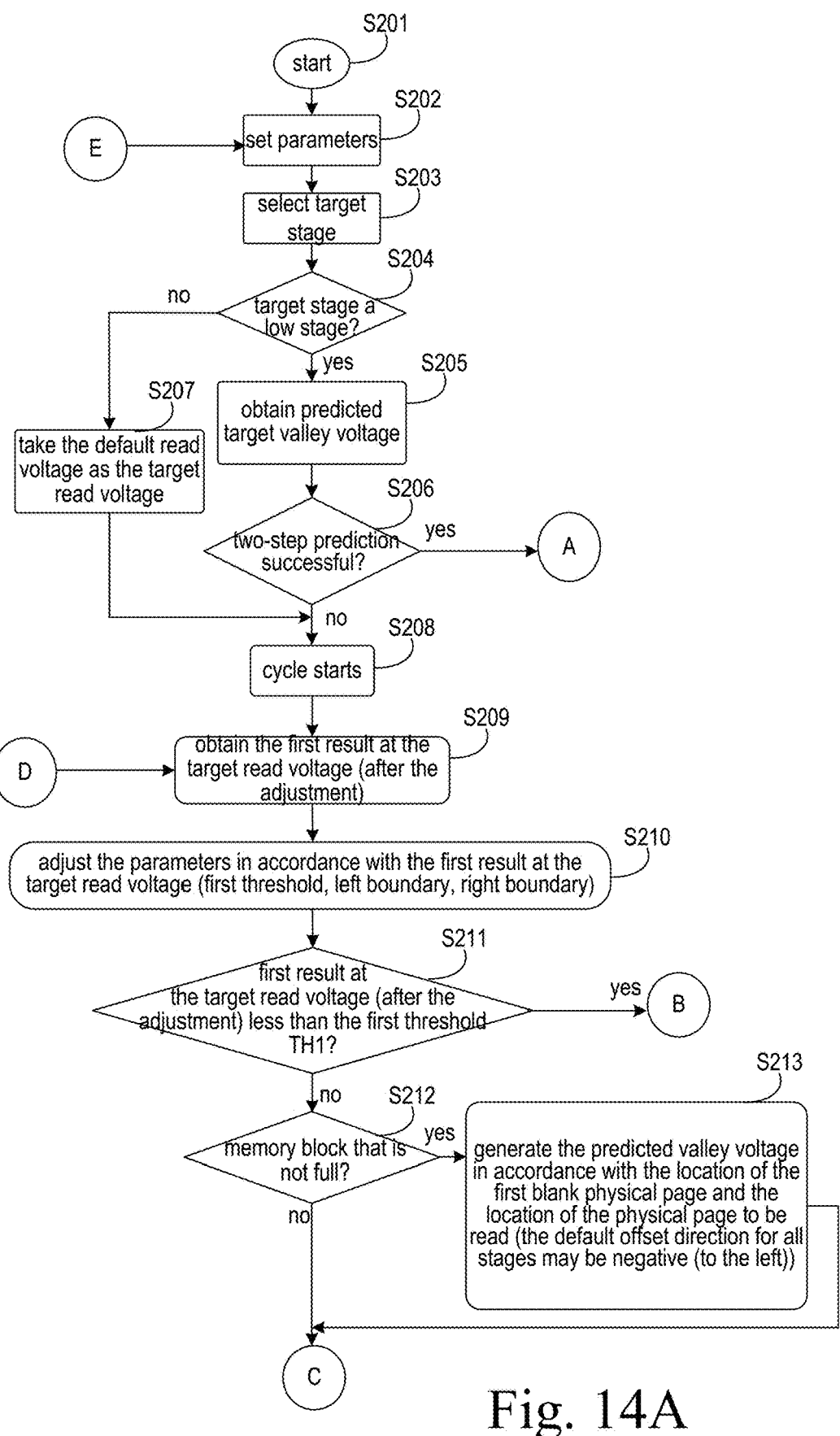
FIGS. 14A-14C are a flowchart of a method for operating a memory device provided by an example of the present application.
Figure 14B:
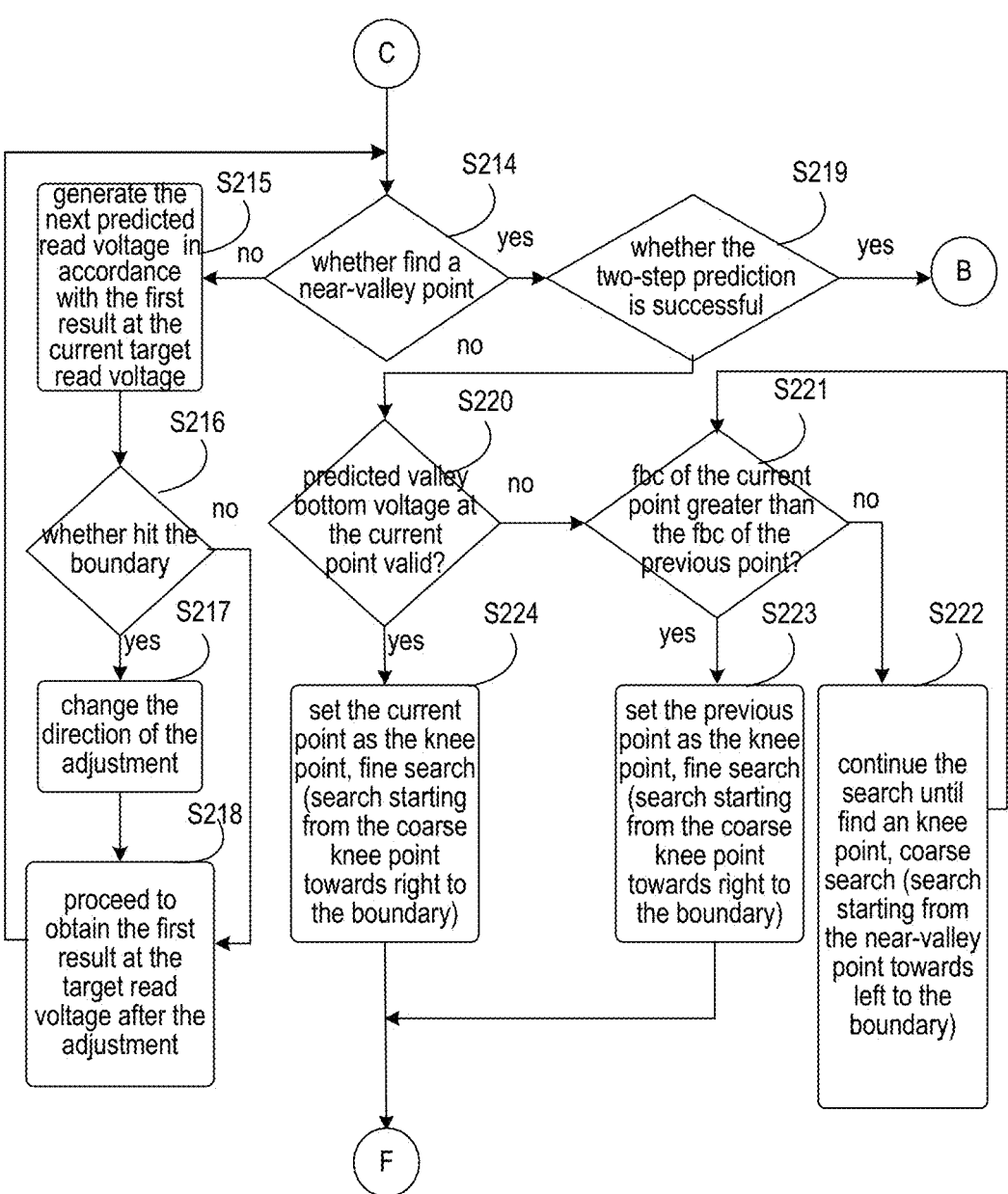
Figure 14C:
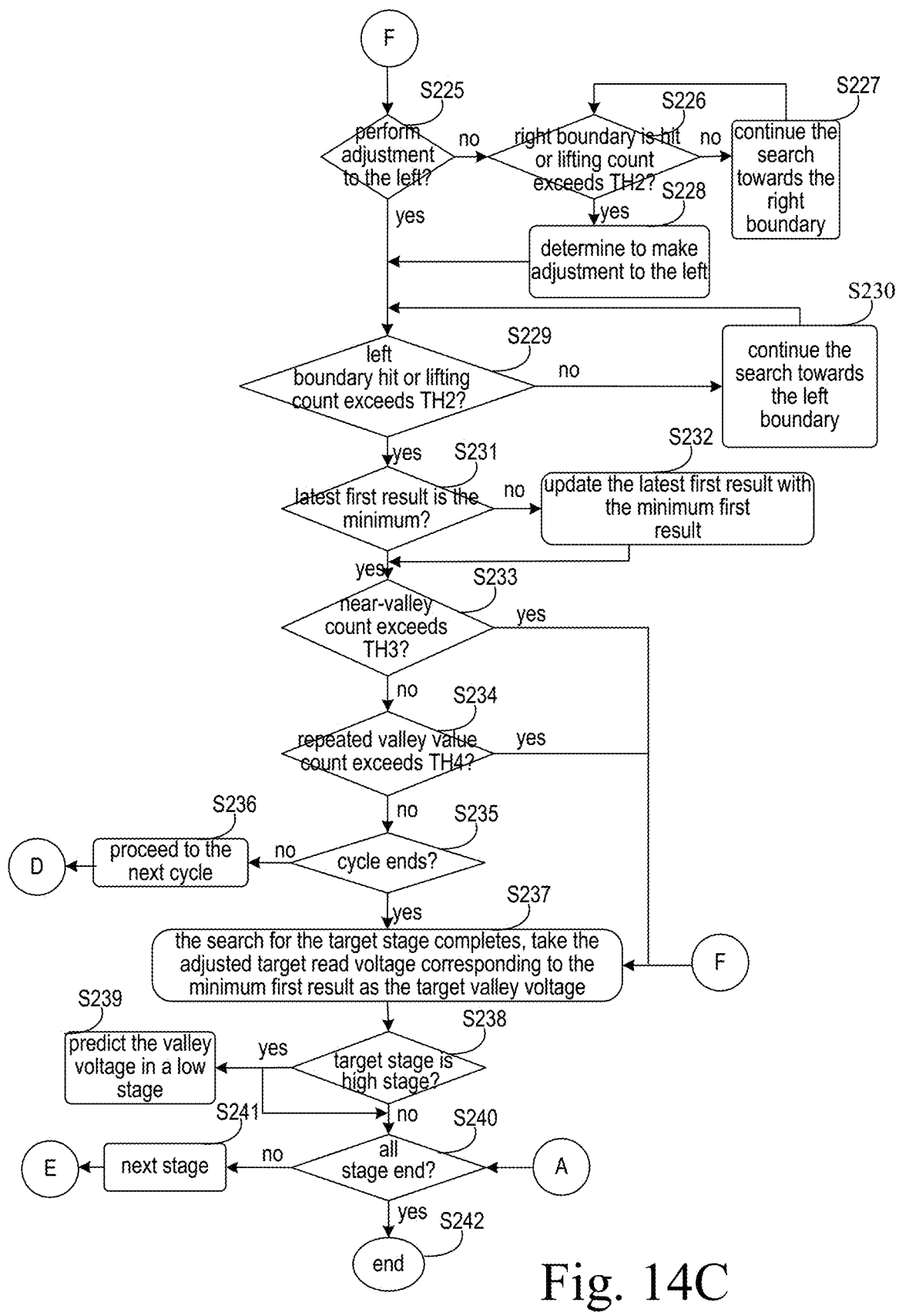

FIGS. 14A-14C are a flowchart of a method for operating a memory device provided by an example of the present application. The process of determining the target valley voltage will be described in detail below through FIGS. 14A-14C.

In operation S201, the program of obtaining the target valley voltage is triggered, and the process of obtaining the target valley voltage is started. Next, operation S202 is performed.

In operation S202, in some examples, the read mode of the memory device is set to a single-level read mode; here, the single-level read mode includes reading at least one bit of the storage data stored in the memory cell through a read voltage in one stage. Next, operation S203 is performed.

As mentioned above, in accordance with the memory cell including multiple storage bits, the multiple storage bits respectively correspond to multiple pages, and at least one page corresponds to multiple stages. When determining the target valley voltage, the target valley voltage among the read voltages in each of the at least one stage corresponding to each of the multiple pages is determined in sequence. In operation S203, one stage is selected as the target stage from the multiple stages corresponding to one page, and the target valley voltage corresponding to the read voltage in the target stage is first determined. For example, taking TLC as an example, the target valley voltages for the first-level read voltage L1 and the fifth-level read voltage L5 corresponding to the lower page is first determined, and one of L1 or L5 may be selected as the target stage. After the target stage is determined, operation S204 is performed.

In operation S204, the type to which the target stage belongs is mainly determined. Here, the target stage may be divided into two categories, the first stage (also referred to as high stage) and the second stage (also referred to as low stage), in which the read voltage in the first stage is greater than the read voltage in the second stage. For example, still taking the lower page of TLC as an example, L5 is in the first stage and L1 is in the second stage. If L1 is selected as the target stage in operation S203, the target stage is the second stage, which is the low stage; if L5 is selected as the target stage in operation S204, the target stage is the first stage, which is the high stage. If the target stage is a low stage, operation S205 is performed; if the target stage is a high stage, operation S207 is performed.

In operation S205, the predicted valley voltage is obtained, here, the predicted valley voltage is the predicted valley voltage corresponding to a low stage generated in accordance with the target valley voltage corresponding to a high stage and the related mapping function. Here and below, the related mapping function may be obtained by fitting a large number of experimental results before the memory device leaves the factory, and is stored in the memory device. Next, operation S206 is performed.

In operation S206, it is determined whether the two-operation prediction is successful. Here, the so-called two-operation prediction may include the first-operation prediction and the second-operation prediction, where the first-operation prediction is to generate a predicted valley voltage in a high stage, the method is to generate the predicted valley voltage in the high stage in accordance with the corresponding first result at the target read voltage (default read voltage), the stage number at which the high stage is, and the fourth mapping function; the second operation of prediction is to generate the predicted valley voltage in a low stage, and the method is to generate the predicted valley voltage in a low stage in accordance with the aforementioned predicted valley voltage in a high stage, the stage number at which the low stage is and the third mapping function. After the two-operation prediction, confirmation of the predicted valley voltage is not performed, and the predicted valley voltage in a high stage and the predicted valley voltage in a low stage are directly used for hard decode, if the hard decode passes, it indicates that the two-operation method prediction is successful, at this point, the search for the target valley voltage is directly stopped and operation S245 is performed; if the hard decode fails, it indicates that the two-operation prediction fails, at this point, the point corresponding to the predicted valley voltage is taken as the near-valley point for subsequent iterations, and operation S220 is continued. Operation S220 will be described in detail in the subsequent description.

It should be noted that if the hard decode fails, it indicates that the two-operation prediction is unsuccessful, at this point, the target valley voltage needs to be determined through search or also called loop (or iteration), therefore, when the two-operation prediction is unsuccessful, a loop process will be entered, after the two-operation fails, the search process may be performed directly from the beginning of the loop, e.g., moving from operation S206 to S208; The point corresponding to the predicted valley voltage may also be directly taken as the near-valley point for subsequent iterations, e.g., moving from operation S206 (S219) to S220.

If the target stage is a high stage, prepare to determine the target valley voltage in the high stage through search or loop. In operation S207, the default read voltage is taken as the target read voltage. Here, the target read voltage may be taken as an initial value for subsequent searches or loops. In some implementations, the default read voltage may be the read voltage at which the threshold voltage of the memory cell does not offset, e.g., the corresponding read voltage at which just written in, and the corresponding offset value at this point is 0 DAC. Operation S208 is performed after operation S207.

In operation S208, it is started to determine the target valley voltage by searching or looping. Operation S209 is performed after operation S208.

For the first performing of the loop, in operation S209, the first result at the target read voltage is obtained; it may be understood that for the subsequent performing of the loop, in operation S209, the first result at the adjusted target read voltage is obtained. Operation S210 is performed after operation S209.

In operation S210, parameters are determined or adjusted in accordance with the first result at the target read voltage, the parameters here may at least include a first threshold, a first boundary voltage (the location corresponding to the first boundary voltage is also referred to as the left boundary) and a second boundary voltage (the location corresponding to the second boundary voltage is also referred to as the right boundary). It may be understood that when performing a read operation, the further the threshold voltage of the memory cell deviates from the threshold voltage during writing, the first result of reading with the target read voltage will generally be larger, based on this, the value of the first result at the default read voltage may be used to confirm the first threshold, and the first threshold is to present the change (lifting) in the target valley voltage caused by the offset of the threshold voltage of the memory cell. Here, the initial first boundary voltage and the initial second boundary voltage may be set in accordance with empirical values, etc., for example, a relatively large range of the initial first boundary voltage and an initial second boundary voltage are first set, and then the initial first boundary voltage and the initial second boundary voltage are adjusted in accordance with the first result at the target read voltage, e.g., narrowing the range of a boundary voltage and a second boundary voltage, to obtain the first boundary voltage and the second boundary voltage. Operation S211 is performed after operation S10.

It should be noted that operation S210 is mainly for the process of performing the loop for the first time, and for the process of subsequent performing the loop, this operation may be skipped.

For the first performing of the loop, in operation S211, it is determined whether the first result at the target read voltage is less than the first threshold; it may be understood that for the subsequent performing of the loop, in operation S211, it is determined whether the first result at the adjusted target read voltage is less than the first threshold. When the determination result in operation S211 is yes, it may be considered that the corresponding first result at the adjusted target read voltage at this point may meet the needs of reading data decoding, move to S242, the loop ends, and the corresponding target valley voltage is output. When the determination result in operation S211 is no, operation S212 of the loop continues.

In operation S212, it is determined whether the target memory block is not full. Here, the target memory block is the memory block where at least one code word to be read is located. The memory blocks that are not full include memory blocks with two data states: program state and erase state. When the determination result in operation S212 is yes, operation S213 is performed; and when the determination result in operation S212 is no, operation S214 is performed.

It should be noted that operation S212 is mainly for the process of performing the loop for the first time, and for the process of subsequent performing the loop, this operation may be skipped. After skipping this operation, proceed to perform operation S214.

In operation S213, considering that the offset of the threshold voltage of memory cell in a memory block that is not full is more complicated compared to the offset of the threshold voltage of memory cell in a memory block that is full (a memory block that is full may be understood as a memory block whose writing time difference is less than the preset duration in the same application scenario as a memory block that is not full). Compared with the memory block that is full, the offset of the threshold voltage of memory cell in a memory block that is not full is related to the location of the first blank physical page in the memory block that is not full (the first blank physical page may be understood as the physical page in which the first data state appearing in the memory block that is not full is all erase state in accordance with the program sequence) and the location of the physical page to be read (the physical page where at least one code word to be read is located). Based on this, the predicted valley voltage may be generated in accordance with the first offset corresponding to the memory block that is full, the second offset corresponding to the location of the first blank physical page in the memory block that is not full, and the third offset corresponding to the location of the physical page to be read, and then proceed to operation S214. It is to be understood that the generated predicted valley voltage is more targeted than the blind adjustment of the target read voltage, and can shorten the search time to a certain extent and determine the target valley voltage faster.

In operation S214, it is determined whether a near-valley point is found. Here, the target read voltage after each adjustment is taken as the abscissa, and the corresponding first result at the corresponding adjusted target read voltage is taken as the ordinate, the abscissa and ordinate may form a point. In the process of making multiple adjustments to the target read voltage, the point corresponding to the first result that is less than the near-valley threshold for the first time among multiple corresponding first results at multiple adjusted target read voltages may be taken as the near-valley point. The near-valley threshold is to present the maximum among the corresponding first results at the read voltages near the target valley voltage. It should be noted that a difference exists between the near-valley threshold and the aforementioned first threshold, and when the first result is less than the near-valley threshold, it indicates that a more refined search may be carried out next; and when the first result is less than the first threshold, it indicates that the search may be considered to stop next. When the determination result in operation S214 is yes, operation S219 is performed; and when the determination result in operation S214 is no, operation S215 is performed.

In operation S215, when the near-valley point is not found, enter operation S215, where based on the corresponding first result at the target read voltage after the previous adjustment and the associated mapping function (e.g., the aforementioned second mapping function), the predicted read voltage after next adjustment is generated, that is, prediction iteration is performed by using the aforementioned prediction equation or mapping function. Operation S216 is performed after operation S215.

In operation S216, it is determined whether the generated predicted read voltage after next adjustment hits the boundary. The boundary here may be one of the aforementioned left boundary or right boundary, and hitting the boundary may be understood as being exactly on the boundary, or beyond the boundary. When the determination result in operation S216 is yes, operation S217 is performed; and when the determination result in operation S216 is no, operation S218 is performed.

In operation S217, the adjustment direction is changed. Here, in the process of making adjustment the target read voltage, there are two adjustment directions, namely positive (to the right) and negative (to the left). Adjusting the offset direction may be understood as adjusting to the right before, and then starting to adjust to the left after hitting the right boundary; or adjusting to the left before, and starting to adjust to the right after hitting the left boundary. Operation S218 is performed after operation S217.

In operation S218, a first result for the adjusted target read voltage is obtained. After operation S218, operation S214 is performed, that is to say, after each adjustment of the target voltage is performed and the corresponding first result is obtained, it will be continued to determine whether the latest adjustment point is a near-valley point. Here, one or more adjustments are made until the near-valley point is found.

It should be noted that if the next loop is entered because the subsequent conditions are not met during the operations after finding the near-valley point, operations S215 to S218 may be skipped.

In operation S219, referring to the description in operation S206, in the process of entering a loop when the two-operation prediction is unsuccessful, the point corresponding to the predicted valley voltage may also be directly taken as the near-valley point for subsequent iterations, e.g., moving from operation S219 to S220.

In operation S220, it is determined whether predicted valley voltage at the current point (the latest adjusted target read voltage) is valid. In some examples, it may be determined that the predicted valley voltage is valid by the fact that the corresponding first result at the latest adjusted target read voltage is less than the first threshold. It should be noted that although in operation S211, when the first result at the (adjusted) target read voltage is not less than the first threshold, S212 and subsequent operations are entered, but before the determination result in operation S214 is yes, at least one adjustment has been made to the target read voltage, thus at this point, the new adjusted target read voltage may be less than the first threshold. When the determination result in operation S220 is yes, operation S224 is performed; when the determination result in operation S220 is no, operation S221 is performed.

In operation S221, it is determined whether the first result FBC of the current point is greater than the FBC of the previous point. Here, after finding the near-valley point and starting to perform a coarse search for the knee point to the left, generally the magnitude of FBC will first decrease and then increase, and when the first result FBC of the current point is greater than the FBC of the previous point, it indicates that FBC will further increase during the subsequent adjustment to the left, and the previous point is a relatively small point, at this point, the previous point is set as the knee point. In some examples, the step size used in the coarse search may be a larger step size, e.g., it may be 5DAC-15DAC, in some examples, it may be 5DAC, 10DAC or 15DAC. Based on this, when the determination result in operation S221 is yes, operation S223 is performed; and when the determination result in operation S221 is no, operation S222 is performed.

In operation S222, starting from the near-valley point, a coarse search is performed to the left, and after each search, the FBC is compared with the FBC of the previous search until a point where decrease stops and increase starts is found. After finding this point, it indicates that operation S222 has been completed and then move to operation S223.

In operation S223, the previous point (e.g., the aforementioned point where decrease stops and increase starts) is set as an knee point, and a fine search starts from the knee point to the right. In some examples, the step size used in the fine search may be a small step size, e.g., it may be 1DAC-4DAC, in some examples, it may be 2DAC or 3DAC. Operation S225 is performed after operation S223.

In operation S224, the current point is set as the knee point, and a fine search starts from the knee point to the right. In some examples, the step size used in the fine search may refer to operation S223. Operation S225 is performed after operation S224.

In operation S225, it is determined whether to adjust the target read voltage to the left. When the determination result in operation S225 is yes, operation S229 is performed; when the determination result in operation S225 is no, operation S226 is performed.

In operation S226, the target read voltage is adjusted to the right, and in the process of adjusting the target read voltage to the right, it is determined whether the right boundary is hit or the lifting count (or count for upward trend, when a corresponding first result at the target read voltage after a next adjustment is greater than the corresponding first result at the target read voltage after a previous adjustment, one for upward trend is counted) exceeds the preset number TH2. In some examples, the preset number is 3-7, in one example, the preset number of may be 3, 5, or 7. When the determination result in operation S226 is yes, operation S228 is performed; when the determination result in operation S226 is no, operation S227 is performed.

In operation S227, when the right boundary is not hit or the lifting count does not exceed the preset number TH2, the search continues to the right boundary, and a determination is made after each search until the right boundary is hit or the lifting count exceeds the preset number TH2. That is to say, when operation S227 is completed, the operations may move to operation S228.

In operation S228, the target read voltage starts to be adjusted to the left.

In operation S229, during the process of adjusting the target read voltage to the left, it is determined whether the left boundary or the lifting count is hit. The lifting count here may be understood with reference to the aforementioned operation S226. The thresholds for left and right lifting counts are generally set to the same value. When the determination result in operation S229 is yes, operation S231 is performed; and when the determination result in operation S229 is no, operation S230 is performed.

In operation S230, when the left boundary is not hit or the lifting count does not exceed the preset number TH2, the search continues to the left boundary, and a determination is made after each search until the left boundary is hit or the lifting count exceeds the preset number TH2. That is to say, when operation S230 is completed, the operations may move to operation S231.

In operation S231, it is determined whether the latest first result is the minimum. Here, the latest first result refers to whether the first result at the adjusted target read voltage after the previous adjustment of the target read voltage is the minimum. At this point, it is necessary to traverse at least all the searched points in this loop to find the adjusted target read voltage corresponding to the point with the minimum first result. When the determination result in operation S231 is yes, operation S233 is performed; and when the determination result in operation S231 is no, operation S232 is performed.

In operation S232, the latest first result is updated with the found minimum first result. Operation S233 is performed after operation S232.

In operation S233, it is determined whether the near-valley count exceeds the preset number TH3. Here, taking the minimum first result among multiple corresponding first results at the target read voltages after multiple adjustments as a reference value, if the number of first results from remaining first results which differ from the reference value with a difference being less than a second threshold (equal to the aforementioned preset difference) is greater than the preset number, then the searching is stopped and the target read voltage corresponding to the minimum first result among the multiple first results is taken as the target valley voltage. In some examples, a second threshold (equal to the aforementioned preset difference) and the preset quantity may be set together in accordance with the actual situation, generally, if the second threshold (equal to the aforementioned preset difference) is set slightly larger, the preset quantity will be relatively larger; and if the second threshold (equal to the aforementioned preset difference) is set slightly smaller, the preset quantity will also be relatively smaller. When the determination result in operation S233 is yes, the search is stopped and operation S237 is performed; when the determination result in operation S233 is no, enter the next determination and operation S234 is performed.

In operation S234, it is determined whether the repeated valley value count exceeds the preset count TH4. Here, in the process of making multiple adjustments to the target read voltage, different adjustment methods may be employed for adjustment, in accordance with the adjusted target read voltage corresponding to more than preset number of adjustment methods among different adjustment methods is the same, and the corresponding first result at the same target read voltage is the minimum value among all first results, the same target read voltage is taken as the target valley voltage. In some examples, the preset number is 2-4, in one example, the preset number may be 2, 3, or 4. When the determination result in operation S234 is yes, the search is stopped and operation S237 is performed; when the determination result in operation S234 is no, enter the next determination and operation S235 is performed.

It should be noted that operation S233 and operation S234 belong to different determination methods, and the locational relationship between them may be interchanged, that is to say, the repeated valley count may be first determined, and then a near-valley count may be determined if the repeated valley count does not meet the conditions. It is understood that other determinations may also be performed here to determine whether the loop ends.

In operation S235, it is determined whether the loop ends. When the determination result in operation S235 is yes, operation S237 is performed; and when the determination result in operation S235 is no, operation S236 is performed.

In operation S236, enter the next loop and searching continues. Operation S236 may move to operation S209.

In operation S237, the target stage search is completed, the adjusted target read voltage corresponding to the minimum first result is taken as the target valley voltage. Operation S238 is performed after operation S237.

In operation S238, it is determined whether the target stage is a high stage. When the determination result in operation S238 is yes, operation S239 is performed; and when the determination result in operation S238 is no, operation S240 is performed.

In operation S239, a predicted valley voltage in a low stage is generated in accordance with the target valley voltage in a high stage. Here, the predicted valley voltage in a low stage may be generated through the target valley voltage in a high stage, the stage number at which the low stage is and the related mapping function (e.g., the aforementioned fourth mapping function). Operation S240 is performed after operation S239.

In operation S240, it is determined whether corresponding target valley voltages have been determined for read voltages in all the stages contained on this page. When the determination result in operation S240 is yes, it indicates that target valley voltages corresponding to read voltages in all the stages contained on this page have been determined, and operation S242 may be performed at this point; and when the determination result in operation S240 is no, it indicates that target valley voltages corresponding to read voltages in some of the stages contained on this page have not been determined, and operation S241 may be performed at this point.

In operation S241, for the stages in which the target valley voltages are not determined, the target valley voltage in each of the stages is determined in sequence. Operation S236 may move to operation S202.

In operation S242, the process of obtaining the target valley voltage ends. It should be noted that after operation S242, the determination of the target valley voltage corresponding to the read voltages in all stages for the next page may be started.

It should be noted that the methods disclosed in the examples of the present application are able to solve many problems existing in the re-reading operation, but are not used to limit the application scenarios in the examples of the present application, and the methods disclosed in the examples of the present application are also applicable to conventional read operations.

Figure 15:
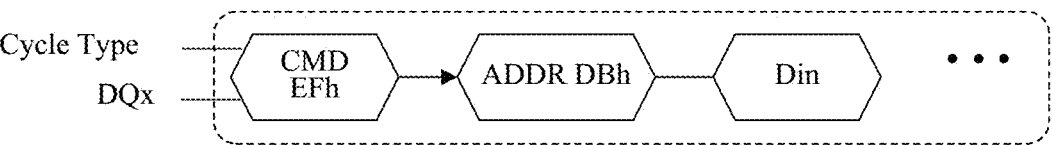
FIG. 15 is an example timing diagram for enabling a single-level read mode operation provided by the present application.

FIG. 15 is an example timing diagram for enabling a single-level read mode operation provided by the present application. DQx may be represented as a data bus signal, and Cycle Type may further represent the type of data bus signal.

As shown in FIG. 15, the set function command may include, e.g., a subcommand (e.g., EFh), in one example, the memory device enables the single-level read mode upon receiving a subcommand EFh. In the single-level read mode, the memory device transmits the address ADDR of the data to be read (e.g., two column addresses C1 to C2 and three row addresses R1 to R3) between received subcommands 00h and 30h. During the reading time, the corresponding data DATA (e.g., Dn) in the page of the receiving address may be buffered in the page buffer, and then the data DATA will be read on demand. It should be noted that in the example described above, transmission of the data corresponding to a page (e.g., Dn) needs to be frequently performed (Din/Dout) between the memory device and the memory controller when performing a read retry operation, and transmission of the data consumes a long time.

Figure 16:
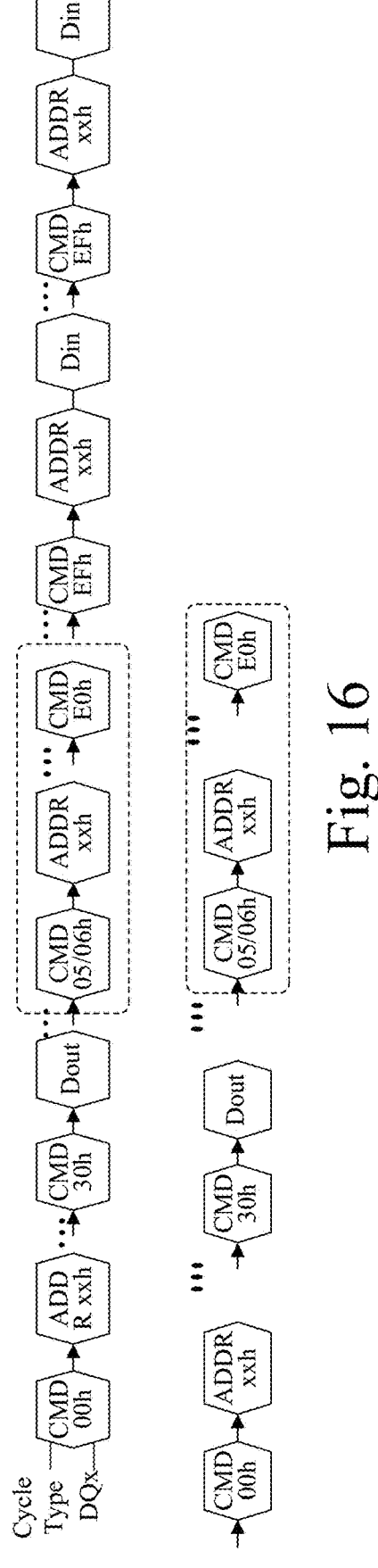
FIG. 16 is a timing diagram of predicting the valley voltage/target valley voltage and performing the read operation provided by an example of the present application.

FIG. 16 is a timing diagram for determining the target valley voltage and performing a read operation provided by an example of the present application. As shown in FIG. 16, the read command may include, e.g., two subcommands (e.g., 00h and 30h), and in one example, the memory device transmits the address ADDR of the data to be read (e.g., two column addresses C1 to C2 and three row addresses R1 to R3) between received subcommands 00h and 30h. After the memory device receives the subcommand 30h, during the reading time, the corresponding data DATA (e.g., Dn) in the page of the receiving address may be buffered in the page buffer, and then the data DATA will be read on demand. It should be noted that in the example described above, data corresponding to a physical page needs to be frequently transmitted between the memory device and the memory controller when performing a read retry operation, and it takes a long time to transmit the data. In an example, the memory device 104 transmits the address ADDR of the data to be read (e.g., two column addresses C1 to C2 and three row addresses R1 to R3) between received subcommands 00h and 30h. The memory device 104, after receiving the sub-command 30h, receives the sub-commands EFh and xxh of the first second instruction/the second instruction, the memory device 104 obtains corresponding first result at the code word at respective read voltage under the instruction of the first second instruction/the second instruction, and sends the obtained first result to the memory controller. The memory controller determines a target valley voltage in accordance with the multiple first results corresponding to multiple different read voltages received from the memory device respectively; and perform a read operation on data stored in the memory device in accordance with the target valley voltage.

As shown in FIG. 16, in some other examples, the first instruction/second instruction includes subcommands 05/06h and E0h, and in the process of determining the target valley voltage, there are only two timings for the subcommands 05/06h and E0h at most. In an example, one subcommand 05/06h and E0h means to control at least one code word of the memory device to perform a read operation, and to perform an error correction decode operation on the read result of the read operation, in the process of determining the target valley voltage, one read operation may be performed at most twice, and then two error correction decode operations may be performed at most, decoding at least one code word may be achieved with the minimum number of iterations (up to 2), thus greatly improving decode efficiency.

In some examples, the memory controller 106 is configured to: send a first instruction including subcommands 05/06h and E0h to instruct the memory device to perform a first read operation; the memory device 104 is configured to: receive the first instruction, perform a first read operation with the predicted valley voltage in the information representing the predicted valley voltages of the multiple stages; and send the obtained information representing the first read result of the first read operation to the memory controller; the memory controller 106 is further configured to: perform a second error correction decode operation on the first read result of the first read operation.

In some examples, the memory controller 106 is configured to: output the first read result in accordance with the success of the first error correction decode; or, in accordance with the failure of the first error correction decode, send a second instruction including subcommands 05/06h and E0h to instruct the memory device to perform a second read operation; the memory device 104 is configured to: receive the second instruction, perform a second read operation with the predicted valley voltage in the re-obtained information representing the predicted valley voltages of the multiple stages; and send the obtained information representing the second read result of the second read operation to the memory controller; the memory controller 106 is further configured to: perform a second error correction decode operation on the second read result of the second read operation. It should be noted that the second instruction provided in the example of the present application is only an example and should not unduly limit the claimed scope of the present application. In some examples, the data amount of the first result is less than the preset data amount threshold, e.g., the data amount of the first result ranges from 1 byte to 4 byte, therefore, in the process of determining the target valley voltage, the data transferred between the memory device and the memory controller is in small amount and at a fast speed, which is beneficial to improving the overall speed of the read operation.

It should be noted that the examples mentioned in the first to second parts of this application do not include the timing of the two subcommands 05/06h and E0h as shown in FIG. 16.

Figure 17:
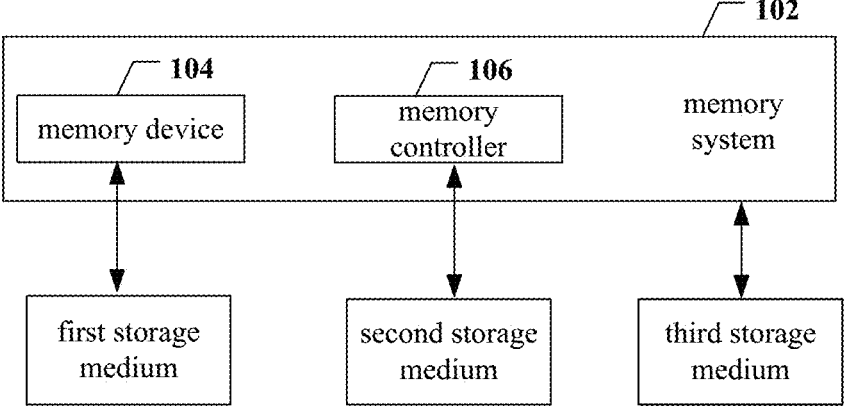
FIG. 17 is a schematic structural diagram of a storage medium provided by an example of present application.

Referring to FIG. 17, FIG. 17 is a schematic structural diagram of a storage medium provided by an example of present application. In a seventh aspect, an example of the present disclosure provides a storage medium, as shown in FIG. 17, executable instructions are stored on the storage medium, and the executable instructions, when executed by a processor, implement the operations of any one of the operating methods provided by the fourth aspect, the fifth aspect and the sixth aspect.

In some examples, the storage medium may be memory such as Ferromagnetic Random Access Memory (FRAM), Read Only Memory (ROM), Programmable Read-Only Memory (PROM), Erasable Programmable Read-Only Memory (EPROM), Electrically Erasable Programmable Read-Only Memory (EEPROM), Flash Memory, Magnetic Surface Memory, Optical Disk, or Compact Disc Read-Only Memory (CD-ROM); or may also be various devices including one or any combination of the memory devices described above.

In some examples, executable instructions may take the form of a program, software, software module, script, or code, written in any form of programming language (including compiled or interpreted languages, or declarative or procedural languages), and may be deployed in any form, including as a stand-alone program or as a module, component, subroutine, or other unit suitable for use in a computing environment.

As an example, executable instructions may, but do not necessarily correspond to, files in a file system, and may be stored as part of a file holding other programs or data, e.g., one or more scripts stored in a HyperText Markup Language (HTML) document, stored in a single file specific to the program discussed, or stored in multiple collaborative files (e.g., a file that stores one or more modules, subroutines, or portions of code).

As examples, executable instructions may be deployed to execute on one electronic device, or on multiple electronic devices located at one location, or to execute on multiple electronic devices distributed across multiple locations and interconnected by a communications network.

FIG. 17 is a schematic structural diagram of a storage medium provided by an example of present application; the storage medium includes a first storage medium corresponding to the memory device 104, a second storage medium corresponding to the memory controller 10, and a third storage medium corresponding to the memory system 102; when the executable instructions are executed by the memory device, the first storage medium may be used to implement the operations of the method for operating the memory device in the examples of the present application described above; when the executable instructions are executed by the memory controller, the second storage medium may be used to implement the operations of the operating method for the memory controller in the examples of the present application described above; when the executable instructions are executed by the memory system, the third storage medium may be used to implement the operations of the operating method for the memory system in the examples of the present application described above.

In a memory device and its operating method, and a memory system and its operating method provided by examples of the present application, by transmitting a first result (size of the first result may be several bytes) instead of at least one code word (e.g. code word size may be 4 KB), the amount of data transferred by the memory device is reduced; since the first boundary voltage and the second boundary voltage are generated in accordance with the corresponding first result at the target read voltage and correspond to a dynamic first threshold, the iterative convergence speed of determining the target valley voltage is faster; the process of obtaining the first result is converged inside the memory device and does not occupy space of, e.g., a memory controller, thus is less dependent on, e.g., a memory controller; the transmission time of the input and output ports of the memory device and/or the time of the error correction decode operation of the memory controller is reduced; saves the iteration time of the memory controller error correction decode algorithm is saved, and the error correction decode speed is faster; therefore suitable for MLC, TLC or QLC type memory devices/memory systems.

The memory device and its operating method, the memory system and its operating method provided by the examples of the present application are able to effectively avoid the problems of long time consumption and incomplete scene coverage caused by using the retry table, and to save the space occupied by the retry table, find the target valley voltage more quickly and accurately, thereby effectively reducing the time delay in determining the target valley voltage. Meanwhile performing read operations at the obtained target valley voltage greatly increases the probability of correctly reading the storage data, thus improving product reliability and user experience.

It should be understood that reference throughout the description to "one example" or "an example" means that a particular feature, structure or characteristic related to the example is included in at least one example of the present application. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present application, sequence numbers of the processes described above do not mean the execution sequence, and the execution sequence of each process should be determined by its function and internal logic, and should not constitute any limitation to implementation process of examples of the present application. The serial numbers of examples of the present application described above are for the purpose of description only, and do not represent the advantages and disadvantages of the examples.

The above is only a preferred example of the present application, and does not limit the patent scope of the present application, and under the inventive concept of the present application, any equivalent structural transformation made by using content of the present application and the accompanying drawings, or direct/indirect application in other related technical fields are included in the patent protection scope of the present application.

INDUSTRIAL APPLICABILITY

The memory device and its operating method, the memory system and its operating method provided by the examples of the present application are able to effectively avoid the problems of long time consumption and incomplete scene coverage caused by using the retry table, and to save the space occupied by the retry table, find the target valley voltage more quickly and accurately, thereby effectively reducing the time delay in determining the target valley voltage. Meanwhile performing read operations at the obtained target valley voltage greatly increases the probability of correctly reading the storage data, thus improving product reliability and user experience.

What is claimed is:

1. A memory device, comprising:
an array of memory cells including multiple memory cells, a preset number of the multiple memory cells forming one code word;
a peripheral circuit coupled to the array of memory cells and configured to:
perform a first read operation on at least one code word at a first read voltage and a second read operation on the at least one code word at a second read voltage, the second read voltage being different from the first read voltage by less than a preset voltage, a range of the preset voltage being 6 mV to 21 mV;
determine a first result based on a number of bits flipped between a first read result corresponding to the first read voltage and a second read result corresponding to the second read voltage;
generate a first boundary voltage and a second boundary voltage varying based on the first result corresponding to the at least one code word at a target read voltage;
make adjustments to the target read voltage by a first step size and a second step size less than the first step size, and obtain the corresponding first result at the adjusted target read voltage after a respective adjustment; in a process of the adjustments at the first step size, change a current direction of an adjusted voltage in accordance with the target read voltage after one adjustment of the adjustments exceeding a range defined by the first boundary voltage and the second boundary voltage; and
determine a target valley voltage in accordance with the corresponding first result at the adjusted target read voltage meeting a preset condition, the target valley voltage being taken as a read voltage at which a read operation is performed on the at least one code word.

2. The memory device of claim 1, wherein:
one memory cell of the multiple memory cells includes multiple storage bits, and the multiple storage bits correspond to read voltages in multiple stages; and
the peripheral circuit is configured to:
obtain an initial first boundary voltage and an initial second boundary voltage corresponding to a target stage in the multiple stages;
adjust the initial first boundary voltage and the initial second boundary voltage corresponding to the target stage to obtain the first boundary voltage and the second boundary voltage corresponding to the target stage, in accordance with a first result corresponding to the at least one code word at a target read voltage in the target stage; and
determine a target valley voltage corresponding to the target stage, in accordance with a corresponding first result at an adjusted target read voltage in the target stage meeting the preset condition.

3. The memory device of claim 2, wherein;
the range defined by the initial first boundary voltage and the initial second boundary voltage is smaller than a first preset range; and
the peripheral circuit is configured to:
expand the range defined by the initial first boundary voltage and the initial second boundary voltage corresponding to the target stage to obtain the first boundary voltage and the second boundary voltage corresponding to the target stage, in accordance with the first result corresponding to the at least one code word at the target read voltage in the target stage being greater than a first preset value.

4. The memory device of claim 3, wherein; the peripheral circuit is configured to perform one of:

expanding the range defined by the initial first boundary voltage and the initial second boundary voltage corresponding to the target stage by way of offsetting both of the initial first boundary voltage and the initial second boundary voltage corresponding to the target stage in a decreasing direction; and expanding the range defined by the initial first boundary voltage and the initial second boundary voltage corresponding to the target stage by way of offsetting both of the initial first boundary voltage and the initial second boundary voltage corresponding to the target stage in an increasing direction.

5. The memory device of claim 2, wherein;

the range defined by the initial first boundary voltage and the initial second boundary voltage is larger than a second preset range; and the peripheral circuit is configured to:

narrow the range defined by the initial first boundary voltage and the initial second boundary voltage corresponding to the target stage to obtain the first boundary voltage and the second boundary voltage corresponding to the target stage, in accordance with the first result corresponding to the at least one code word at the target read voltage in the target stage being less than a second preset value.

6. The memory device of claim 2, wherein the peripheral circuit is configured to:

make M first adjustments of the adjustments with the first step size to the target read voltage to be adjusted, and obtain M corresponding first results at a first set of target read voltages after each of the M first adjustments respectively;

take a minimum first result among the M corresponding first results as a knee-point value, and a read voltage corresponding to the knee-point value being a knee-point voltage;

make N second adjustments of the adjustments to the knee-point voltage with the second step size, and obtain N corresponding first results at a second set of target read voltages after each of the N second adjustments respectively; M and N being both positive integers greater than 1; and the N corresponding first results being obtained after the M corresponding first results; and determine the target valley voltage in accordance with the N corresponding first results at an obtained target read voltage after the N second adjustments meeting a preset condition.

7. The memory device of claim 6, wherein the peripheral circuit is configured to:

before making the M first adjustments to the target read voltage to be adjusted, generate a first threshold in accordance with the first result corresponding to the at least one code word at the target read voltage, wherein the first threshold is configured to indicate a maximum among the corresponding first results at the target read voltages near the target valley voltage;

in accordance with the corresponding first result at the adjusted target read voltage being greater than or equal to the first threshold, generate a target read voltage after a next adjustment based on a corresponding first result at a target read voltage after a previous adjustment, until the corresponding first result at the adjusted target read voltage is less than the first threshold; and after the corresponding first result at the adjusted target read voltage is less than the first threshold, make the M first adjustments with the first step size to the target read voltage to be adjusted.

8. The memory device of claim 7, wherein:

the first boundary voltage is less than the second boundary voltage; and the peripheral circuit is configured to:

starting from the first boundary voltage, adjust the target read voltage in an increasing direction, in accordance with the target read voltage generated after the next adjustment being less than or equal to the first boundary voltage; or starting from the second boundary voltage, adjust the target read voltage in a decreasing direction, in accordance with the target read voltage generated after the next adjustment being greater than or equal to the second boundary voltage.

9. The memory device of claim 7, wherein the peripheral circuit is configured to:

take, as a near-valley voltage, the adjusted target read voltage corresponding to the first result that is less than the first threshold for a first time among multiple corresponding first results at target read voltages after multiple adjustments; and in a process of making the M first adjustments to the near-valley voltage with the first step size, starting from the near-valley voltage, make adjustments in a first direction with the first step size until the corresponding first result at the adjusted target read voltage in the first direction is greater than the first threshold; and starting from the near-valley voltage, make adjustments in a second direction opposite to the first direction with the first step size until the corresponding first result at the adjusted target read voltage in the second direction is greater than the first threshold.

10. The memory device of claim 7, wherein the peripheral circuit is configured to:

generate the first threshold in accordance with the corresponding first result at the target read voltage and a first mapping function; wherein the first mapping function is to present a relationship between the first threshold and the corresponding first result at the target read voltage; and generate a predicted value of the target read voltage after the next adjustment in accordance with the corresponding first result at the target read voltage after the previous adjustment, and a second mapping function and a stage number at which the target stage is, wherein the second mapping function is configured to indicate a relationship between the corresponding first result at the target read voltage after the previous adjustment, the stage number at which the target stage is, and the predicted value of the target valley voltage in the target stage.

11. The memory device of claim 6, wherein the peripheral circuit is configured to:

in a process of making the N second adjustments to the knee-point voltage with the second step size, starting from the knee-point voltage, make adjustments in two opposite directions with the second step size, in the process of making adjustments in each direction, count one for upward trend when the corresponding first result at the target read voltage after the next adjustment is greater than the corresponding first result at the target read voltage after a previous adjustment, and determine a third boundary voltage and a fourth boundary voltage in accordance with a total counted number being greater than or equal to a preset number; and in the process of making adjustments in each direction, when a corresponding first result at a target read voltage after one adjustment is lower than a second threshold, take the minimum first result among multiple corresponding first results at the target read voltages after the adjustments in each direction as a reference value, when the number of first results among remaining first results which differ from the reference value with a difference being less than a third threshold is greater than a preset number, stop the adjustments and take, as the target valley voltage, the read voltage corresponding to the minimum first result among the multiple corresponding first results.

12. The memory device of claim 11, wherein the peripheral circuit is configured to:

in the process of making adjustments in each direction, take the corresponding adjusted target read voltages as the third boundary voltage and the fourth boundary voltage, respectively, in accordance with the total counted number being equal to the preset number;

in the process of making the adjustments in each direction, when the third boundary voltage and the fourth boundary voltage have been determined, obtain the corresponding first result at the target read voltage after a last adjustment, the target read voltage after the last adjustment being an average of the third boundary voltage and the fourth boundary voltage; and take, as the target valley voltage, the read voltage corresponding to the minimum first result among the multiple corresponding first results at all the adjusted target read voltages.

13. The memory device of claim 2, wherein:

the array of memory cells includes memory cells with multiple storage bits, and the multiple storage bits correspond to multiple pages respectively; at least part of the pages corresponding to multiple stages, the multiple stages including a first stage and a second stage, and the read voltage in the second stage being less than the read voltage in the first stage; and the peripheral circuit is configured to:

generate a target valley voltage in the second stage of the multiple stages or a target valley voltage in other first stage corresponding to a lower read voltage with the target valley voltage in accordance with a target valley voltage in the first stage to which a stage number corresponding to the target valley voltage belonging.

14. The memory device of claim 1, wherein the peripheral circuit is configured to:

read storage data of the at least one code word at the first read voltage to obtain a second result;

read the storage data of the at least one code word at the second read voltage to obtain a third result;

perform a logical operation on the second result and the third result to obtain a fourth result; and count the number of bits in the fourth result which represent flip of bits in the third result relative to the second result to obtain the first result.

15. The memory device of claim 14, wherein the peripheral circuit includes:

a first latch configured to: store the second result;

a second latch configured to: store the third result; and a third latch configured to: store the fourth result.

16. A memory system, comprising:

one or more memory devices, comprising:

an array of memory cells including multiple memory cells, a preset number of the multiple memory cells forming one code word;

a peripheral circuit coupled to the array of memory cells and configured to:

perform a first read operation on at least one code word at a first read voltage and a second read operation on the at least one code word at a second read voltage, the second read voltage being different from the first read voltage by less than a preset voltage, a range of the preset voltage being 6 mV to 21 mV;

determine a first result based on a number of bits flipped between a first read result corresponding to the first read voltage and a second read result corresponding to the second read voltage;

generate a first boundary voltage and a second boundary voltage varying based on the first result corresponding to the at least one code word at a target read voltage;

make adjustments to the target read voltage by a first step size and a second step size less than the first step size, and obtain the corresponding first result at the adjusted target read voltage after a respective adjustment; in a process of the adjustments at the first step size, change a current direction of an adjusted voltage in accordance with the target read voltage after one adjustment of the adjustments exceeding a range defined by the first boundary voltage and the second boundary voltage; and determine a target valley voltage in accordance with the corresponding first result at the adjusted target read voltage meeting a preset condition, the target valley voltage being taken as a read voltage at which a read operation is performed on the at least one code word; and a memory controller coupled to the one or more memory devices and controlling the one or more memory devices.

17. The memory system of claim 16, wherein the memory controller is configured to: send a first instruction before performing a read operation on data stored in a memory device, wherein the first instruction indicates an instruction to obtain information representing the target valley voltage;

the memory device is configured to: receive the first instruction, obtain the information representing the target valley voltage, and send the obtained information representing the target valley voltage to the memory controller; and the memory controller is further configured to: control the memory device to perform a read operation with the target valley voltage, and perform an error correction decode operation on a read result of the read operation.

18. A memory controller, comprising:

a control component configured to:

generate a first boundary voltage and a second boundary voltage in accordance with a first result corresponding to at least one code word at a target read voltage, wherein the at least one code word is formed by a preset number of memory cells of an array of memory cells in at least one memory device coupled to the memory controller; wherein:

a first read operation is performed on at least one code word at a first read voltage, and a second read operation is performed on the at least one code word at a second read voltage, the second read voltage being different from the first read voltage by less than a preset voltage, a range of the preset voltage being 6 mV to 21 mV; and a first result is determined based on a number of bits flipped between a first read result corresponding to the first read voltage and a second read result corresponding to the second read voltage;

make adjustments to the target read voltage by a first step size and a second step size less than the first step size, and obtain the corresponding first result at the adjusted target read voltage after a respective adjustment; in a process of the adjustments at the first step size, change a current direction of an adjusted voltage in accordance with the target read voltage after one adjustment of the adjustments exceeding a range defined by the first boundary voltage and the second boundary voltage; and determine a target valley voltage in accordance with the corresponding first result at the adjusted target read voltage meeting a preset condition, the target valley voltage being taken as a read voltage at which a read operation is performed on the at least one code word.

19. The memory controller of claim 18, wherein:

one memory cell of the memory cells includes multiple storage bits, and the multiple storage bits correspond to read voltages in multiple stages; and the control component is configured to:

obtain an initial first boundary voltage and an initial second boundary voltage corresponding to a target stage in the multiple stages;

adjust the initial first boundary voltage and the initial second boundary voltage corresponding to the target stage to obtain the first boundary voltage and the second boundary voltage corresponding to the target stage, in accordance with the first result corresponding to the at least one code word at a target read voltage in the target stage; and determine the target valley voltage corresponding to the target stage in accordance with the corresponding first result at the adjusted target read voltage in the target stage meeting the preset condition.

20. The memory controller of claim 19, wherein;

the range defined by the initial first boundary voltage and the initial second boundary voltage is smaller than a first preset range; and the control component is configured to:

expand the range defined by the initial first boundary voltage and the initial second boundary voltage corresponding to the target stage to obtain the first boundary voltage and the second boundary voltage corresponding to the target stage, in accordance with the first result corresponding to the at least one code word at the target read voltage in the target stage being greater than a first preset value.

* * * * *